(12) United States Patent
Kobayashi et al.

(10) Patent No.: US 6,901,006 B1
(45) Date of Patent: May 31, 2005

(54) SEMICONDUCTOR INTEGRATED CIRCUIT DEVICE INCLUDING FIRST, SECOND AND THIRD GATES

(75) Inventors: Takashi Kobayashi, Tokorozawa (JP); Hideaki Kurata, Kokubunji (JP); Naoki Kobayashi, Tokyo (JP); Hitoshi Kume, Musashino (JP); Katsutaka Kimura, Akishima (JP); Shunichi Saeki, Ome (JP)

(73) Assignees: Hitachi, Ltd., Tokyo (JP); Hitachi Device Engineering Co., Ltd., Chiba (JP)

( * ) Notice: Subject to any disclaimer, the term of this patent is extended or adjusted under 35 U.S.C. 154(b) by 0 days.

(21) Appl. No.: 10/674,051

(22) Filed: Sep. 30, 2003

Related U.S. Application Data

(62) Division of application No. 10/206,982, filed on Jul. 30, 2002, now Pat. No. 6,687,156, which is a division of application No. 09/616,072, filed on Jul. 13, 2000, now Pat. No. 6,438,028.

(30) Foreign Application Priority Data

Jul. 14, 1999 (JP) ............................................ 11-200242

(51) Int. Cl.[7] ............................................. H01L 29/788
(52) U.S. Cl. ................... 365/185.01; 257/314; 257/315; 257/319; 257/320; 257/326
(58) Field of Search ...................... 365/185.01; 257/314, 257/315

(56) References Cited

U.S. PATENT DOCUMENTS

| | | | |
|---|---|---|---|
| 5,095,344 A | * | 3/1992 | Harari .......................... 257/328 |
| 5,247,198 A | | 9/1993 | Homma et al. |
| 5,392,238 A | | 2/1995 | Kirisawa |

(Continued)

FOREIGN PATENT DOCUMENTS

| | | | |
|---|---|---|---|
| DE | 195 00 380 A1 | 11/1995 | |
| EP | 0245515 | 11/1987 | |
| EP | 0326 465 | 8/1989 | |
| EP | 0349884 A2 | 1/1990 | |
| JP | 405048108 A | * 2/1993 | ......... H01L/29/784 |
| JP | 406252417 A | * 9/1994 | ......... H01L/29/804 |
| JP | 2694618 | 10/1997 | |
| JP | 9321157 | 12/1997 | |
| JP | 02000174241 A | * 6/2000 | ......... H01L/27/115 |

OTHER PUBLICATIONS

"A New Flash–Erase EEprom Cell With A Sidewall Select–Gate On Its Source Side" N. Naruka, IEDM–1989, pp. 603–606.

"Ohyo Butsuri Or Applied Physics" vol. 65, No. 11, pp. 1114–1124.

Intellectual Property Office of Singapore Office Action dated Oct. 28, 2004.

*Primary Examiner*—Viet Q. Nguyen
(74) *Attorney, Agent, or Firm*—Antonelli, Terry, Stout & Kraus, LLP

(57) ABSTRACT

In a semiconductor integrated circuit device including a third gate, the present invention improves miniaturization and operation speed and reduces a defect density of an insulator film. In a semiconductor integrated circuit device including a well of a first conductivity type formed in a semiconductor substrate, a source/drain diffusion layer of a second conductivity type inside the well, a floating gate formed over the semiconductor substrate through an insulator film, a control gate formed and isolated from the floating gate through an insulator film, word lines formed by connecting the control gates and a third gate formed and isolated from the semiconductor substrate, the floating gate and the control gate through an insulator film and different from the floating gate and the control gate, the third gate is buried into a space of the floating gates existing in a direction vertical to the word line and a channel.

25 Claims, 70 Drawing Sheets

U.S. PATENT DOCUMENTS

| | | |
|---|---|---|
| 5,502,669 A | 3/1996 | Saitoh |
| 5,679,970 A * | 10/1997 | Hartmann ................... 257/320 |
| 5,719,805 A | 2/1998 | Masuoka |
| 5,745,412 A | 4/1998 | Choi |
| 5,761,121 A | 6/1998 | Chang |
| 5,767,930 A | 6/1998 | Kobayashi et al. |
| 5,780,341 A | 7/1998 | Ogura |
| 5,883,409 A * | 3/1999 | Guterman et al. .......... 257/316 |
| 5,907,444 A | 5/1999 | Fong |
| 6,027,974 A * | 2/2000 | Liu et al. .................... 438/258 |
| 6,369,410 B1 | 4/2002 | Yamazaki et al. |
| 6,438,028 B1 | 8/2002 | Kobayashi et al. |
| 2001/0001295 A1 | 5/2001 | Odanaka et al. |
| 2001/0011726 A1 | 8/2001 | Havashi et al. |
| 2002/0096681 A1 | 7/2002 | Yamazaki et al. |
| 2002/0125510 A1 | 9/2002 | Chyanagi et al. |
| 2002/0191458 A1 * | 12/2002 | Kobayashi et al. ......... 365/200 |

* cited by examiner

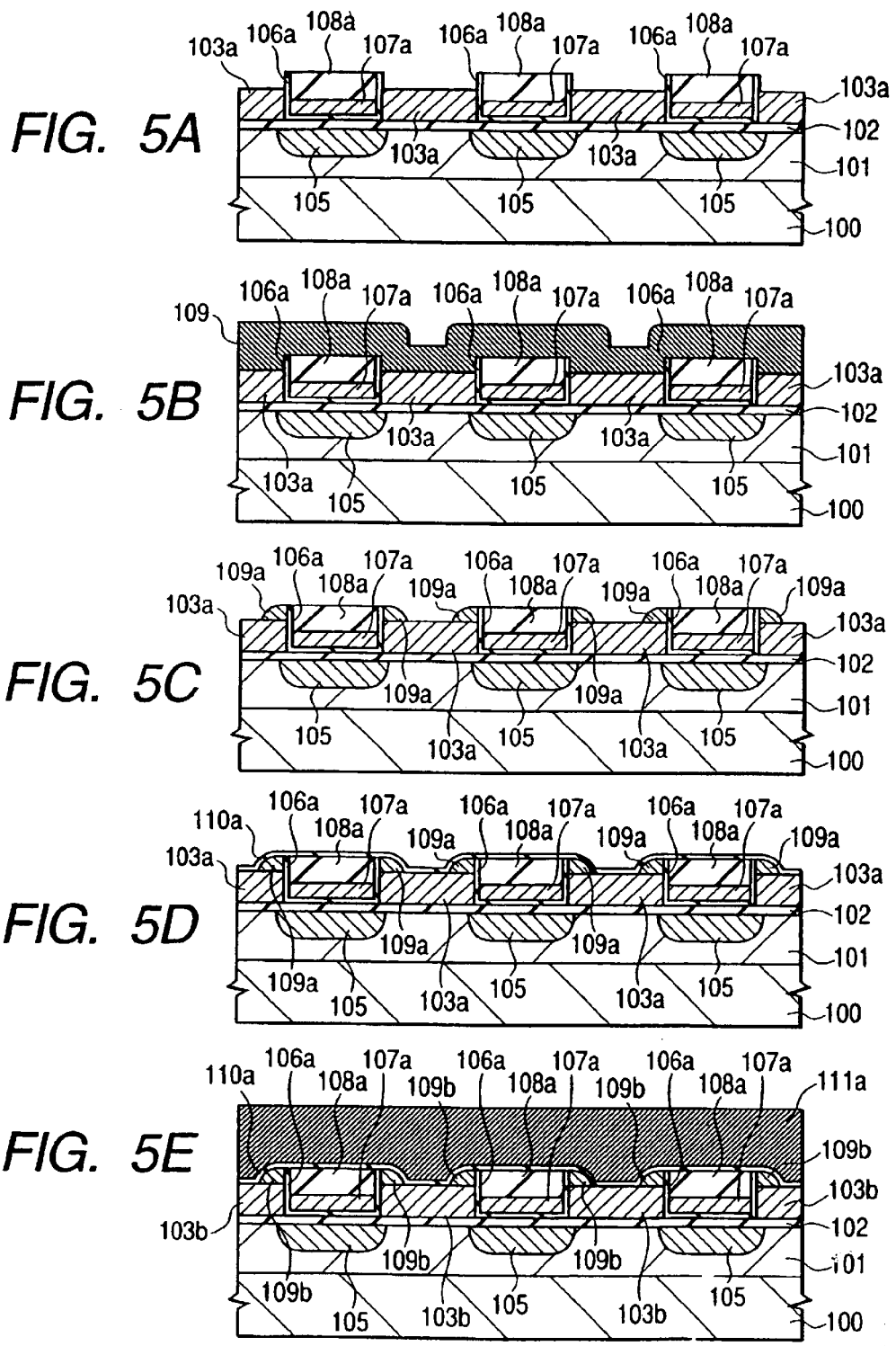

PROGRAM OPERATION VOLTAGE

TIMING 1

TIMING 2

ERASE OPERATION VOLTAGE

TIMING 1

READ OPERATION VOLTAGE

TIMING 1

TIMING 2

PROGRAM OPERATION VOLTAGE

TIMING 1

TIMING 2

TIMING 3

TIMING 4

TIMING 5

TIMING 6

ERASE OPERATION VOLTAGE

TIMING 1

READ OPERATION VOLTAGE

TIMING 1

TIMING 2

TIMING 3

TIMING 4

TIMING 5

TIMING 6

ERASE OPERATION VOLTAGE

TIMING 1

PROGRAM OPERATION VOLTAGE

TIMING 1

TIMING 2

ERASE OPERATION VOLTAGE

TIMING 1

READ OPERATION VOLTAGE

TIMING 1

TIMING 2

PROGRAM OPERATION VOLTAGE

TIMING 1

TIMING 2

ERASE OPERATION VOLTAGE

ERASE OPERATION VOLTAGE

TIMING 1

READ OPERATION VOLTAGE

TIMING 1

TIMING 2

WITH SELECT TRANSISTOR

WITHOUT SELECT TRANSISTOR

_SEMICONDUCTOR INTEGRATED CIRCUIT DEVICE INCLUDING FIRST, SECOND AND THIRD GATES_

CROSS REFERENCE TO RELATED APPLICATIONS

This is a Divisional application of Ser. No. 10/206,982, filed July 30, 2002, now U.S. Pat. No. 6,687,156, which is a Divisional application of Ser. No. 09/616,072, filed July 13, 2002, now U.S. Pat. No. 6,438,028, the entire disclosure of which is hereby incorporated by reference.

BACKGROUND OF THE INVENTION

This invention relates to a semiconductor integrated circuit device, and a production and operation method thereof. More particularly, this invention relates to a technology that will accomplish high integration density, high reliability and low operating voltage of an electrically programmable/erasable non-volatile semiconductor memory device.

Among electrically programmable/erasable nonvolatile semiconductor memory devices, a so-called "flash memory" is known as a memory device capable of collectively erasing data. The flash memory has excellent portability and impact resistance, and can electrically and collectively erase the data. Therefore, the demand for the flash memory has been increasing rapidly in recent years as a file (memory device) for compact personal digital assistants such as portable personal computers, digital still cameras, and so forth. To expand the market, reduction of a bit cost by the reduction of a memory cell area is of utmost importance, and various memory cell systems for accomplishing this object have been proposed as described in, for example, "Ohyo Butsuri (or Applied Physics)", Vol. 65, No. 11, p1114–1124 published by the Japan Society of Applied Physics, Nov. 10, 1996.

On the other hand, JP-B-2,694,618 (Reference 1 corresponding to U.S. Ser. No. 204,175 filed on Jun. 8, 1988) describes a virtual ground type memory cell that uses a three-layered polysilicon gate. In other words, this memory cell comprises a semiconductor region formed in a well of a semiconductor substrate and three gates. The three gates are a floating gate formed on the well, a control gate formed on the floating gate and an erase gate formed between the control gate and the floating gate adjacent to each other. Each of the three gates comprises polysilicon and is isolated by an insulator film. The floating gate and the well, too, are isolated from each other by an insulator film. The control gate is connected in a row direction and constitutes a word line. A source/drain diffusion layer is formed in a column direction and shares the diffusion layer with an adjacent memory cell in a virtual ground type. The pitch in the column direction is thus reduced. The erase gate is in parallel with a channel and is disposed between the word lines (control gates) also in parallel with the word lines.

To execute program the memory cell in this Reference 1, mutually independent positive voltages are applied to the word line and to the drain, respectively, while the well, the source and the erase gate are kept at 0 V. In consequence, hot electrons develop in the channel portion in the proximity of the drain, the electrons are injected into the floating gate and the threshold voltage of the memory cell rises. To erase the memory content, a positive voltage is applied to the erase gate while the word line, the source/drain and the well are kept at 0 V. Consequently, the electrons are ejected from the floating gate to the erase gate and the threshold voltage drops.

JP-A-9-321157 (Reference 2, laid-open on Dec. 12, 1997), for example, discloses a split gate type memory cell. A large overlap area is secured between a diffusion layer and a floating gate so that the potential of the diffusion layer increases the potential of the floating gate. A low voltage is applied to a word line so as to improve the generation of hot electrons and the injection effect when data is written.

Furthermore, "International Electron Devices Meeting Technical Digest", 1989, pp. 603–606 (Reference 3) discusses a method that controls a floating gate potential by a word line and controls a split channel by a third gate that is different from both floating gate and control gate.

SUMMARY OF THE INVENTION

However, the inventors of the present invention have found that several problems develop when a higher integration density is sought in the memory cells described above. Incidentally, the problems that follow are noticed by the present inventors and are not particularly known in the art.

First, in order to miniaturize a memory cell, scale-down in a direction vertical to an extending direction of a data line (that is, the direction of the arrangement of the data line) as well as scale-down in a direction vertical to an extending direction of a word line (that is, the direction of the arrangement of the word line) must be achieved. Reduction of the word line width and the word line gap is effective for achieving the reduction in the word line arrangement direction. However, when the word line width is decreased, the resistance value of the word line increases with the result that the rise of the word line voltage is retarded when the data is written or read out. This invites in turn the problem of the drop of the operation speed. To solve this problem, a stacked film of a polysilicon film and its metal silicide film (that is, a so-called "polycide film") may be used in place of the polysilicon single film as a word line material. The polycide film provides a film having a lower resistance value than the polysilicon film having the same film thickness and can restrict the rise of the word line resistance. When miniaturization further proceeds in future and the word line with is required to be smaller than as it now is, a stacked film of the polysilicon film and a metal film (that is, a so-called "polymetal film") may be used. The polymetal film can further lower the resistance value than the polycide film having the same film thickness and can cope with the further reduction of the word line width.

However, the following problems develop when the polycide film or the polymetal film is used as the word line material. In the memory cell described in the reference cited above, the erase gate and the word line are so arranged as to extend in the direction vertical to the data line direction. In order to reduce the gap between the word lines to twice the minimum feature size, it is necessary to pattern continuously the word line and the floating gate, then to form the insulator film between the floating gates so formed, and to form thereafter the erase gate. However, metals contained in the polycide or in the polymetal dissolve during a cleaning step as a pre-step for forming the insulator film between the floating gate and the erase gate. The dissolving metals again adhere to the sidewalls of the floating gate and are entrapped into the insulation film during the subsequent formation step of the insulator film. As a result, the defect density of the insulatot film increases and reliability is spoiled.

Second, the memory cell described in the above-mentioned reference employs a memory cell structure called a "split channel type" in which the floating gate does not exist at a part of the channel portion. Control of the split channel in this memory cell is achieved as the potential of the control gate (word line) existing on that split channel is controlled. Therefore, the word line has also the function of the split gate.

Incidentally, to write the data into the memory cell, it is necessary to increase the occurrence quantity of hot electrons and injection efficiency. To attain this object, it is effective to increase the potential of the floating gate so as to increase the electric field in the vertical direction of the channel portion, and to lower the potential of the split gate to increase the electric field in the channel horizontal direction.

In the memory cell described in the Reference 1, however, the voltage of the split gate is controlled through the word line voltage. Therefore, the voltages of the floating gate and the split gate cannot be controlled independently. In other words, there is no way but to control the voltages of both floating gate and split gate through the word line voltage. In consequence, the generation of the hot electrons and injection efficiency cannot be improved simultaneously. When the data is programmed, therefore, an extremely large current with respect to the injection current flows, and the data cannot be programmed simultaneously into a plurality of memory cells. Furthermore, a high programming rate cannot be acquired.

Means described in the Reference 2 may be used as the method that simultaneously increases the generation of the hot electrons and injection efficiency in the split channel type memory cell. However, this method involves the problem in that that overlap between the diffusion layer and the floating gate becomes more difficult to secure with scaledown.

It may be possible to control the floating gate voltage through the word line and to control the split channel by using the third gate different from the floating gate and the control gate, on the basis of the technology described in the Reference 3. However, this technology does not take scaledown into consideration.

It is therefore an object of the present invention to provide a semiconductor integrated circuit device suitable for miniaturization and having a high operation speed but a low defect density, and a production method of such a device.

The above and other objects and novel features of the present invention will become more apparent from the following description of the specification when taken in connection with the accompanying drawings.

The semiconductor integrated circuit device according to the present invention employs the construction wherein third gates having different functions from those of floating gate and control gate are buried in the gaps between word lines (control gate, second gate) and floating gates (first gate) existing in a direction vertical or parallel to the word lines.

Outlines of the present invention will be recited below.

1. A semiconductor integrated circuit device includes a well of a first conductivity type formed on a main surface of a semiconductor substrate, a semiconductor region of a second conductivity type so formed inside said well as to extend in a first direction, a first gate formed over the semiconductor substrate through a first insulator film, a second gate formed over the first gate through a second insulator film, and a third gate formed and insulated from said first gate through a third insulator film, wherein the third gate is so formed as to extend in the first direction and is buried in a space between said first gates.

2. In a semiconductor integrated circuit device according to item 1, the first gates are formed symmetrically with respect to the third gate, and the third gates are formed symmetrically with respect to the first gate.

3. A semiconductor integrated circuit device includes a well of a first conductivity type formed on a main surface of a semiconductor substrate, a semiconductor region so formed inside the well as to extend in a first direction, a first gate formed over the semiconductor substrate through a first insulator film, a second gate formed over the first gate through a second insulator film, and a third gate, wherein end faces of the third gate are end faces opposing the first gates adjacent to each other between the first gates, and are so formed as to oppose end faces of the first gate existing in parallel with the first direction through the third insulator film.

4. A semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate over a second insulator film and a third gate formed and isolated from the first gate through a third insulator film, wherein an upper surface of the third gate exists at a position lower than the upper surface of the first gate.

5. A semiconductor integrated circuit device according to any one of items 1 to 4 has any one of the following constructions: a first construction wherein the first gate is a floating gate, the second gate is a control gate and the third gate is an erase gate; a second construction wherein the first gate is a floating gate, the second gate is a control gate and the third gate is a gate for controlling a split channel; and a third construction wherein the first gate is a floating gate, the second gate is a control gate and the third gate is a gate having the functions of both erase gate and gate for controlling a split channel.

6. In a semiconductor integrated circuit device according to item 5, a part of the third gate exists over the semiconductor region of the second conductivity type.

7. In a semiconductor integrated circuit device according to any one of items 1 to 4, the first gate is a floating gate, the second gate is a control gate and the third gate is an erase gate; and an entire surface of the third gate exists over the semiconductor region of the second conductivity type.

8. A semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film and a third gate formed and isolated from the first gate through a third insulator film, wherein the third gate has functions of both erase gate and gate for controlling a split channel.

9. In a semiconductor integrated circuit device according to any one of items 1 to 8, the third insulator film is a silicon oxide film doped with nitrogen.

10. A semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film and a third gate formed and isolated from the first gate through a third insulator film, wherein a film thickness of the first insulator film is greater than that of the second or third insulator film.

11. A semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film and third gate formed and isolated from the first gate through a third insulator film, wherein the second gate comprises a stacked film of a polysilicon film and a metal silicide film, and the third gate exists as it is buried into a space between the first gates.

12. In a semiconductor integrated circuit device according to item 11, the metal silicide film is a tungsten film.

13. A semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film and a third gate formed and isolated from the first gate through a third insulator film, wherein the second gate comprises a stacked film containing a metal film.

14. In a semiconductor integrated circuit device according to item 13, the second gate comprises a laminate film of a polysilicon film, a barrier metal film and a metal film.

15. In a semiconductor integrated circuit device according to item 13 or 14, the third gate exists as it is buried into the space between the first gates.

16. In a semiconductor integrated circuit device according to item 13, 14 or 15, the barrier metal film belongs to a group of a tungsten-film, a titanium film, a tantalum film, a metal film made of a transition metal itself or its nitride film or its silicide film, an aluminum nitride film, a cobalt silicide film, a molybdenum silicide film, a titanium tungsten film or their alloy films.

17. A semiconductor integrated circuit device according to any one of items 11 to 16 has any of the following constructions: a first construction wherein the space between said first gates is defined by end faces of the first gates parallel to the extending direction of the second gates among the end faces of the first gates; and a second construction wherein the space between the first gates is defined by end faces of the first gates vertical to the extending direction of the second gates among the end faces of the first gates.

18. A semiconductor integrated circuit device includes a well of a first conductivity type formed in a semiconductor substrate, a semiconductor region of a second conductivity type formed inside the well, local source lines and local data lines formed by connecting the semiconductor region, select transistors for selecting the local source line and the local data lines, a first gate formed over the semiconductor integrated substrate through a first insulator film, a second gate formed and isolated from the first gate through a second insulator film, word lines formed by connecting the second gates, and a third gate formed and isolated from the first gate through a third insulator film and having different functions from the first and second gates and, wherein a bundling portion of the third gates exists between the word line existing at the nearest position to the select transistor inside a memory cell block comprising the select transistors and the gate of the select transistor.

19. In a semiconductor integrated circuit device according to item 18, a dummy gate exists between the bundling portion of the third gates and the word line existing at the nearest position to the select transistor inside the memory cell block.

20. A semiconductor integrated circuit device according to item 18 or 19 has any one of the following constructions: a first construction wherein all of the third gates existing inside the memory cell are bundled at either one, or both of the ends of the memory cell block end; and a second construction wherein every other of the third gates existing inside the memory cell block are bundled at the memory cell block end.

21. A semiconductor integrated circuit device according to item 20 has any of the following constructions: a first construction wherein contact holes are disposed at the bundling portion of the third gates; and a second construction wherein the third gate and the dummy gate are connected through a contact hole and a etal wire.

22. In an operation method of a semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of a p type; programming is made by applying a positive voltage relative to voltages of the third gate, the well and a source as one of the regions of the semiconductor region is applied to a control gate as the second gate and to a drain as the other region of the semiconductor region; and erasing is made by applying a positive voltage relative to a voltage of the control gate to the third gate.

23. In an operation method of a semiconductor device includes a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through third insulator film: the well of the first conductivity type is of an n type; programming is made by applying a negative voltage relative to voltages of the third gate, the well and a source as one of the regions of the semiconductor region to a control gate as the second gate and to a drain as the other region of the semiconductor region; and erasing is made by applying a positive voltage relative to the voltage of the control gate to the third gate.

24. In an operation method of a semiconductor integrated circuit device includes a well of a first conductivity type formed in a main surface of a semiconductor substrate, a semiconductor region formed inside the well, a first gate formed over the semiconductor substrate through a first insulator film, a second gate formed over the first gate through a second insulator and a third gate formed and isolated from the first gate through a third insulator film: the well of the first conductivity type is of an n type; programming is made by applying a positive voltage relative to voltages of the third gate, the well and a source as one of the regions of the semiconductor region to a control gate as the second gate; and erasing is made by applying a positive voltage relative to the voltage of the control gate to the third gate.

25. In an operation method of a semiconductor integrated circuit device includes a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film and a third gate formed and isolated from the first gate through a third insulator film: the well of the first conductivity type is of a p type; programming is made by applying a positive voltage relative to voltages of the third gate and a source as one of the regions of the semiconductor region to a control gate as the second gate and to a drain as the other region of the semiconductor region; and erasing is made by applying a negative voltage relative to the voltage of the well to the control gate while keeping the voltage of the third gate at 0 V.

26. In an operation method of a semiconductor integrated circuit device including a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of a p type; programming is made by applying a positive voltage relative to voltages of the third gate, the well and a source as one of the regions of the semiconductor region to a control gate as the second gate and to a drain as the other region of the semiconductor region; and erasing is made by applying a positive voltage relative to the voltage of the control gate to the well.

27. In an operation method of a semiconductor integrated circuit device including a well of a first conductivity type formed in a main surface of a semiconductor substrate, a semiconductor region of a second conductivity type formed inside the well, a second gate formed over the first gate through a second insulator film, and a third gate formed and isolated from the gate through a third insulator film: the well of the first conductivity type is of an n type; programming is made by applying a negative voltage relative to voltages of the well and a source as one of the regions of the semiconductor region to a control gate as the second gate and to a drain as the other region of the semiconductor region; and erasing is made by applying a negative voltage relative to the voltage of the well to the control gate while the voltage of the third gate is kept at 0 v.

28. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film and a third gate formed and isolated from the first gate through a third insulator film: the well of the first conductivity type is of an n type; programming is made by applying a negative voltage relative to voltages of the third gate, the well and a source as one of the regions of the semiconductor layer to a control gate as the second gate and to a drain as the other region of the semiconductor region; and erasing is made by applying a positive voltage relative to the voltage of the control gate to the well.

29. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film; the well of the first conductivity type is of a p type; programming is made by applying a positive voltage relative to voltages of the well and a source as one of the regions of the semiconductor region to a control gate as the second gate and to a drain as the other region of the semiconductor region; and erasing is made by applying a positive voltage relative to the voltage of the control gate to the third gate.

30. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of a p type; programming is made by applying a positive voltage relative to voltages of the well and a source as one of the regions of the semiconductor region to a control gate as the second gate, to the third gate and to a drain as the other region of the semiconductor region; and erasing is made by applying a negative voltage relative to the voltage of the well to the control gate.

31. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of a p type; programming is made by applying a positive voltage relative to voltages of the well and a source as one of the regions of the semiconductor region to a control gate as the second gate, to said third gate and to a drain as the other region of the semiconductor region; and erasing is made by applying a positive voltage relative to the voltage of the control gate to the well.

32. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of a p type; programming is made by applying a positive voltage relative to voltages of the well and a source as one of the regions of the semiconductor region to a control gate as the second gate, to the third gate and to a drain as the other region of the semiconductor region; and erasing is made by applying a positive voltage relative to a voltage of the control gate to the source or the drain.

33. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of an n type; programming is made by applying a negative voltage relative to voltages of the well and a source as one of the regions of the semiconductor region to a control gate as the second gate, to the third gate and to a drain as the other region of the semiconductor region; and erasing is made by applying a positive voltage relative to the voltage of the control gate to the third gate.

34. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the well of the first conductivity type is of an n type; programming is made by applying a negative voltage relative to voltages of the well and a source as one of the regions of the semiconductor region to a control gate as the second gate, to the third gate and to a drain as the other region of the semiconductor region; and erasing is made by applying a negative voltage relative to the voltage of the well to the control gate.

35. In an operation method of a semiconductor integrated circuit device including a well of a first conductivity type formed in a main surface of a semiconductor substrate, a semiconductor region of a second conductivity type formed inside the well, a first gate formed over the semiconductor substrate through a first insulation film, a second gate formed over the first gate through a second insulator film, and a third gate formed and isolated from the first gate through a third insulator film: the well of the first conductivity type is of an n type; programming is made by applying a negative voltage relative to the well and a source as one of the regions of the semiconductor region to a control gate as the second gate and a drain as the other region of the semiconductor region; and erasing is made by applying a positive voltage relative to the voltage of the control gate to the well.

36. In an operation method of a semiconductor integrated circuit device according to any one of items 22 to 35, an absolute value of the third gate is smaller than that of the voltage of the control gate during the programming operation.

37. In an operation method of a semiconductor integrated circuit device according to any one of items 22 to 36, a distribution of the threshold value generated by the programming operation is at least four levels.

38. A method of producing a semiconductor integrated circuit device comprises the steps of: (a) forming a well of a first conductivity type in a semiconductor substrate; (b) forming a stripe-like pattern to serve as a first gate over the semiconductor substrate through a first insulator film; (c) forming a semiconductor region of a second conductivity type inside the well in such a manner as to extend in parallel with said pattern; (d) forming a third insulator film in the space defined by the stripe-like pattern, and burying a third gate into the space of the pattern; and (e) forming a second gate pattern in such a manner as to extend in a direction vertical to the stripe-like pattern.

39. In a method of producing a semiconductor integrated circuit device according to item 38, the strip-like pattern to function as the first gate is patterned in such a manner as to be symmetric with respect to the third gate, and the third gate is patterned in such a manner as to be symmetric with respect to the stripe-like pattern.

40. In a method of producing a semiconductor integrated circuit device according to item 39, the third gate is formed in self-alignment with the stripe-like pattern.

41. A method of producing a semiconductor integrated circuit device comprises the steps of: (a) forming a well of a first conductivity type inside a semiconductor substrate; (b) forming a first gate over the semiconductor substrate through a first insulator film; (c) forming a semiconductor region of a second conductivity type inside the well; (d) forming a third insulator film in a space defined by the first gate, and forming the third gate in such a manner as to bury the space of the pattern; and (e) forming a second gate, wherein said third gate is patterned so that the surface of the third gate is lower than the surface of the first gate.

42. A method of producing a semiconductor integrated circuit device according to any one of items 38 to 41, comprises any of the following methods: a first method of forming the third gate so that the entire surface of the third gate exists over the semiconductor region of the second conductivity type; and a second method of forming the third gate so that a part of the third gate exists over the semiconductor region of the second conductivity type.

43. In a method of producing a semiconductor integrated circuit device according to any one of items 38 to 41, the third gate is formed in such a manner that a part of the third gate exists over the semiconductor region of the second conductivity type, and the semiconductor region of the second conductivity type is formed by tilted ion implantation.

44. In a method of producing a semiconductor integrated circuit device according to any one of items 38 to 43, the third insulator film is a silicon oxide film doped with nitrogen.

45. In a method of producing a semiconductor integrated circuit device including a well of a first conductivity type formed on a main surface of a semiconductor substrate, a semiconductor region of a second conductivity type formed inside the well, a first gate formed over the semiconductor substrate through a first insulator film, a second gate formed over the first gate through a second insulator film, and a third gate formed and isolated from the first gate through a third insulator film: the second gate comprises a laminate film of a polysilicon film and a metal silicide film, and the formation of the second gate is conducted after the formation of the third gate.

46. In a method of producing a semiconductor integrated circuit device according to item 45, the metal silicide film is a tungsten silicide film.

47. In a method of producing a semiconductor integrated circuit device including a well of a first conductivity type formed on a main surface of a semiconductor substrate, a semiconductor region of a second conductivity type formed inside said well, a first gate formed over the semiconductor substrate through a first insulator film, a second gate formed over the first gate through a second insulator film and a third gate formed and isolated from the first gate through a third insulator film: the second gate comprises a laminate film containing a metal film.

48. In a method of producing a semiconductor integrated circuit device according to item 47, the second gate comprises a laminate film of a polysilicon film, a barrier metal film and a metal film.

9. In a method of producing a semiconductor integrated circuit device according to item 47 or 48, the third gate exists as it is buried into the space between said first gates.

50. In a method of producing a semiconductor integrated circuit device according to item 47, the barrier metal film belongs to a group of a tungsten film, a titanium film, a tantalum film, a metal film made of a transition metal itself or its nitride film or its silicide film, an aluminum nitride film, a cobalt silicide film, a molybdenum silicide film, a titanium tungsten film or their alloy films.

51. A semiconductor integrated circuit device includes a well of a first conductivity type formed in a semiconductor substrate, a semiconductor region of a second conductivity type formed inside the well, local source lines and local data lines formed by connecting the semiconductor region, select transistors for selecting the local source lines and the local data lines, a first gate formed over the semiconductor substrate through a first insulator film, a second gate formed and isolated from the first gate through a second insulator film, word lines formed by connecting the second gates, and memory cells existing on the local source lines and the local data lines divided by the select transistors forming a memory cell block, the memory cell blocks being arranged in the direction of the word lines and constituting a memory cell array, wherein: one each power source line is disposed on both sides of the memory cell block to interpose the memory cell block in the same direction as the word lines; and the local source line and said local data line are connected to one of the power source lines and to a signal line arranged in a direction vertical to the word line, or to both of the power source lines, through the select transistor.

52. A semiconductor integrated circuit device according to item 51 has any one of the following constructions: a first construction wherein one of the local data lines is connected to both of the power source line and the signal line through the select transistor; and a second construction wherein one of the local data lines is connected to the signal line at one of the ends of the memory cell block through the select transistor, and an adjacent local data line adjacent to the one local data line is connected to the signal line at the other end of the memory cell block through the select transistor.

53. In a semiconductor integrated circuit device according to item 52 one of said local data lines is connected to the signal line at one of the ends of the memory cell block through the select transistor and to the power source line at the other end of the memory cell block through the select transistor.

54. In a semiconductor integrated circuit device according to item 53 which includes a first select transistor for connecting a signal line disposed in a direction vertical to the extending direction of the word line to an nth (n: integer) local data line, a second select transistor for connecting the power source line disposed at one of the ends of the memory cell block in the same direction as the word line to (n+1)th local data line, a third select transistor for connecting the signal line to the (n+1)th local data line, and a fourth select transistor for connecting the power source line disposed at the other end of the memory cell block in the same direction as the word line to the nth local data line: the gate signals of the first and second transistors are the same signals; and the gate signal of the third and fourth select transistors are the same signal.

55. A semiconductor integrated circuit device according to item 51 has any of the following constructions: a first construction wherein a gate signal of the select transistor connected to the local source line and a gate signal of the select transistor connected to the local data line are the same signal; and a second construction wherein gate signals of all of the select transistors connected to the local source lines are the same signal.

56. A semiconductor integrated circuit device includes a well of a first conductivity type formed in a semiconductor substrate, a semiconductor region of a second conductivity type formed inside the well, local source/data lines formed by connecting the semiconductor region, select transistors for selecting the local source/data lines, a first gate formed over the semiconductor substrate through a first insulator film, a second gate formed and isolated from the first gate through a second insulator film, and word lines formed by connecting the second gate, wherein memory cells on the local source/data lines divided by the select transistors constitute memory cell blocks, and the memory cell blocks are arranged in the word line direction and constitute a memory cell array, and when the local source/data lines function as the local source lines of the memory cell, they function as the local data line of the memory cells adjacent to the memory cell, the semiconductor integrated circuit device including further one each power source line so disposed on both sides of the memory cell block as to interpose the memory cell block between them in the same direction as the word line, and signal lines disposed in a direction vertical to the word lines, the local source/data lines being connected to either one of said power source lines and to both of the signal lines through the select transistor.

57. A semiconductor integrated circuit device according to item 57 has any one of the following constructions: a first construction wherein nth (n: integer) local source/data line is connected to the signal line at one of the ends of the memory cell block through the select transistor and (n+1)th local source/data line is connected to the signal line at the other end of the memory cell block through the select transistor; and a second construction wherein an nth (n: integer) local source/data line is connected to the power source line at one of the ends of the memory cell block through the select transistor, and an (n+1)th local source/data line is connected to the power source line at the other end of the memory cell block through the select transistor.

58. In a semiconductor integrated circuit device according to item 56 or 57, one of the local source/data lines is connected to the signal line at one of the ends of the memory cell block through the select transistor, and to the power source line at the other end of the memory cell block through the select transistor.

59. A semiconductor integrated circuit device according to item 58 further includes a first select transistor for connecting the signal line wired in a direction vertical to the word line and an nth (n: integer) local source/data line, a second select transistor for connecting the power source line wired at one of the ends of the memory cell block in the same direction as the word line and an (n+1)th local source/data line, a third select transistor for connecting the signal line and the (n+1)th local source/data line and a fourth select transistor for connecting the power source line wired at the other end of the memory cell block in the same direction as the word line and said nth local source/data line, wherein: the gate signals of the first and second select transistors are the same signal, and the gate signals of the third and fourth select transistors are the same signal.

60. A semiconductor integrated circuit device according to any one of items 56 to 59 has any one of the following constructions: a first construction wherein one of the signal lines wired in a direction vertical to the word line is shared by two of the local source/data lines; a second construction wherein, when the local source/data line is connected to the signal line through the select transistor, the connection portion between the semiconductor region of the select transistor on the side different from the local source/data line and the signal line is shared by two of the memory cell blocks; and a third construction wherein the power source line is shared by two of the memory cell blocks.

61. A semiconductor integrated circuit device includes a well of a first conductivity type formed in a semiconductor substrate, a semiconductor region of a second conductivity type formed inside the well, local source/data lines formed by connecting the semiconductor regions, select transistors for selecting the local source/data lines, a first gate formed over the semiconductor substrate through a first insulator film, a second gate formed and isolated from the first gate through a second insulator film, word lines formed by connecting the second gates, and a third gate formed and isolated from the first gate through a third insulator film and having a different function from those of the first and second gates, memory cells on the local source lines and local data lines divided by the select transistors constituting memory cell blocks, the memory cell blocks being arranged in the word line direction and constituting a memory cell array, wherein: a bundling portion of the third gates exists between the word line existing at the nearest position to the select transistor inside the memory cell block and the gate of the select transistor; every other third gates existing inside the memory cell block are bundled at one of the ends of the memory cell block; one each power source line are so disposed in the same direction as the word lines on both sides of the memory cell block as to interpose the memory cell block between them, and signal lines disposed in a direction vertical to the word lines; and the local source/data lines are connected to either one, or both, of the signal lines inside the power source line through the select transistor.

62. A semiconductor integrated circuit device according to item 61 has any one of the following constructions: a first construction wherein an nth (n: integer) local source/data line is connected to the signal line at one of the ends of the memory cell block through the select transistor, and an (n+1)th local source/data line is connected to the signal line at the other end of the memory cell block through the select transistor; and a second construction wherein an nth (n: integer) local source line is connected to the power source line at one of the ends of the memory cell block through the select transistor, and an (n+1)th local source/data line is connected to the power source line at the other end of the memory cell block through the select transistor.

63. In a semiconductor integrated circuit device according to item 61 or 62, one of the local source/data lines is connected to the signal line at one of the ends of the memory cell block through the select transistor, and is connected to the power source line at the other end of the memory cell block through the select transistor.

64. A semiconductor integrated circuit device according to item 63 further includes a first select transistor for connecting a signal line wired in a direction vertical to the word line and an nth (n: integer) local source/drain line, a second select transistor for connecting the power source line wired in the same direction as the word line to one of the ends of the memory cell block and an (n+1)th local source/data line, a third select transistor for connecting the signal line and the (n+1)th local source/date line and a fourth select transistor for connecting the power source line wired in the same direction as the word line and the nth local source/data line to the other end of the memory cell block, wherein: the gate signals of the first and second select transistors are the same signal; and the gate signals of the third and fourth select transistors are the same signal.

65. A semiconductor integrated circuit device according to any one of items 61 to 64 has any one of the following constructions: a first construction wherein one of the signal lines disposed in a direction vertical to the word line is shared by two of the local source/data lines; a second construction wherein, when the local source/data line and the signal line are connected through the select transistor, the connection portion between the semiconductor region of the select transistor on the side different from the local source/data line and the signal line is shared by two of the memory cell blocks; a third construction wherein the power source line is shared by two of the memory cell blocks; a fourth construction wherein the local source/data line is connected to the signal line wired in a direction vertical to the word line through the select transistor, a sense circuit is connected to the signal line, the sense circuit connected to an nth (n: integer) signal line is connected at one of the ends of a memory cell array comprising a plurality of memory cell blocks, and the sense circuit connected to an (n+1)th signal line is connected at the other end of the memory cell array; and a fifth construction wherein a switch is interposed between the signal line connected to the local source/data line through the select transistor and the sense circuit, and one sense circuit can be shared by a plurality of the signal lines when the switch is changed over.

66. A semiconductor integrated circuit device includes a well of a first conductivity type formed in a semiconductor substrate, a semiconductor region of a second conductivity type formed inside the well, local source/data lines formed by connecting the semiconductor region, select transistors for selecting the local source/data lines, a first gate formed over the semiconductor substrate through a first insulator film, a second gate formed and isolated from the gate through a second insulator film, word lines formed by connecting the second gates, and a third gate formed and isolated from the first gate through a third insulator film and having a different function from those of the first and second gates, memory cells on the local source lines and the local data lines divided by the select transistors constituting a memory cell block, the memory cell blocks being arranged in the word line direction and constituting a memory cell array, wherein: a bundling portion of the third gates exists between the word line existing at the nearest position to the select transistor inside the memory cell block and the select transistor; every other third gates existing inside the memory cell block are bundled at the end of the memory cell block; one each of the power source line arranged in the same direction as the word line and one each of the signal lines wired in a direction vertical to the word lines are so disposed on both sides of the memory cell block as to interpose the memory cell block between them; and the local source/data line is connected to both of the power source line and the signal line through the select transistor.

67. A semiconductor integrated circuit device according to item 66 has any one of the following constructions: a first construction wherein the local source/data line is connected to the signal line through the select transistor, and the connection is all made at one of the ends of the memory cell block; and a second construction wherein the local source/data line is connected to the power source line wired in the same direction as the word line at one of the ends of the cell block through the select transistor, and the connection is all made at one of the ends of the memory cell block.

68. In a semiconductor integrated circuit device according to item 66 or 67 one of the local source/data line is connected to the signal line at one of the ends of the memory cell block through the select transistor, and is connected to the power source line at the other end of the memory cell block through the select transistor.

69. In a semiconductor integrated circuit device according to item 68 which further includes a first select transistor for connecting the signal line wired in a direction vertical to the word line and an nth (n: integer) local source/data line, a second select transistor for connecting the signal line and an (n+1)th local source/data line, a third select transistor for connecting the power source line wired in the same direction as the word line and the nth local source/data line at the other end of the memory cell block, and a fourth select transistor for connecting the power source line and the (n+1)th local source/data line; the gate signals of all of the first select transistors are the same signal the gate signals of all of the second select transistors are the same signal; the gate signals of the first and second select transistors are different signals, and the gate signals of all of the third select transistors are the same signal; the gate signals of all of the fourth select transistors are the same signal; and the gate signals of the third and fourth gate signals are different signals.

70. A semiconductor integrated circuit device according to any one of items 66 to 69 has any one of the following constructions: a first construction wherein two of the local source/data lines share the signal line; a second construction wherein, when the local source/data line and said signal line are connected through the select transistor, the connection portion of the semiconductor region of the select transistor on the side different from the local source/data line and the signal line is shared by two of the memory cell blocks; a third construction wherein two of the memory cell blocks share the power source line; a fourth construction wherein the local source/data line is connected to the signal line through the select transistor, the sense circuit is connected to the signal line, the sense circuit to be connected to nth (n: integer) signal line is connected at one of the ends of the memory cell array comprising a plurality of memory cell blocks, the sense circuit to be connected to (n+1)th signal line is connected at the other end of the memory cell array; and a fifth construction wherein a switch is interposed between the signal line connected to the local source/data line through the select transistor and the sense circuit, and one sense circuit is shared by a plurality of the signal lines as the switch is changed over.

71. A semiconductor integrated circuit device includes a well of a first conductivity type formed in a main surface of a semiconductor substrate, a semiconductor region of a second contuctivity type formed inside the well in such a manner as to extend in a first direction, a first gate formed over the semiconductor substrate through a first insulator film, a second gate formed over the first gate through a second insulator film, word lines formed by connecting the second gate, and a third gate formed and isolated from the first gate through a third insulator film, the third gate being buried in a space of the first gate existing in a direction vertical to the word line, wherein: a decoder for driving the third gate is disposed in the extending direction of the word line.

72. A semiconductor integrated circuit device according to item 71 has any one of the following constructions: a first construction wherein the decoder for driving the third gate is disposed at one of the ends of a memory cell array; a second construction wherein the decoder for driving the third gate is disposed adjacent to a block decoder for selecting memory cell blocks each comprising memory cell arrays existing on a plurality of word lines encompassed by the select transistors; and a third construction wherein the decoders for driving the third gates are disposed on both sides of the memory cell while interposing the memory cell array between them and adjacent to a block decoder for selecting the memory cell blocks.

73. In a semiconductor integrated circuit device according to item 20 the third gate is formed as it is buried into the space between the first gates extending in a direction vertical to the word line; and a decoder for driving the third gate is disposed in an extending direction of the word line.

74. A semiconductor integrated circuit device according to item 73 has any one of the following constructions: a first construction wherein the decoder for driving the third gate is disposed at one of the ends of the memory cell array; a second construction wherein the decoder for driving the third gate is disposed adjacent to a block decoder for selecting the memory cell block; and a third construction wherein the decoders for driving the third gate are so disposed on both sides of the memory cell arrays as to interpose the memory cell array between them, adjacent to the block decoder for selecting the memory cell block.

75. In a semiconductor integrated circuit device according to item 18 or 19 wherein all of the third gates existing inside the memory cell block are bundled at either one, or both, of the ends of the memory cell block, the selection signal of the third gate is generated from a selection signal of the memory cell block.

76. A semiconductor integrated circuit device according to item 18 or 19, wherein all of the third gates existing inside the memory cell block are bundled at either one, or both, of the ends of the memory cell block, has any one of the following construction: a first construction wherein the selection signal of the third gate is generated from a selection signal of the memory cell block and a signal for further halving the memory cell block; and a second construction wherein the selection signal of the third gate is generated from a gate selection signal of the select transistor.

BRIEF DESCRIPTION OF THE DRAWINGS

FIGS. 5A to 5E are sectional views showing an example of the production method of the semiconductor integrated circuit device of Embodiment 1;

FIGS. 13A to 13C show a programming operation of Embodiment 1, wherein FIG. 13A shows an equivalent circuit diagram, and FIGS. 13B and 13C show timing charts;

FIGS. 14A and 14B show an erasing operation of Embodiment 1, wherein FIG. 14A shows an equivalent circuit diagram and FIG. 14B shows a timing chart;

FIGS. 15A to 15C show a reading operation of Embodiment 1, wherein FIG. 15A is an equivalent circuit and FIGS. 15B and 15C are timing charts;

FIGS. 19A to 19G shows the programming operation of Embodiment 2, wherein FIG. 19A is an equivalent circuit diagram and FIGS. 19B to 19G show timing charts;

FIGS. 20A and 20B show an erasing operation of Embodiment 2, wherein FIG. 20A shows an equivalent circuit diagram and FIG. 20B shows a timing chart;

FIG. 21A to 21G show the erasing operation of Embodiment 2, wherein FIG. 20A shows an equivalent circuit diagram and FIGS. 21B to 21G show timing charts;

FIGS. 26A and 26B show an erasing operation of Embodiment 3, wherein FIG. 26A shows an equivalent circuit diagram and FIG. 26B shows a timing chart;

FIGS. 35A to 35C show a programming operation of Embodiment 5, wherein FIG. 35A is an equivalent circuit diagram and FIGS. 35B and 35C are timing charts;

FIGS. 36A and 36B show an erasing operation of Embodiment 5, wherein FIG. 36A shows an equivalent circuit diagram and FIG. 36B shows a timing chart;

FIGS. 37A to 37C show a reading operation of Embodiment 5, wherein FIG. 37A shows an equivalent circuit diagram and FIGS. 37B and 37C show timing charts;

FIGS. 43A to 43C shows a programming operation of Embodiment 6, wherein FIG. 43A shows an equivalent circuit diagram and FIGS. 43B and 43C show timing charts;

FIGS. 44A to 44C shows an erasing operation of Embodiment 6, wherein FIG. 44A shows an example of an equivalent circuit diagram, FIG. 45B shows another example of the equivalent circuit and FIG. 44C shows a timing chart;

FIGS. 45A to 45C shows a reading operation of Embodiment 6, wherein FIG. 45A shows an equivalent circuit diagram and FIGS. 45B and 45C show timing charts;

DESCRIPTION OF THE EMBODIMENTS

Figure 1:
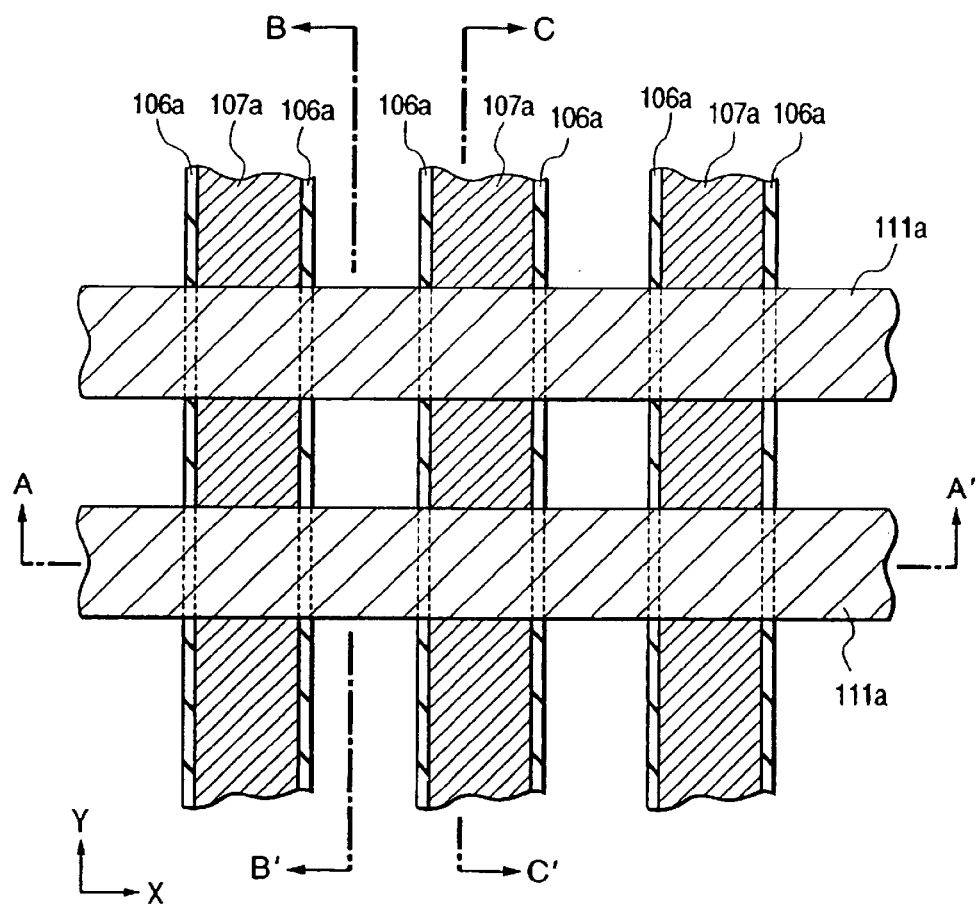
FIG. 1 is a partial plan view showing an example of the semiconductor integrated circuit device according to Embodiment 1 of the present invention.

Hereinafter, preferred embodiments of the present invention will be explained in detail with reference to the accompanying drawings. Incidentally, the same reference numeral will be used throughout the drawings to identify a constituent member having the same function and repetition of explanation of such a member will be omitted.

[Embodiment 1]

Figure 2A:
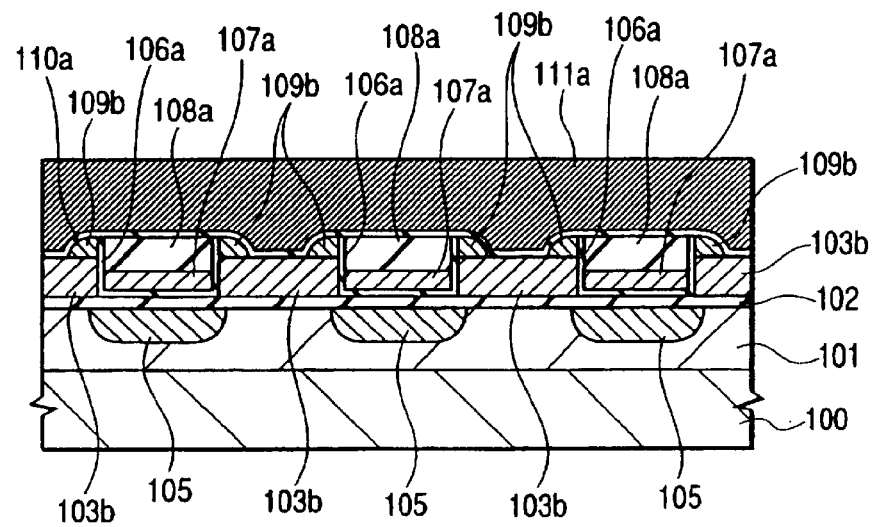
FIGS. 2A, 2B and 2C are sectional views taken along lines A–A', B–B' and C–C' in FIG. 1, respectively.
Figure 2B:
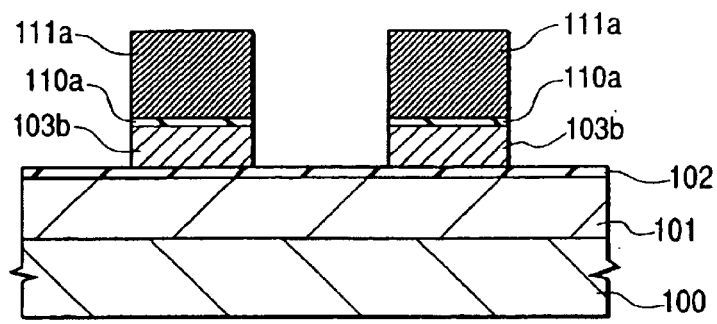
Figure 2C:
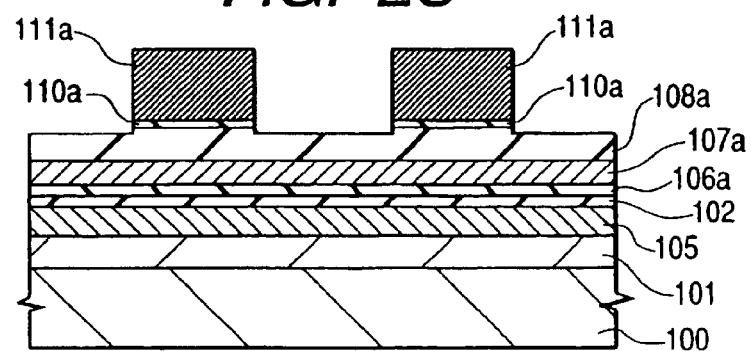

FIG. 1 is a partial plan view showing an example of the semiconductor integrated circuit device according to Embodiment 1 of the present invention. FIGS. 2A, 2B and 2C are sectional views taken along lines A–A', B–B' and C–C' in FIG. 1, respectively. In the plan view of FIG. 1, hatching is applied to each member for ease of illustration and a part of members is omitted.

The semiconductor integrated circuit device of this embodiment has a memory cell of a so-called "flash memory". The memory cell includes a source/drain 105 inside a well 101 formed on the main surface of a semiconductor substrate 100, a first gate (floating gate) 103b, a second gate (control gate) 111a and a third gate 107a. The control gate (second gate) 111a of each memory cell is connected to other in a row direction (x direction) and forms a word line WL.

The floating gate (first gate) 103b and the well 101 are isolated from each other by a gate insulator film (first insulator film) 102, and the floating gate 103b and the third gate 107a, by an insulator film (third insulator film) 106a. The floating gate 103b and the word line (control gate) 111a are isolated from each other by an insulator film (second insulator film) 110a, and the third gate 107a and the word line 111a, by an insulator film 108a.

Each source/drain diffusion layer 105 is so arranged as to extend in a direction (y direction) vertical to the extending direction (x direction) of the word line 111a, and functions as a local source line and a local data line for connecting the sources/drains of the memory cells in the column direction (y direction). In other words, the semiconductor integrated circuit device of this embodiment comprises a so-called "contact-less type" memory cell array that does not have a contact hole for each memory cell.

Two end faces of the third gate 107a oppose two end faces of the floating gate 103b, that are vertical to the word line 111a and a channel, among the end faces of the floating gate 103b through the insulator films 106a, respectively.

The third gate 107a is buried into the gap of the floating gates 103b existing in the direction (y direction) vertical to the word line 11a and to the channel. The floating gate 103b exists symmetrically to the third gate 107a and the third gate 107a exists symmetrically to the floating gate 103b.

The third gate 107a is disposed on the diffusion layer 105 vertically to the word line 111a and to the channel or, in the column direction (y direction), in the same way as the diffusion layer 105.

Even when the third gate 107a exists besides the floating gate 103a and the control gate 111a, this construction can increase the pitches in the word line WL direction (x direction) and the local data line direction (y direction) twice the minimum feature size. Therefore, the memory cell area can be reduced to minimum $4F^2$ (F: minimum feature size) in a cross-point type array.

Next, the production method of this memory cell will be explained with reference to FIGS. 3 to 5. FIGS. 3 to 5 are sectional views showing an example of the semiconductor integrated circuit device according to Embodiment 1.

Figure 3A:
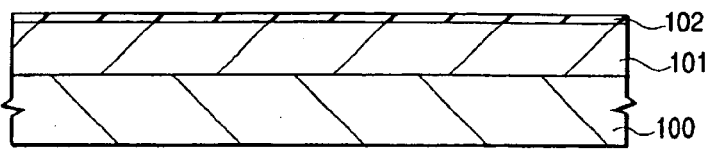
FIGS. 3A to 3E are sectional views showing an example of the production method of the semiconductor integrated circuit device of Embodiment 1.

First, a p type (first conductivity type) well 101 is formed on a semiconductor substrate 100. A gate insulator film (first insulator film) 102 is then formed to a thickness of about 12 nm on the well by a thermal oxidation process (FIG. 3A).

Figure 3B:
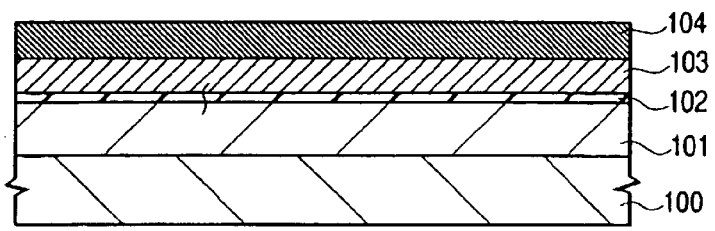

Next, a polysilicon film 103, that is doped with phosphorus (P) and is to function as a floating gate 103b, and a silicon nitride film 104, are deposited serially (FIG. 3B). The polysilicon film 103 and the silicon nitride film 104 can be deposited by CVD (Chemical Vapor Deposition), for example.

The silicon nitride film 104 and the polysilicon film 103 are then patterned by lithography and dry etching technologies. This patterning converts the silicon nitride film 104 and the polysilicon film 103 to a silicon nitride film 104a and a polysilicon film 103a (FIG. 3C), respectively. The silicon nitride film 104a and the polysilicon film 103a are patterned into a stripe shape so that they extend in the y direction.

Figure 3C:
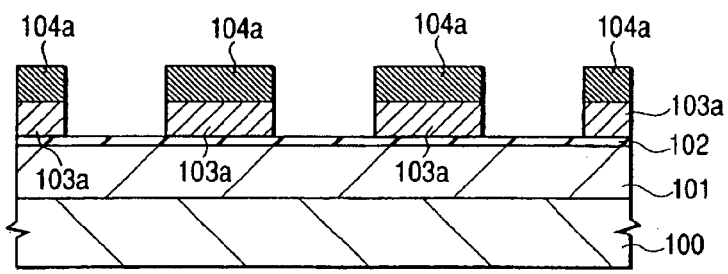
Figure 3D:
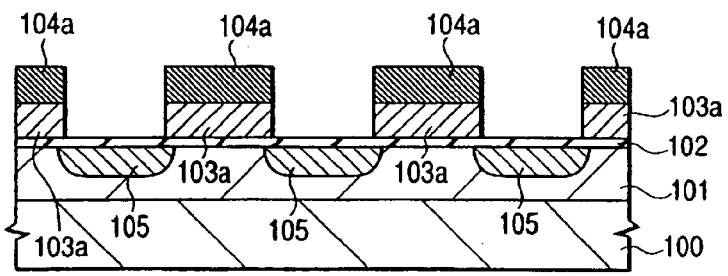

Arsenic (As) is implanted by ion implantation to form a diffusion layer 105 that functions as a source/drain of the memory cell (FIG. 3D). The diffusion layer 105 functions as a source or drain line of the memory cell. The silicon nitride film 104a and the polysilicon film 103a function as the mask during this ion implantation, and the diffusion layer 105 is formed in self-alignment with respect to the polysilicon film 103a. Incidentally, the diffusion layer 105 is so formed as to extend in the y direction because the silicon nitride film 104a and the polysilicon film 103a are so formed as to extend in the y direction.

Incidentally, the members etched in this process (silicon nitride film 104a and polysilicon film 103a) do not contain a metal film or a metal compound. Therefore, the metal does not dissolve in a cleaning step after the etching step and does not either adhere again to the wall surface of the etched members. In consequence, the insulator film 106 to be explained next does not contain the metal (impurity). Defects of the insulator film 106 can be restricted to a low level and reliability can be improved.

Figure 3E:
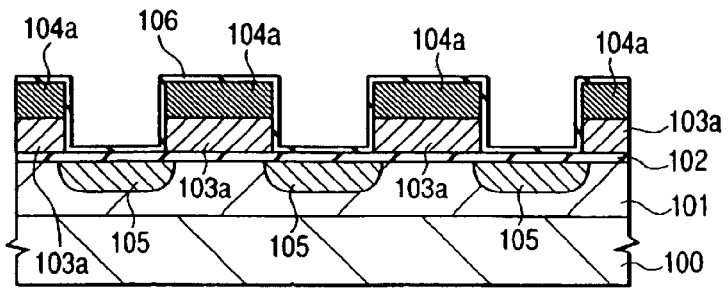

The insulator film 106 for isolating the floating gate 103b and the third gate 107a is then formed in the following way (FIG. 3E). An about 10.55 nm-thick silicon oxide film is deposited by LPCVD (Low Pressure Chemical Vapor Deposition). The silicon oxide film is heat-treated in an ammonia atmosphere to introduce nitrogen into the silicon oxide film. A wet oxidation treatment is then conducted for the silicon oxide film into which nitrogen is introduced. This is to remove hydrogen that is introduced into the silicon oxide film by the heat treatment in ammonia.

The charge trapping quantity is small in the insulator film 106 formed by the process described above, and this film 106 has good programming/erasing endurance characteristics. If the charge is trapped into the insulator film 106, the electrons so trapped move under the left-standing state into the third gate. If the quantity of the mobile electrons is great, the probability of the occurrence of a retention degradation becomes greater. Since the quantity of the mobile electrons increases with the trap density, the probability of the occurrence of the retention degradation becomes higher if the trapping quantity in the insulator film 106 is great. In this embodiment, however, the charge trapping quantity in the film is restricted. Therefore, this embodiment can restrict the retention defect and can accomplish good programming/erasing endurance characteristics. The insulator film 106 does not contain metal impurities as described above.

Figure 4A:
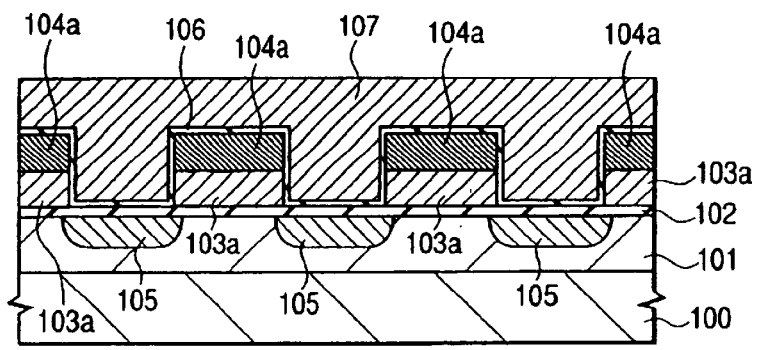
FIGS. 4A to 4D are sectional views showing an example of the production method of the semiconductor integrated circuit device of Embodiment 1.

A P-doped polysilicon film 107 to serve as a third gate 107a is then deposited in such a manner as to completely bury the gap between the floating gate patterns 103a (FIG. 4A). CVD, for example, is used for forming the polysilicon film 107.

Figure 4B:
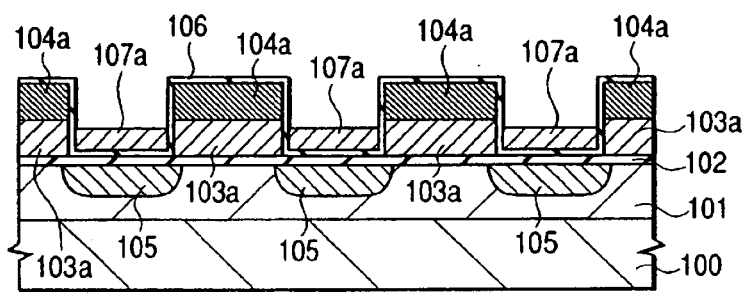

Anistoropic etching is conducted to etch back the polysilicon film 107. In this way, the third gate 107a having a predetermined thickness is formed in the gap between the floating gate patterns 103a (FIG. 4B). Here, the film thickness of the polysilicon film (the third gate 107a) remaining after etch-back is preferably smaller than the film thickness of the floating gate polysilicon 103a. When the film thickness of the third gate 107a is smaller than that of the floating gate 103b, the internal operating voltage can be lowered at the time of the erasing operation.

Figure 4C:
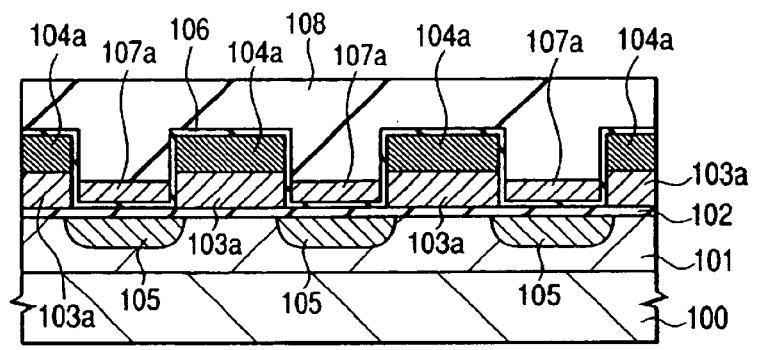

A silicon oxide film 108 is deposited in such a fashion as to completely bury the gap between the floating gate patterns 103a (FIG. 4C). CVD, for example, is used for depositing the silicon oxide film 108.

Figure 4D:
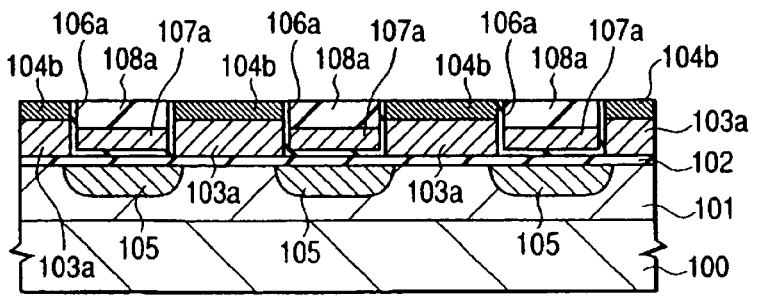

Next, the silicon oxide film 108 is polished by CMP (Chemical Mechanical Polishing) until the silicon nitride film 104a is exposed (whereby the silicon nitride film 104a and the silicon oxide films 106 and 108 turn to 104b, 106a and 108a, respectively) (FIG. 4D).

Next, the silicon nitride film 104b is removed by using a hot phosphoric acid aqueous solution, for example, and the surface of the polysilicon 103a is exposed (FIG. 5A). A P-doped polysilicon film 109 is deposited (FIG. 5B) and is then etched anisotropically (whereby the polysilicon film 109 turns to 109a) (FIG. 5C). This polysilicon film 109a is electrically connected to the polysilicon 103a, and these two layers of polysilicon form the floating gate. The polysilicon 109a increases the surface area of the floating gate and increases also the coupling ratio of the memory cell.

In this way, the internal operating voltage at the time of the programming/erasing operation can be lowered.

Next, a silicon oxide film (having a thickness of about 10.5 nm) 110 for isolating the floating gate and the word line is formed (FIG. 5D) by the same method as the one shown in FIG. 3E.

A stacked film of a polysilicon film, a tungsten nitride film and a tungsten film, or a so-called "polymetal film", is deposited, and is patterned by lithography and dry etching technologies to form word lines 111a. Patterning in this case is conducted so that the word lines 111a extend in the x direction, that is, in the direction (x direction) vertical to the extending direction of the third gate 107a (y direction).

The silicon oxide film 110 and the polysilicon films 109a and 103a are etched to complete the floating gate (whereby the silicon oxide film turns to 110a and the polysilicon 103a and 109a turn to 103b and 109b, respectively) (FIG. 5E). In this etching process, etching is conducted under the condition in which the silicon oxide film can be etched, in the stage where the silicon oxide film 110 is etched. In the stage where the polysilicon films 109a and 103a are etched, however, etching is conducted under the selective etching condition where polysilicon can be etched but the silicon oxide film cannot be etched. In this way, the insulator film 108a as the silicon oxide film functions as an etching stopper and the third gate 107a below the insulator film 108a is not etched. In other words, the third gate 107a keeps the stripe shape extending in the y direction and the floating gate 103b is split in both x and y directions, forming thereby island-like floating gates.

Thereafter, an intermetal insulating film, not shown, is formed and contact holes reaching the word line 111a, the source/drain diffusion layer 105, the well 101 and the third gate 107a are bored. Subsequently, a metal film is deposited and is then patterned to form wires. In this way, the memory cell can be completed.

Figure 6:
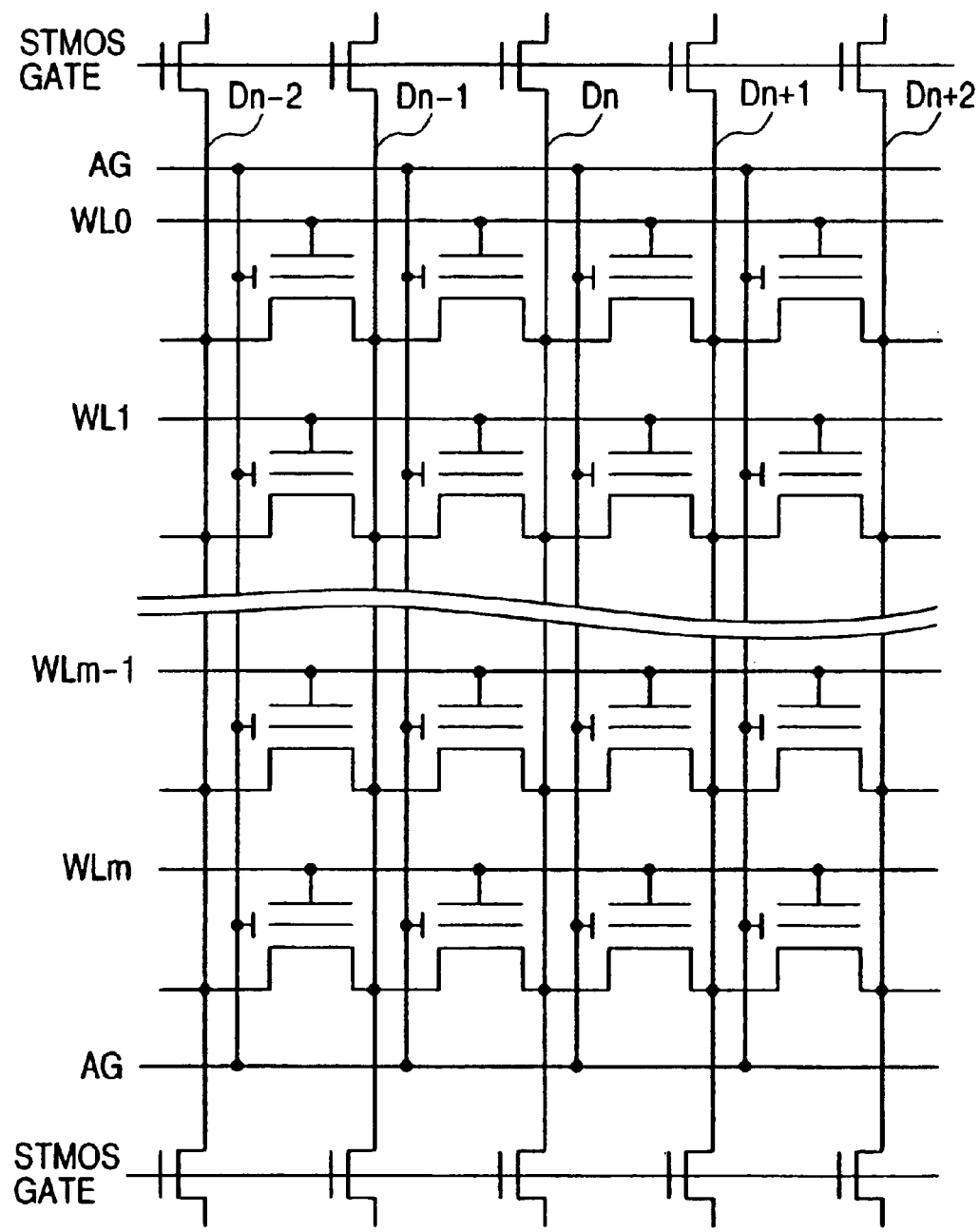
FIG. 6 is a circuit diagram showing the construction of a memory cell array of Embodiment 1.

FIG. 6 is a circuit diagram showing the construction of the memory cell array. The diffusion layers 105 ( ... $D_{n-2}$, $D_{n-1}$, $D_n$, $D_{n+1}$, $D_{n+2}$, ... ) to serve as the source/drain extend in the direction (y direction) vertical to the direction (x direction) of the word lines WL ($WL_0$, $WL_1$, ..., $WL_n$), and play the role of the wires for connecting the memory cells adjacent to one another in the y direction. The memory cells adjacent to each other in the x direction (in the extending direction of the word line WL) share the diffusion layer 105. Select MOS transistors for selecting the source line or the data line are disposed at both ends of each diffusion wire Dn in the y direction. The region encompassed by the select MOS is called an "array block". The third gate (assist gate) AG is so disposed as to extend in the y direction and is bound into one region at the upper and lower ends (both ends in the y direction) of the array block.

FIGS. 7 to 12 show the layout of the voltage applied area of the third gate 107a. In the semiconductor integrated circuit device of this embodiment, the portion encompassed by the gates 113 of the select transistors for selecting the local data line or the local source line constitutes the memory cell array block. The third gate pattern 107a is formed in self-alignment with the floating gate polysilicon pattern 103a (which is turned to the floating gate 103b after etching) when any method is employed.

Figure 7:
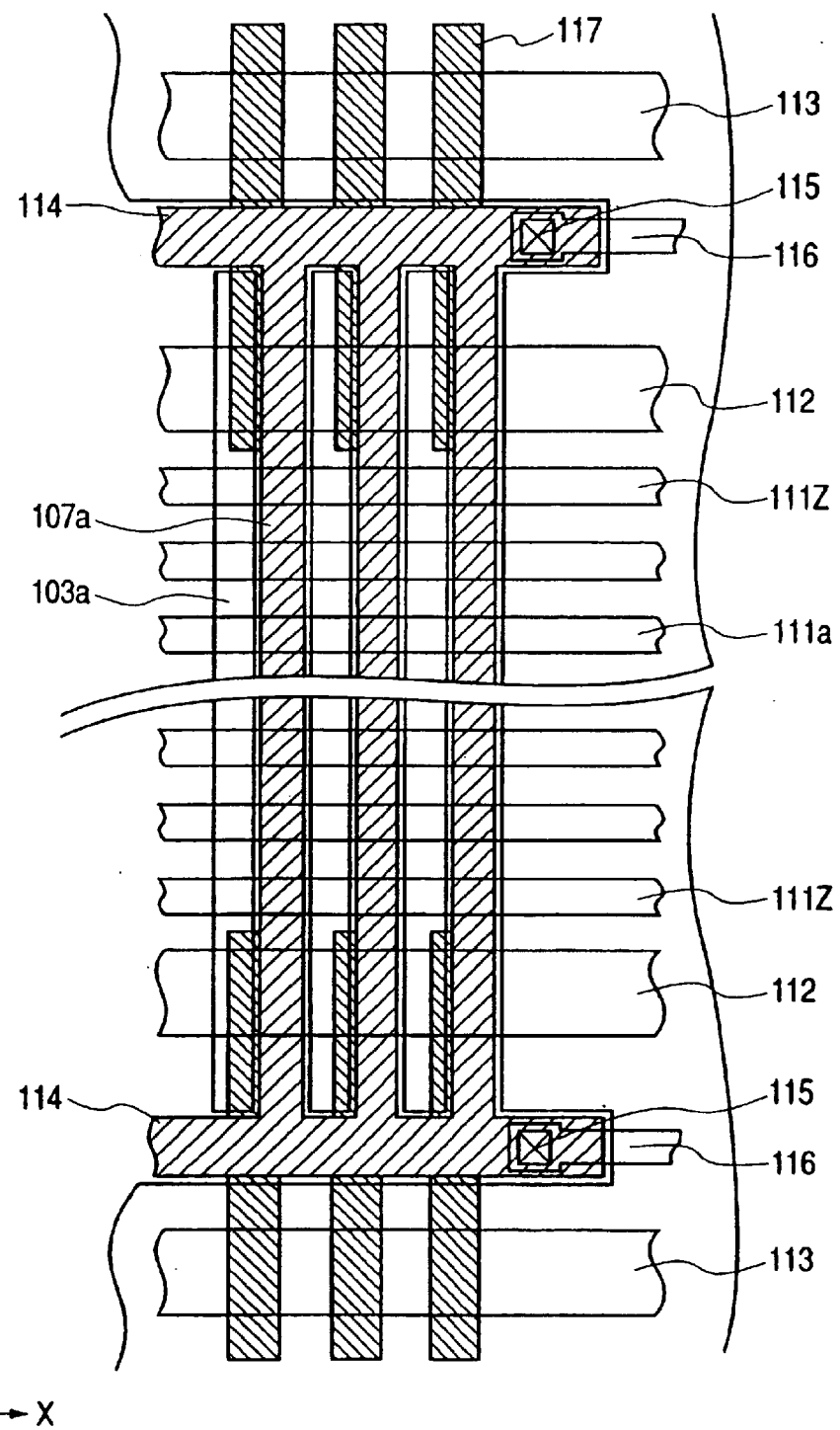
FIG. 7 is a plan view showing layout of a voltage applied area of a third gate electrode.
Figure 8:
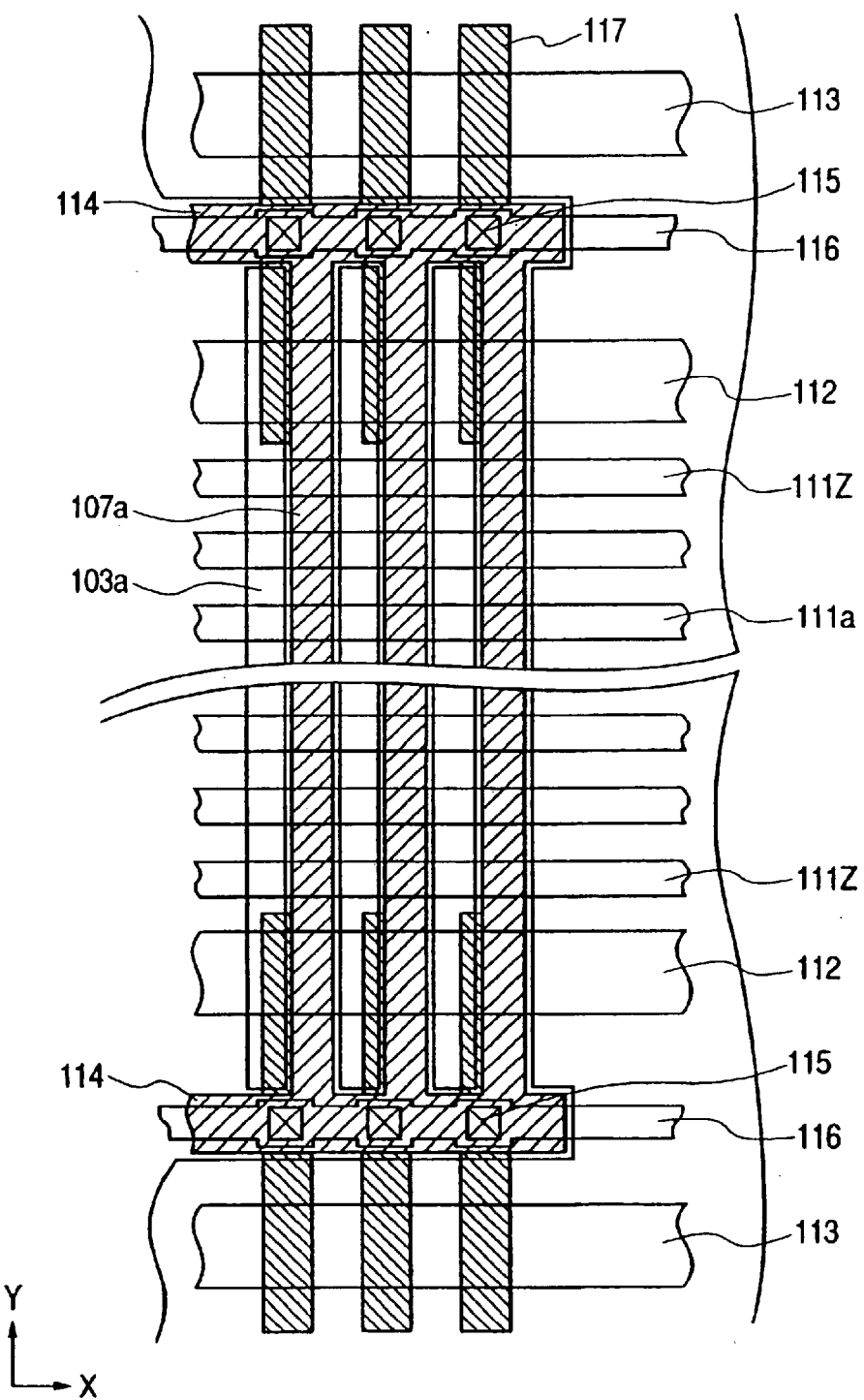
FIG. 8 is a plan view showing layout of the voltage applied area of the third gate electrode.
Figure 9:
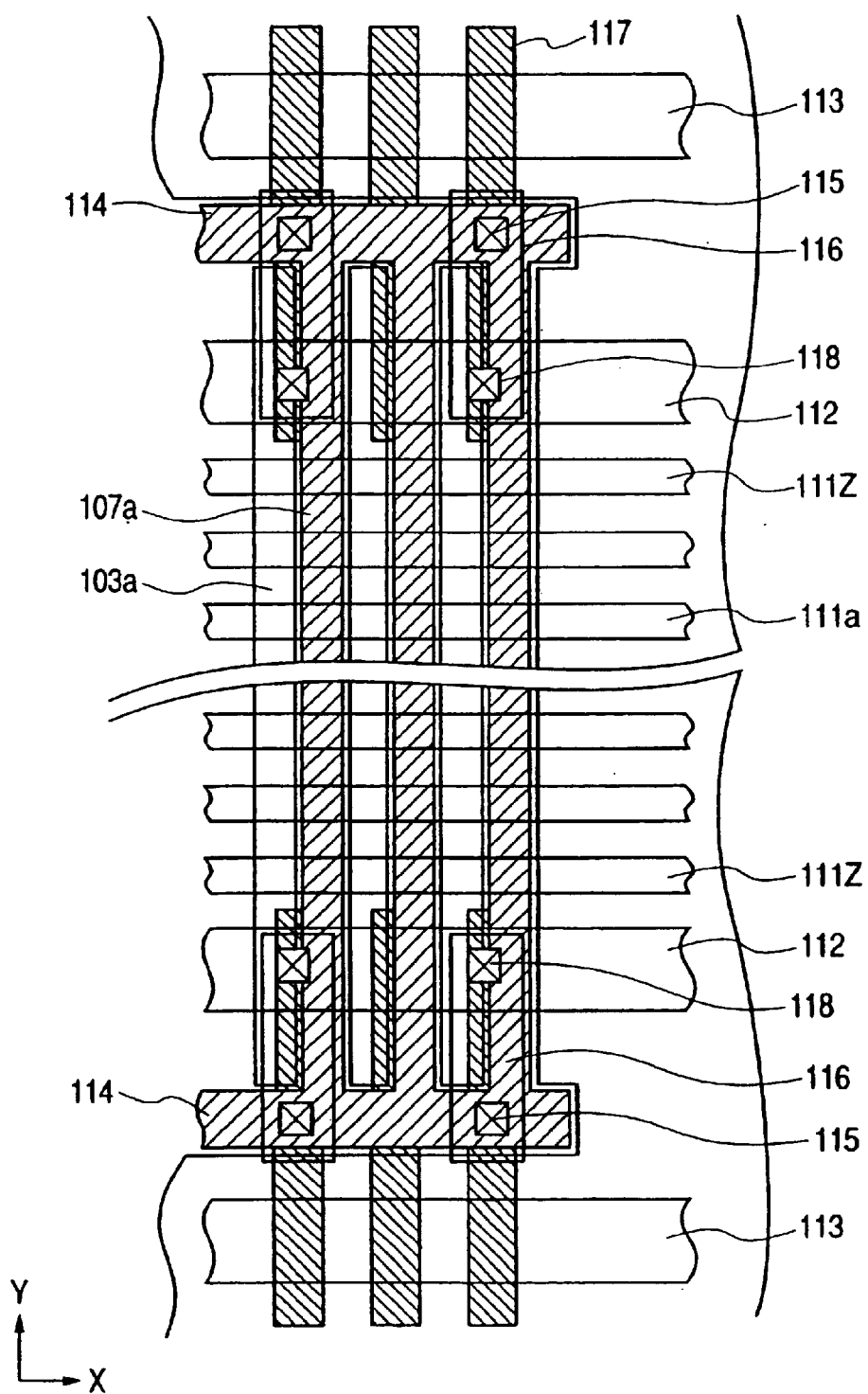
FIG. 9 is a plan view showing layout of the voltage applied area of the third gate electrode.

In the semiconductor integrated circuit device shown in FIGS. 7 to 9, the polysilicon 103a is patterned so that all the third gates 107a extending in the column direction (y direction) on both sides of the array block can be bundled into one. In contrast, in the semiconductor integrated circuit device shown in FIGS. 10 to 12, the polysilicon 103a is patterned so that every other third gates 107a extending in the column direction (y direction) on one of the sides (upper side or lower side) of the array block can be bundled into one. In either case, the bundled portion 114 of the third gates is disposed between the word line 111z and the gate 113 of the select transistor at the block end. Incidentally, a dummy pattern made of the same material as that of the word line 111a may be interposed between the word line 111z and the bundled portion 114 of the third gates.

Contact holes 115 reaching the bundling portion 114 of the third gates 107a are formed and metal wires 116 are connected to the contact holes to supply power to the third gates 107a. The following methods can be used for connecting the contact hole 115 and the metal wire 116.

Figure 10:
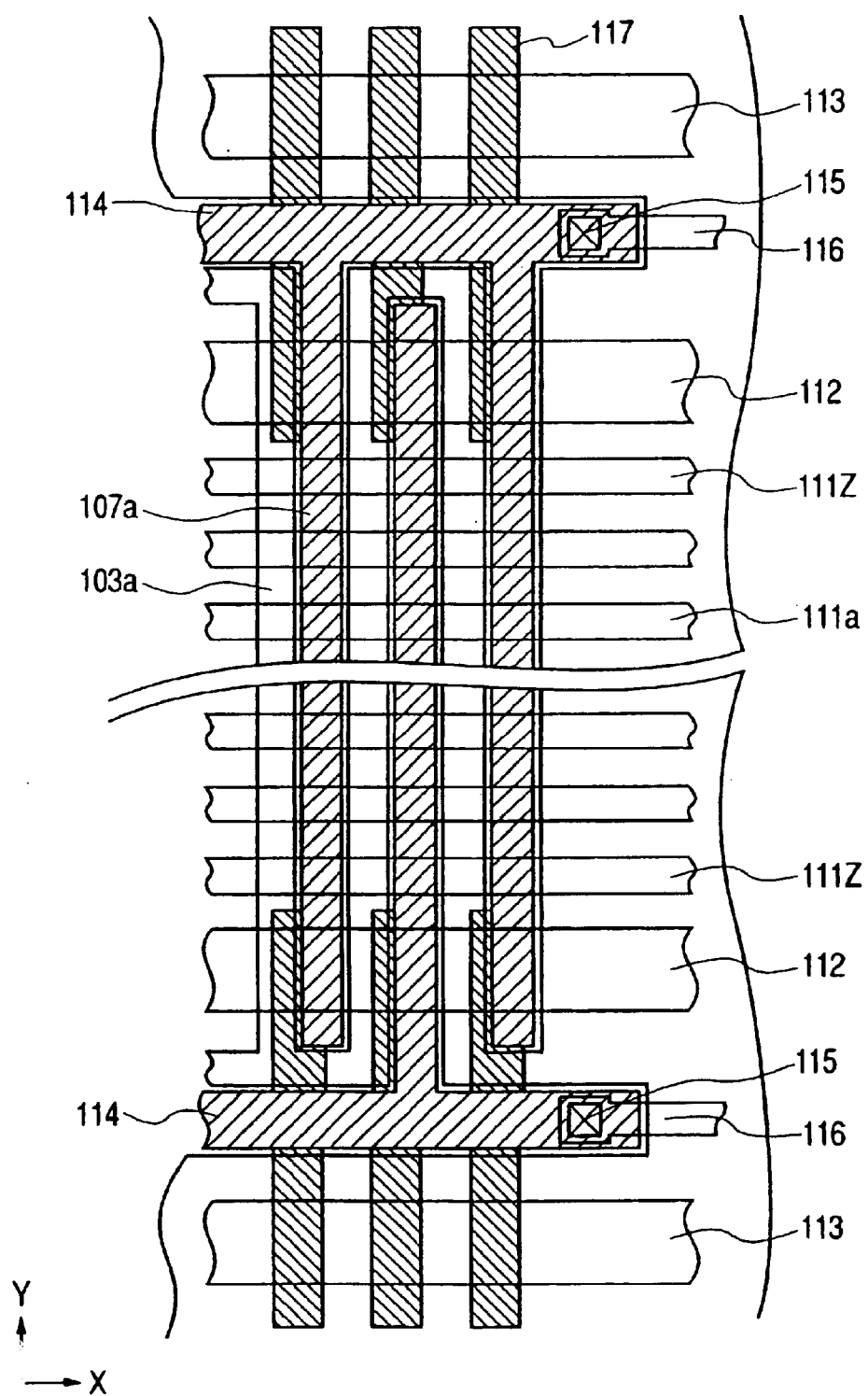
FIG. 10 is a plan view showing layout of the voltage applied area of the third gate electrode.

The first method disposes one or a plurality of contact holes 115 at the end portion of the bundling portion 114 of the third gates 107a and takes them out from the memory array by the metal wire 116 as shown in FIGS. 7 and 10. This method has the advantage that layout of the metal wires on the memory array is easy.

Figure 11:
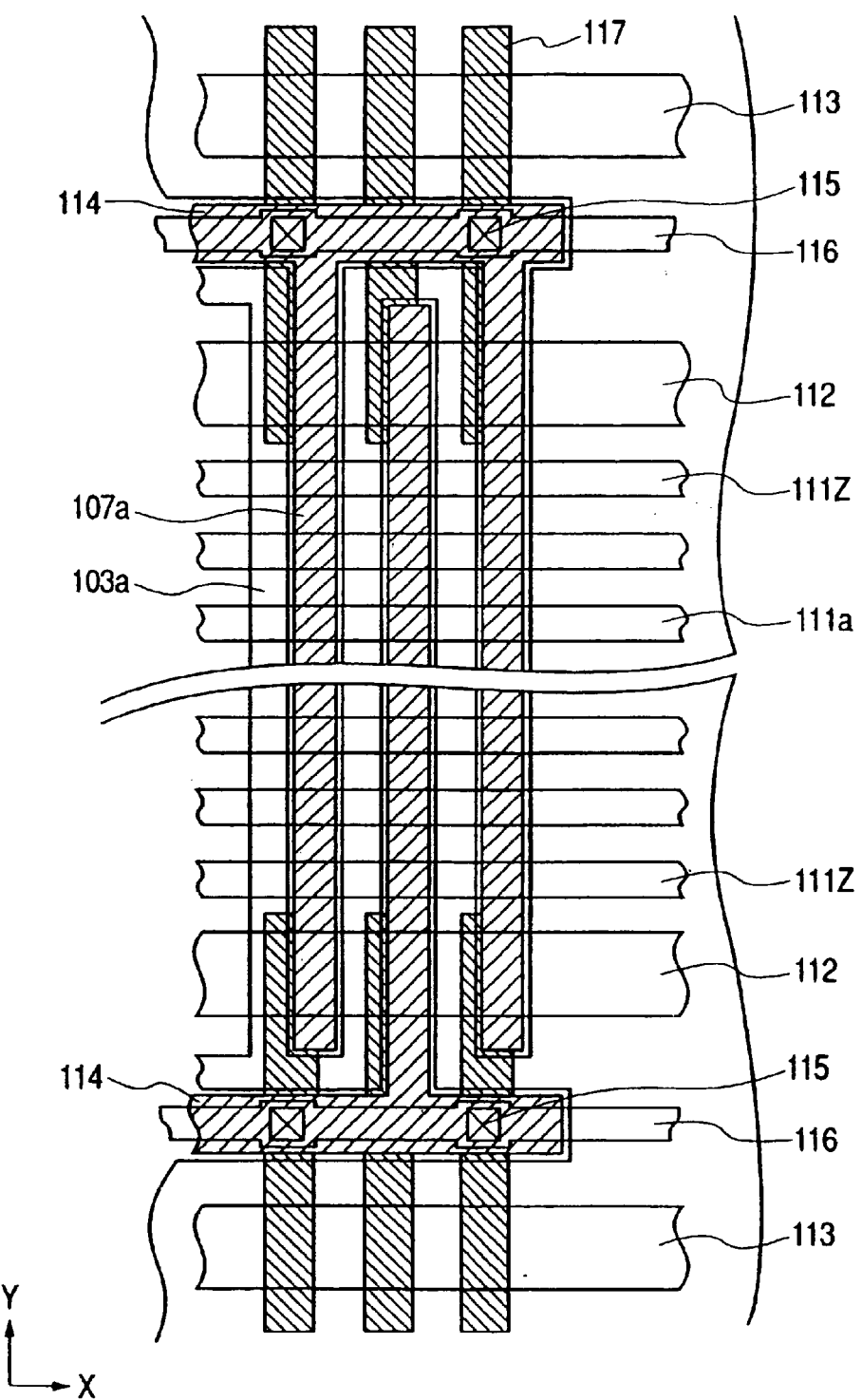
FIG. 11 is a plan view showing layout of the voltage applied area of the third gate electrode.

The second method disposes the contact holes 115 in substantially the whole region of the bundling portion 114 of the third gates 107a, connects them by the metal wire 116 and takes them out as shown in FIGS. 8 and 11. This method has the advantage that the voltage drop due to the resistance of the bundling portion 114 of the third gate can be restricted.

Figure 12:
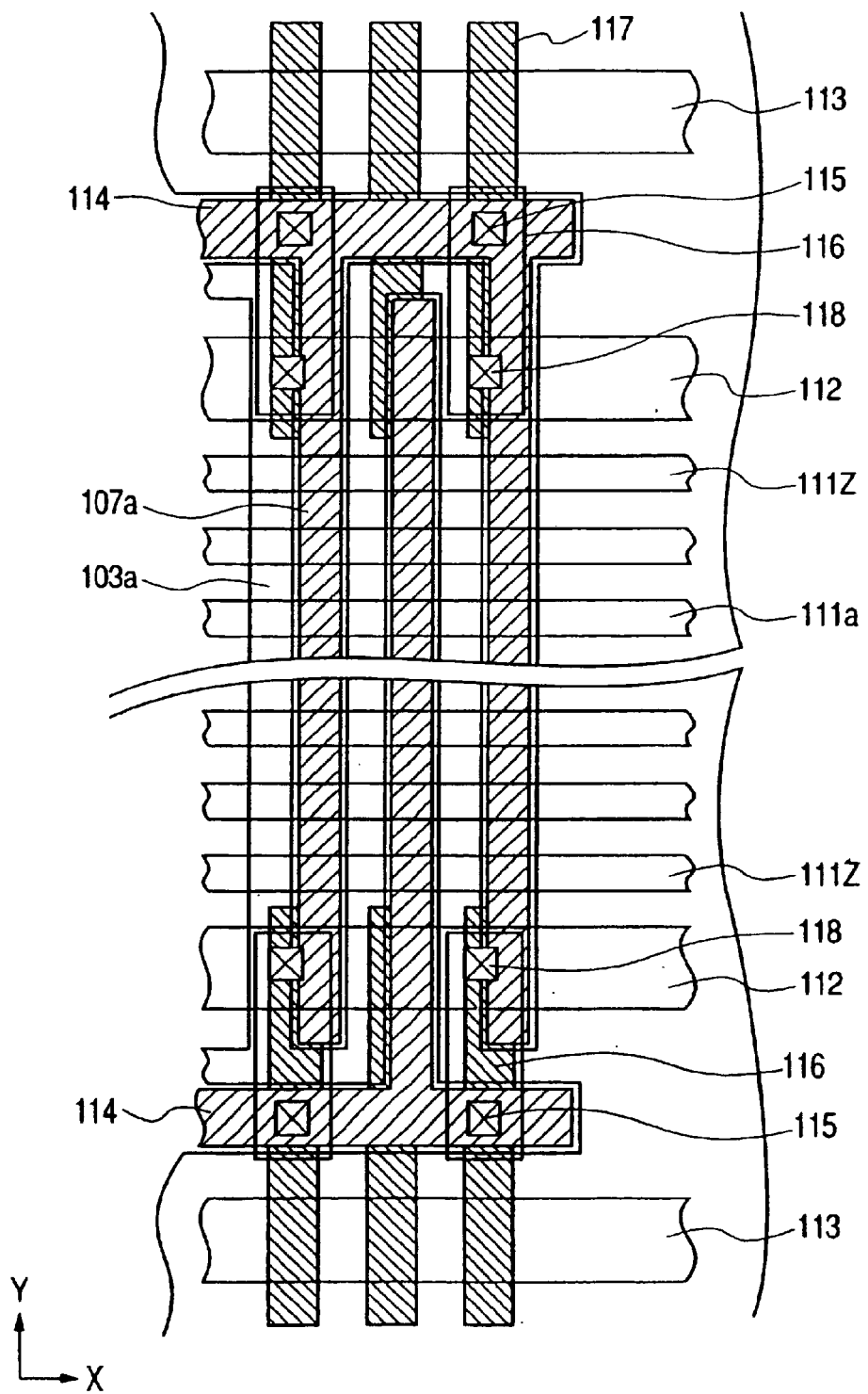
FIG. 12 is a plan view showing layout of the voltage applied area of the third gate electrode.

The third method disposes the contact holes 115 in substantially the whole region of the bundling portion 114 of the third gates with certain gaps between them in the same way as in the second method, and also disposes the contact holes 118 in substantially the whole region of the dummy pattern 112 with certain gaps, too, as shown in FIGS. 9 and 12. The metal wire 116 connects the contact holes 115 and 118 to one another. Since the polymetal film having a low resistance is used for connecting each third gate in this method, the voltage drop resulting from the resistance of the bundling portion 114 of the third gates can be restricted in the same way as in the second method. Since the distance between the contact holes 115 and 118 is small, the length of the metal wire 116 can be decreased, and layout of the metal wire on the memory array can be made easily in the same way as in the first method. In other words, this method has the advantages of both first and second methods. The methods shown in FIGS. 7 to 12 can be selected appropriately in accordance with the target specification of the semiconductor integrated circuit device.

Figure 13A:
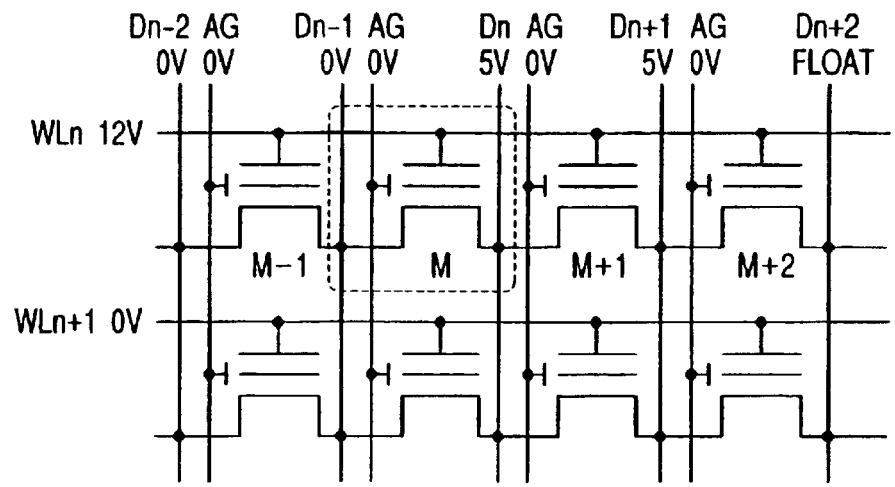

Next, the voltage application condition and the operation method of the memory cells produced by the method described above in the programming operation, the erasing operation and the read operation will be explained with reference to FIGS. 13 to 15. FIG. 13 shows an example of the programming operation. FIG. 14 shows an example of the erasing operation and FIG. 15 shows an example of the reading operation. In each of these drawings, A shows an equivalent circuit, and B or C shows a timing chart.

In FIGS. 13A to 15A, the respective operation is carried out selectively in the cell encompassed by dotted lines.

First, the programming operation will be explained. It will be assumed thereby that the selected memory cell is a cell M. A positive voltage of about 12 V, for example, is applied to the word line WLn (selected word line) of the selected cell M, and a positive voltage of about 5 V, for example, is applied to the diffusion layer Dn as the drain of the selected cell M. The diffusion layer Dn−1 to serve as the source of the selected cell M is kept at 0 V. As the source/drain and the word line are kept at the predetermined voltages in this way, hot electrons develop in the channel region of the memory cell M and are injected into the floating gate.

At this time, all of the third gate AG, the well and the unselected word line WLn+1 are kept at 0 V, and the diffusion layers Dn−2, Dn+1 and Dn+2 are at 0 V, 5 V and under the floating state, respectively. Therefore, the diffusion layers Dn−2 and Dn−1 are kept at the same voltage (0 V) and the diffusion layers Dn and Dn+1 are kept at the same voltage (5 V). Further, the voltage difference between the diffusion layers Dn+1 and Dn+2 hardly exists because the diffusion layer Dn+2 is under the floating state. In consequence, no hot electron develops in the channels of the memory cells M−1, M+1 and M+2, and miss-programming to the adjacent memory cells M−1, M+1 and M+2 can be prevented. The hot electron injection occurs in only the memory cell M. As the electrons are injected to the floating gate of the selected memory cell M, the threshold voltage of the memory cell rises and programming is conducted. In this way, the semiconductor integrated circuit device uses four adjacent memory cells as one unit, selects one cell among them and executes programming. Therefore, this embodiment executes the programming operation at least four times to program all the cells on one word line.

Figure 13B:
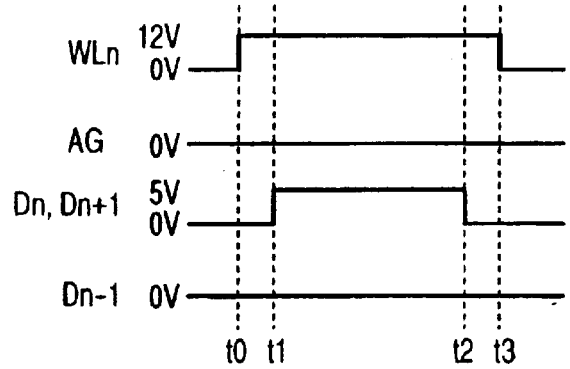
Figure 13C:
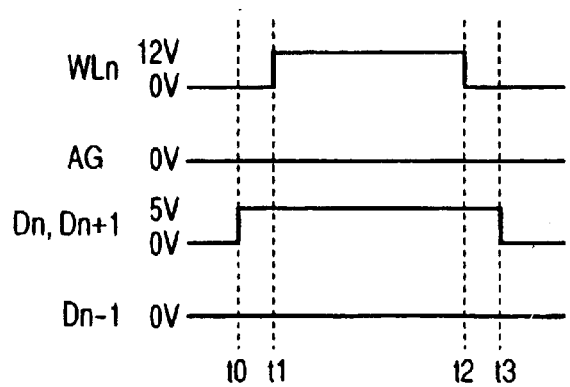

FIGS. 13B and 13C are timing charts showing examples of the timing of the voltage application to the selected word line WLn and to the diffusion layers Dn and Dn+1. There are two examples shown in FIGS. 13B and 13C.

After a voltage +12 V is applied to the selected word line WLn at the timing t0 as shown in FIG. 13B, +5 V is applied to the diffusion layers Dn and Dn+1 at the timing t1 (t0<t1). After this voltage is kept for a predetermined programming time t (t=t2−t1), the voltage of the diffusion layers Dn and Dn+1 is returned to 0 V at the timing t2. When programming is executed at such timings, drain disturb can be mitigated because the drain voltage application time is short.

Alternatively, after +5 V is applied to the diffusion layers Dn and Dn+1 at the timing t0 as shown in FIG. 13C, +12 V is applied to the selected word line WLn at the timing t1 (t0<t1). After this voltage is kept for a predetermined programming time t (t=t2−t1), the voltage of the selected word line WLn is returned to 0 V at the timing t2. The voltage of the diffusion layers Dn and Dn+1 is then returned to 0 V at the timing t3 (t2<t3). When programming is executed in this sequence, word disturb can be mitigated because the word line voltage application time is short.

Figure 14A:
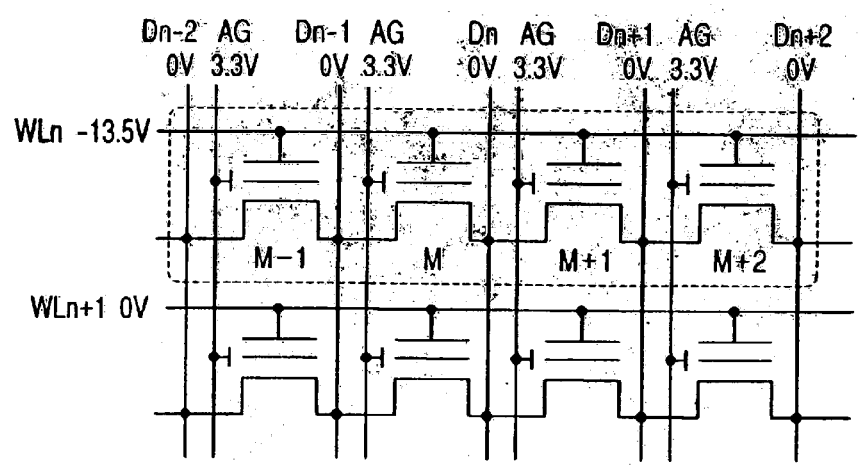

Next, the erasing operation will be explained. As shown in FIG. 14A, a negative voltage such as −13.5 V is applied to the selected word line WLn, and a relatively small positive voltage such as 3.3 V is applied to all the third gates. The diffusion layers Dn−2 to Dn+2, the well and the unselected word line WLn+1 are at 0 V. Consequently, ejection of the electrons occurs from the floating gate to the third gate in all the memory cells on the word line WLn due to the Fowler-Nordheim type tunneling phenomenon with the result that the threshold value of the memory cells drops and the erasing operation is conducted.

Incidentally, it is also possible to apply simultaneously a negative voltage such as −13.5 V to a plurality of word lines and a relatively low positive voltage such as 3.3 V to all the third gates AG while the diffusion layers D and the well are kept at 0 V. In this case, the cells on the word line to which the negative voltage is applied conduct the erasing operation.

It is further possible to apply a relatively large voltage such as 17 V to all the third gates AG and to set all the word lines, all the diffusion layers D and the wells to 0 V. In this case, all the memory cells inside the block conduct the erasing operation.

In this embodiment, the erase rate strongly depends on the oxide electric field. Therefore, as explained in the paragraph of the production method of the memory cell, the film thickness of the gate insulator film 102 for isolating the floating gate 103b from the semiconductor substrate 100 is greater than the film thickness of the silicon oxide film 110 for isolating the floating gate 103b from the control gate 111a and the film thickness of the silicon oxide film 106 for isolating the floating gate 103b from the third gate 107a.

Incidentally, the prior art technology uses in some cases the silicon oxide film, that is formed by thermally oxidizing the floating gate polysilicon film, as the tunnel film of the electrons between the floating gate and the erase gate. However, the thermal oxide film on the polysilicon has large quantities of traps and the electrons are caught into the oxide film as the number of times of programming increases. Consequently, the electric field applied to the oxide film drops substantially and the erase rate drops. A method of increasing the voltage applied to the erase gate with the increase of the number of times of programming has therefore been proposed. On the other hand, the silicon oxide film formed by the method of this embodiment has the trap quantity in the film equal to that of the oxide film on the well. Therefore, even when programming is repeated, the erase rate does not drop.

Figure 14B:
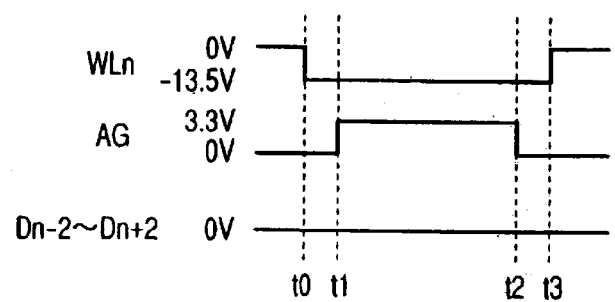

FIG. 14B is a timing chart showing an example of the voltage application timing to the selected word line WLn and to the third gate AG.

After −13.5 V is applied to the selected word line WLn at the timing t0 as shown in FIG. 14B, +3.3 V is applied to the third gate AG at the timing t1 (t0<t1). This voltage is kept for a predetermined erase time t (t=t2−t1), and the voltage of the third gate AG is then returned to 0 V at the timing t2. Thereafter the voltage of the selected word line WLn is returned to 0 V at the timing t3 (t2<t3). In such an erasing operation, the voltage of the third gate AG controls the erase time. In this case, the voltage width to be switched of the third gate AG is smaller than that of the word line voltage, and the switching time can be made shorter. In other words, the erasing operation of this embodiment that directly controls the erase time by the third gate AG is superior in controllability of the erase time. In addition, disturb to the unselected memory cells by the third gate AG can be reduced.

Figure 15A:
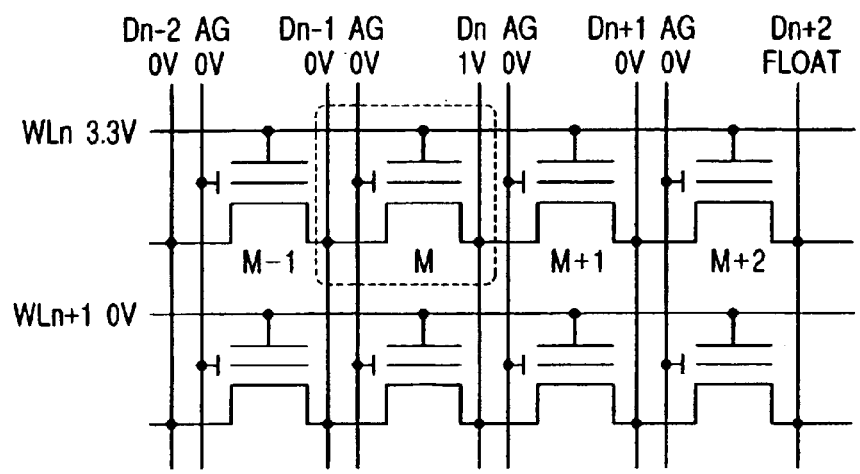

Next, the reading operation will be explained. As shown in FIG. 15A, a positive voltage of 3.3 V, for example, is applied to the word line WLn of the selected cell M and a positive voltage of 1 V, for example, is applied to the diffusion layer Dn to serve as the drain of the selected cell M. The diffusion layer Dn−1 to serve as the source of the selected cell M, all the third gates AG, the wells and the unselected word lines WLn+1 are kept at 0 V. The diffusion layers Dn−2, Dn+1 and Dn+2 are kept at 0 V, 1V and under the floating state, respectively, to prevent miss-read in the same way as in the programming operation. In this way, the semiconductor integrated circuit device of this embodiment uses four adjacent cells as one unit, selects one of them and executes the reading operation. Therefore, the reading operation is executed at least four times to conduct the read all the cells on one word line.

Figure 15B:
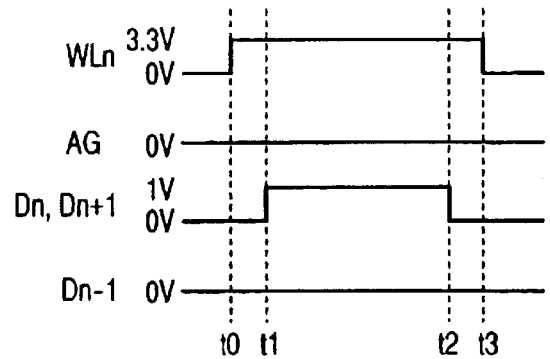
Figure 15C:
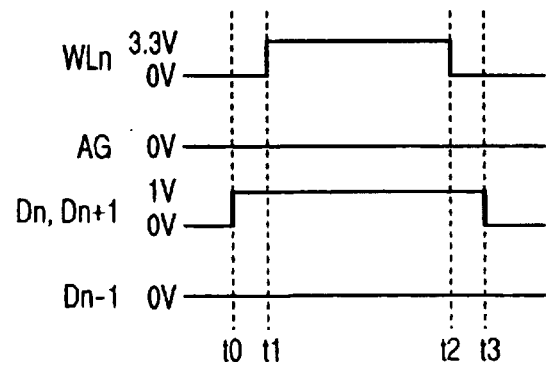

FIGS. 15B and 15C are timing charts showing examples of the voltage application timing to the selected word lines WLn and to the diffusion layers Dn and Dn+1. There are two examples as shown in these drawings.

As shown in FIG. 15B, after +3.3 V is applied to the selected word line WLn at the timing t0, +1 V is applied to the diffusion layers Dn and Dn+1 at the timing t1 (t0<t1). This voltage is kept for a predetermined read time t (t=t2−t1) and then the voltage of the diffusion layers Dn and Dn+1 is returned to 0 V at the timing t2. The voltage of the selected word line WLn is returned to 0 V at the timing t3 (t2<t3). When the programming operation is conducted with such timings, drain disturb can be mitigated because the drain voltage application time is short.

Alternatively, after +1 V is applied to the diffusion layers Dn and Dn+1 at the timing t0 as shown in FIG. 15C, +3.3 V is applied to the selected word line WLn at the timing t1 (t0<t1). This voltage is kept for a predetermined programming time t (t=t2−t1), and the voltage of the selected word line WLn is returned to 0 V at the timing t2. The voltage of the diffusion layers Dn and Dn+1 is then returned to 0 V at the timing t3 (t2<t3). When programming is conducted with such timings, word disturb can be relaxed because the word line voltage application time is short.

The semiconductor integrated circuit device of this embodiment can set the size in the local data line direction and in the word line direction to the size twice the minimum feature size F although the memory cell M has the third gate other than the floating gate and the control gate. Therefore, the memory cell area can be reduced to $4F^2$. Since this embodiment uses the polymetal structure for the word line, the delay of the transition time of the word lines in the programming and reading operations can be reduced. Furthermore, the defect density of the silicon oxide film between the floating gate and the third gate can be reduced because the word line having the polymetal structure is formed after the formation of the third gate. The maximum value of the absolute value of the internal operating voltage in the programming/erasing operation can be lowered to 13.5 V.

Unlike this embodiment, it is also possible to employ the method that comprises forming the floating gate pattern, forming then the third gate in the gap defined by the floating gate pattern, forming the word line vertical to the floating gate pattern, patterning further the floating gate with the word line as a mask, and forming the diffusion layer to serve as the source/drain. In this case, the channel and the word line cross each other at right angles, and the third gate oppose the floating gate on the plane parallel to the channel among the end faces of the floating gate. However, this method needs ion implantation of the diffusion layer after the third gate is formed, hence, the formation of the diffusion layer below the third gate becomes difficult. To connect the diffusion layer, therefore, the contact hole must be formed and the conductor must be connected for each memory cell, and the cell area becomes greater than in this embodiment. To simultaneously satisfy both miniaturization of the memory cell and reduction of the defect density, the arranging direction of the third gate must be such that its two end faces oppose the two end faces of the floating gate existing in the direction of the word line and the channel and in the direction vertical to the former, respectively, as described in this embodiment.

[Embodiment 2]

Figure 16A:
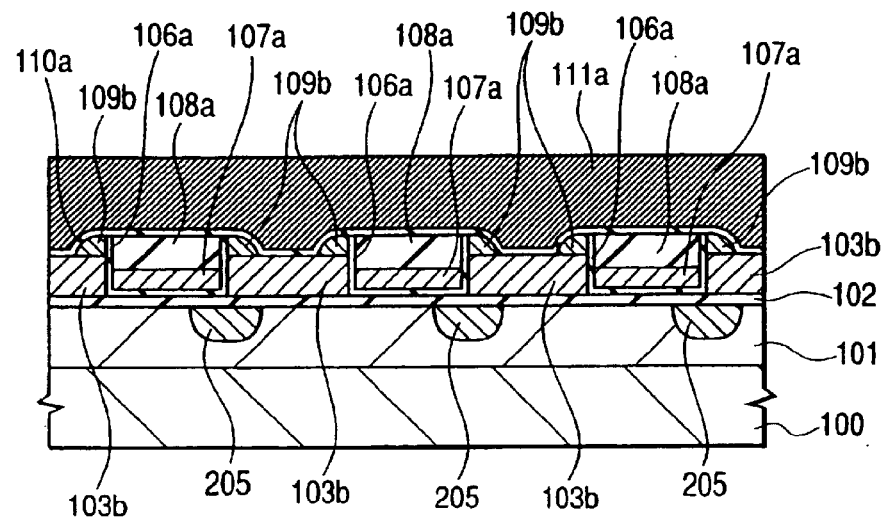
FIGS. 16A to 16C are sectional views showing an example of the semiconductor integrated circuit device according to Embodiment 2 of the present invention.
Figure 16B:
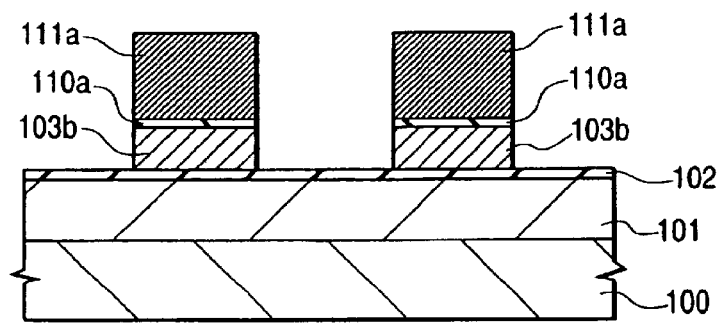
Figure 16C:
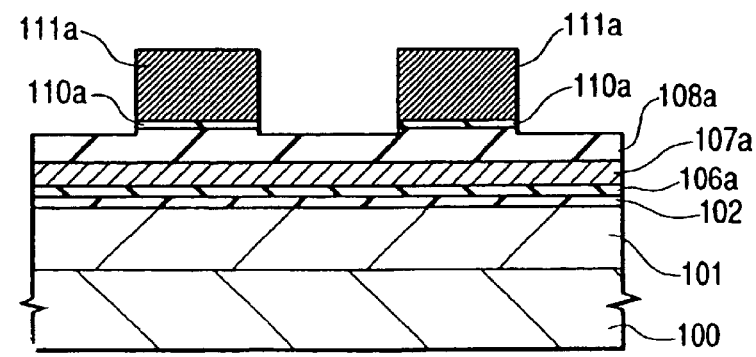

FIG. 16 is a sectional view showing an example of a semiconductor integrated circuit device according to Embodiment 2 of the present invention. The plan view of the semiconductor integrated circuit device of this embodiment is the same as FIG. 1 of the first embodiment. FIGS. 16A, 16B and 16C are sectional views taken along lines A–A', B–B' and C–C' in FIG. 1, respectively.

The semiconductor integrated circuit device according to this embodiment is different from the semiconductor integrated circuit device of Embodiment 1 in only its source/drain diffusion layer 205. The materials of other members, their structures and arrangement, etc, are the same as those of Embodiment 1. Therefore, the explanation will be given on only the different portion, and the explanation of other members will be omitted.

The source/drain diffusion layer 205 is disposed vertically to the word line 111a and exists as a local source line and a local data line for connecting the source/drain of the memory cells in the column direction (x direction). This construction is the same as that of Embodiment 1 and does not have the contact hole for each memory cell. This is a so-called "contact-less array". This contact-less array can improve the memory cell formation density in the same way as in Embodiment 1. Therefore, the semiconductor integrated circuit device can reduce the memory cell area to $4F^2$ (F: minimum feature size) in the same way as in Embodiment 1.

In the source/drain diffusion layer 205 of this embodiment, on the other hand, a pair of diffusion layers 205 for forming the source/drain has an asymmetric positional relationship with respect to the floating gate pattern 103a, and an offset structure is employed in which one of the diffusion layers does not overlap with the floating gate. In Embodiment 1, the entire surface of the third gate that is to function as the erase gate exists on the diffusion layer 105 but in this embodiment, the third gate 107a and the diffusion layer 205 exist in such a fashion that their part overlaps mutually. In consequence, the channel is formed also in the well below the third gate 107a in this embodiment, and the third gate 107a of this embodiment functions not only as the erase gate but also as a gate for controlling the channel existing therebelow. The occurrence quantity of the hot electrons and injection efficiency increase at the time of programming, and programming can be made in a region where the channel current is small. Accordingly, parallel programming of a large number of memory cells above a kilo-byte order can be made by using an internal power source having a current supply capacity substantially equal to that of the prior art devices.

Next, the production method of the semiconductor integrated circuit device of this embodiment will be explained. The production method of this embodiment is the same up to the process step shown in FIG. 3C as that of Embodiment 1.

Figure 17:
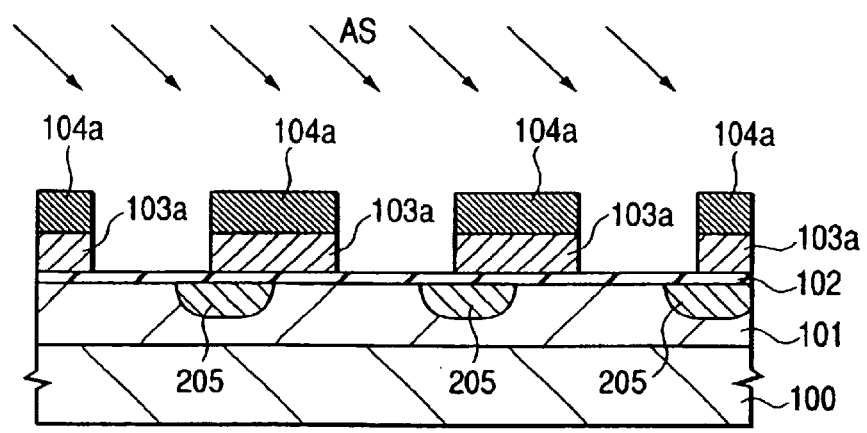
FIG. 17 is a sectional view showing a production method of the semiconductor integrated circuit device according to Embodiment 2.

As shown in FIG. 3C showing the first embodiment, the silicon nitride film 104a and the polysilicon film 103a are formed. Next, as shown in FIG. 17, arsenic (Ar) ions are implanted into the well 101 by a tilted ion implantation method to form a diffusion layer 205 that is to function as the source/drain of the memory cell. Since the diffusion layer 205 is formed by the tilted ion implantation method, the implanted ions are cut off by the silicon nitride film 104a and the polysilicon film 103a, and the diffusion layer 205 is not formed in the entire region between the polysilicon films 103a. Since the ions are implanted from the oblique direction, the diffusion layer 205 is formed partly below the polysilicon film 103a. In this way, the third gate 107a and the diffusion layer 205 are formed in such a fashion that they partly overlap with each other, and the channel is formed inside the well 101 below the third gate 107a.

Thereafter, the process steps of Embodiment 1 shown in FIGS. 3E to 5E are carried out, and the memory cell is completed.

Figure 18:
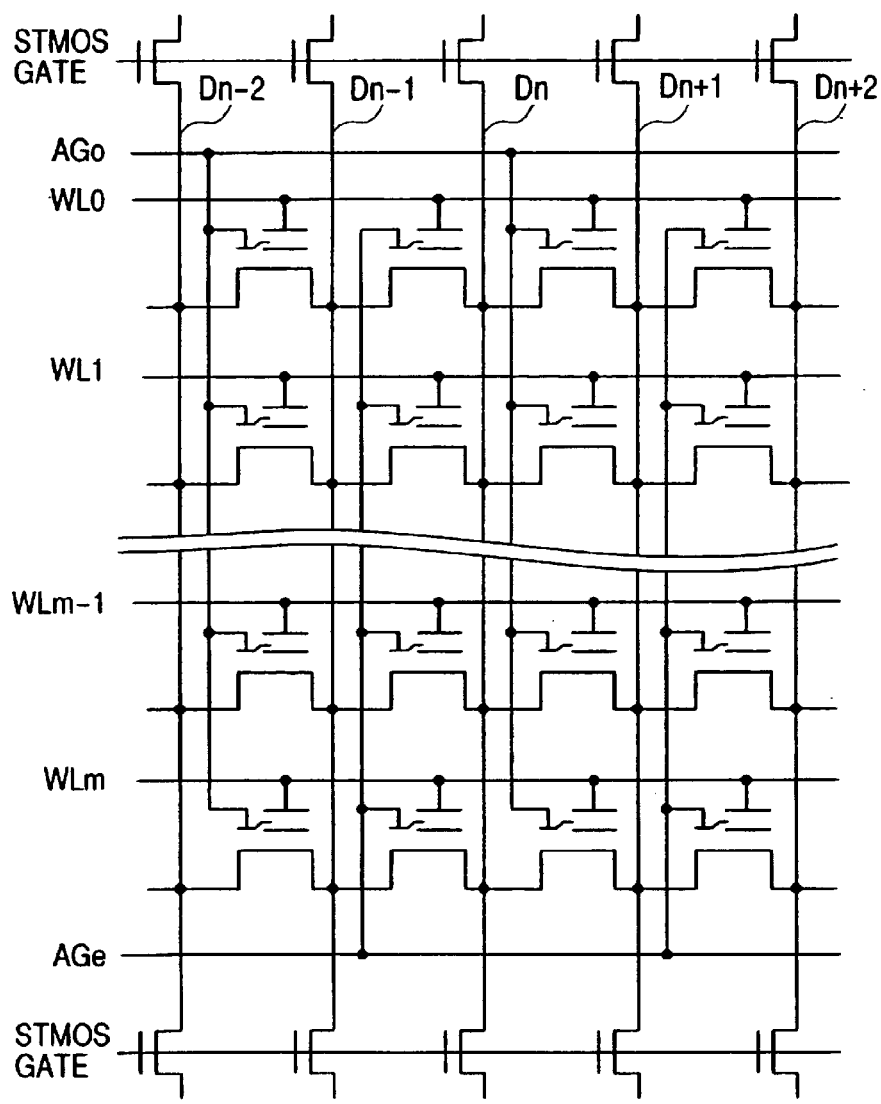
FIG. 18 is a circuit diagram showing the construction of a memory cell array of Embodiment 2.

FIG. 18 is a circuit diagram showing the construction of the memory cell array in this embodiment. The diffusion layers 105 ( . . . $D_{n-2}$, $D_{n-1}$, $D_n$, $D_{n+1}$, $D_{n+2}$, . . . ) to serve as the sources/drains, the word lines WL ($WL_0$, $WL_1$, . . . , $WL_n$), the select MOS transistors for selecting the source lines or the data lines and the array block are the same as those of Embodiment 1. In this embodiment, the polysilicon 103a is patterned so that every other third gates 107a extending in the column direction (y direction) can be bundled on one of the sides (upper side or lower side) of the array block for the third gates (AG) in the same way as in Embodiment 1 shown in FIGS. 10 to 12, and separate voltages can be applied to every other third gates 107a (AG) so bundled. Incidentally, the bundling portion 114 of the third gates can be interposed between the word line 111a at the end of the block and the gate 113 of the select transistor in the same way as in Embodiment 1. The bundling portion 114 of the third gates 107a, the contact holes 115 and the metal wires 116 are the same as those of Embodiment 1.

Next, the voltage application condition and the operation method of the memory cells produced by the method described above in its programming, erasing and reading operations will be explained with reference to FIGS. 19 to 21. FIG. 19 shows the programming operation. FIG. 20 shows the erasing operation and FIG. 21 does the reading operation. In these drawings, A shows an equivalent circuit, and B to G show timing charts. In FIGS. 19A to 21A, the memory cell encompassed by dotted lines executes selectively the respective operations.

A positive voltage such as about 12 V, for example, is applied to the word line WLn of the selected cell M and a positive voltage of about 5 V, for example, is applied to the diffusion layer Dn functioning as the drain of the selected cell M in the programming operation. A voltage approximate to the threshold value of the MOS transistor constituted by the third gates, such as about 2 V, is applied to the third gates AGe of the selected cells M and M+2. The diffusion layer Dn−1 functioning as the source of the selected cell M, the well and the unselected word line WLn+1 are kept at 0 V. A large electric field in both transverse and vertical directions is generated in the channel below the boundary between the floating gate and the third gate due to the bias condition described above. Consequently, the occurrence quantity of the hot electrons and injection efficiency are improved, and a high-speed programming operation can be made although the channel current is small. Even when an internal power source having current drivability of about 1 mA is used, therefore, parallel programming of the memory cells of K-byte or more can be made.

Incidentally, the third gates AG0 are kept at 0 V in the memory cells M−1 and M+1 adjacent to the selected cell M. Even if at least one of the memory cells M and M+2 is under the programming state, the third gates AG0 in the memory cells M−1 and M+1 adjacent to the former play the role of the switch with the result that the channel is OFF and no current flows through the channel. Therefore, the hot electrons are not generated and programming is not executed.

As described above, the semiconductor integrated circuit device of this embodiment uses two adjacent memory cells as one unit, selects one of them and conducts the programming operation. Therefore, to program all the cells on one word line, the programming operation can be completed when the programming operation is conducted at least twice, and the number of times becomes smaller than in Embodiment 1.

High efficiency hot electron injection brought forth by the third gates AG (Age, Ago) and prevention of miss-programming of the adjacent cells can increase the programming unit and can improve the programming rate that is indispensable for a large capacity flash memory.

FIGS. 19B to 19G are timing charts showing examples of the voltage application timings to the selected word line WLn, the diffusion layer Dn and the third gate AGe. As shown in these drawings, there are six examples.

Figure 19A:
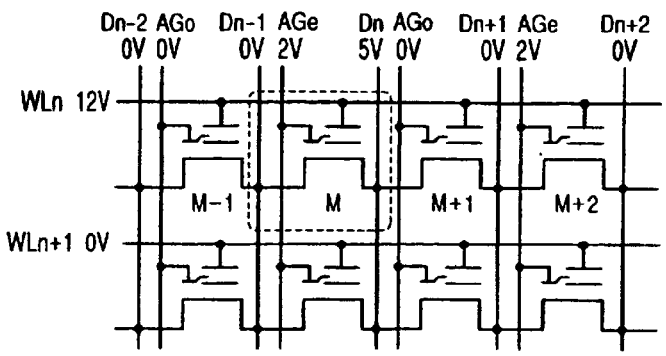
Figure 19B:
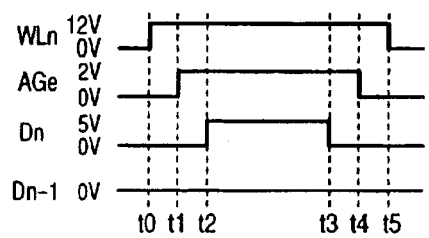

As shown in FIG. 19B, after +12 V is applied to the selected word line WLn at the timing to, +2V is applied to the third gate AGe at the timing t1 (t0<t1). Next, +5 V is applied to the diffusion layer Dn at the timing t2 (t1<t2). After this voltage is kept for a predetermined programming time t (t=t3−t2), the voltage of the diffusion layer Dn is returned to 0 V at the timing t3 and the voltage of the third gate AGe is returned to 0 V at the timing t4 (t3<t4). Further, the voltage of the selected word line WLn is returned to 0 V at the timing t5 (t4<t5). Alternatively, after +2 V is applied to the third gate AGe at the timing t0, +12 V is applied to the selected word line WLn at the timing t1 (t0<t1). Next, +5 V is applied to the diffusion layer Dn at the timing t2 (t1<t2). After this voltage is kept for a predetermined programming time t (t=t3−t2), the voltage of the diffusion layer Dn is returned to 0 V at the timing t3 and the voltage of the selected word line WLn is returned to 0 V at the timing t4 (t3<t4). Further, the voltage of the third gate AGe is returned to 0 V at the timing t5 (t4<t5). When programming is conducted at these timings, drain disturb can be mitigated because the drain voltage application time is short.

Figure 19C:
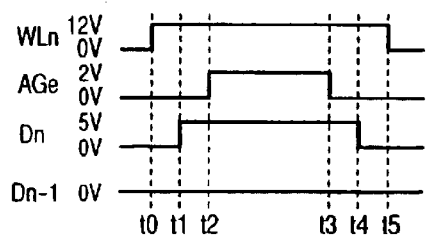
Figure 19D:
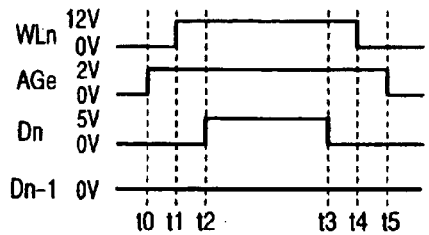
Figure 19E:
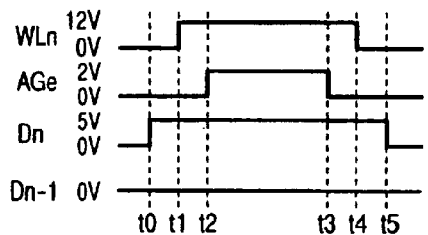

As shown in FIG. 19C, +12V is applied to the selected word line WLn at the timing t0, and then 5 V is applied to the diffusion layer Dn at the timing t1 (t0<t1). Next, +2 V is applied to the third gate AGe at the timing t2 (t1<t2). After this voltage is kept for a predetermined programming time t (t=t3−t2), the potential of the third gate AGe is returned to 0 V at the timing t3 and the voltage of the diffusion layer Dn is returned to 0 v at the timing t4 (t3<t4). Further, the voltage of the selected word line WLn is returned to 0 V at the timing t5 (t4<t5). Alternatively, as shown in FIG. 19E, after +5 V is applied to the diffusion layer Dn at the timing t0, +12 V is applied to the selected word line WLn at the timing t1 (t0<t1). Next, +2 V is applied to the third gate AGe at the timing t2 (t1<t2). This voltage is kept for a predetermined programming time t (t=t3−t2), and the voltage of the third gate AGe is returned to 0 V at the timing t3. The voltage of the selected word line WLn is returned to 0 V at the timing t4 (t3<t4) and the voltage of the voltage of the diffusion layer Dn is returned to 0 V at the timing t5 (t4<t5). When programming is executed at these timings, the voltage of the third gate AGe controls the programming time t. Since the voltage of the third gate AGe has a smaller voltage width to be switched than the word line voltage or the diffusion layer voltage in this case, the switching time can be shortened. Consequently, the operation of directly controlling the programming time t by the third gate AGe is superior in controllability of the programming time.

Figure 19F:
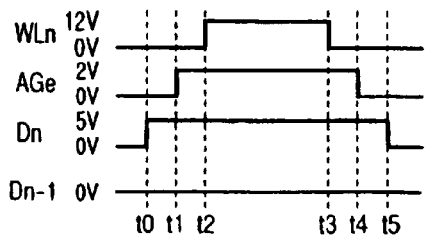
Figure 19G:
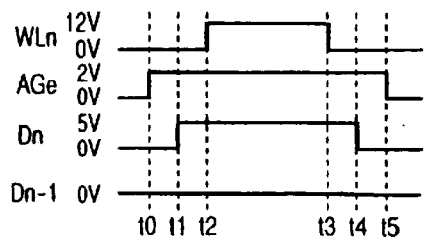

As shown in FIG. 19F, after +5 V is applied to the diffusion layer Dn at the timing t0, +2 V is applied to the third gate AGe at the timing t1 (t0<t1). Next, +12 V is applied to the selected word line WLn at the timing t2 (t1<t2). This voltage is kept for a predetermined programming time t (t=t3 t2), the voltage of the selected word line WLn is returned to 0 V at the timing t3 and the voltage of the third gate AGe is returned to 0 V at the timing t4 (t3<t4). Further, the voltage of the diffusion layer Dn is returned to 0 V at the timing t5 (t4<t5). Alternatively, as shown in FIG. 19G, after +2 V is applied to the third gate AGe at the timing t0, +5 V is applied to the diffusion layer Dn at the timing t1 (t0<t1). Next, +12 V is applied to the selected word line WLn at the timing t2 (t1<t2). After this voltage is kept for a predetermined programming time t (t t3−t2), the voltage of the selected word line WLn is returned to 0 V at the timing t3 and the voltage of the diffusion layer Dn is returned to 0 V at the timing t4 (t3<t4). Further, the voltage of the third gate AGe is returned to 0 V at the timing t5 (t4<t5). When programming is conducted at these timings, word disturb can be mitigated because the word line voltage application time is short.

Figure 20A:
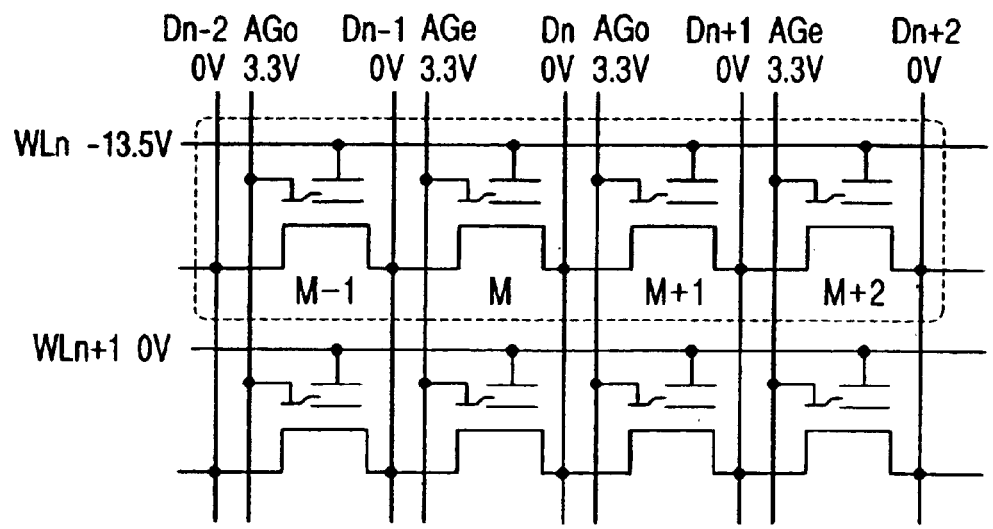

Next, the erasing operation will be explained. As shown in FIG. 20A, a negative voltage of −13.5 V, for example, is applied to the selected word line WLn while a relatively small positive voltage such as 3.3 V, for example, is applied to all the third gates AGe and AG0. Each diffusion layer Dn−2 to Dn+2, the well and the unselected word line WLn+1 are at 0 V. In consequence, ejection of the electrons occurs from the floating gate to the third gate due to the Fowler-Nordheim type tunneling phenomenon with the result that the threshold value of the memory cell drops and the erasing operation is conducted.

Incidentally, it is possible to simultaneously apply a negative voltage such as −13.5 V to a plurality of word lines and a relatively small positive voltage such as 3.3 V to all the third gates AGe and AGo. It is further possible to apply a relatively large voltage such as 17 V to all the third gates AG and to keep all the word lines, each diffusion layer D and the well at 0 V in the same way as in Embodiment 1.

It is also possible to apply a negative voltage of −9 V, for example, to the word line WLn and a positive voltage of 4 V, for example, to each diffusion layer D while all the third gates AG, the well and the unselected word line WLn+1 are kept at 0 V. In consequence, ejection of the electrons occurs from the floating gate to the diffusion layer D in all the memory cells on the word line WLn due to the Fowler-Nordheim type tunneling phenomenon, the threshold value of the memory cells drops and the erasing operation is conducted.

Figure 20B:
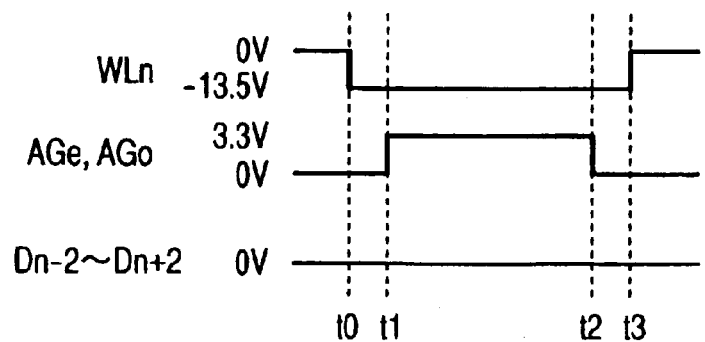

FIG. 20B is a timing chart showing an example of the voltage application timing to the selected word line WLn and the third gates AGe and AGo. The erasing timing is the same as that of Embodiment 1 and is also explained in Embodiment 1.

To read the data, a positive voltage of 3.3 V, for example, is applied to the word line WLn of the selected cell M and a positive voltage of 1 V, for example, is applied to the diffusion layer Dn that is to function as the drain of the selected cell M. A voltage of about 3.3 V is applied to the third gate AGe of the selected cell M and the cell M+2, and the channel below the third gate is completely turned ON. The diffusion layer Dn−1 to function as the source of the selected cell M, the well and the unselected word line WLn+1 are kept at 0 V. On the other hand, the third gate AGo is set to 0 V in the memory cells M−1 and M+1 that are adjacent to the selected cell M. In this way, no channel is formed in the memory cells M−1 and M+1 and miss-read can be prevented even when at least one of the memory cells M and M+2 is under the read state.

As described above, this embodiment uses two adjacent memory cells as one unit, selects one of them and executes the reading operation of the memory cell. Therefore, to read all the cells on one word line, the reading operation is executed twice, and the number of times of the reading operation is smaller than that of Embodiment 1.

FIGS. 21B to 21G are timing charts that show examples of the voltage application timing to the selected word line WLn and the third gate AGe. There are six examples as shown in FIGS. 21B to 21G.

Figure 21A:
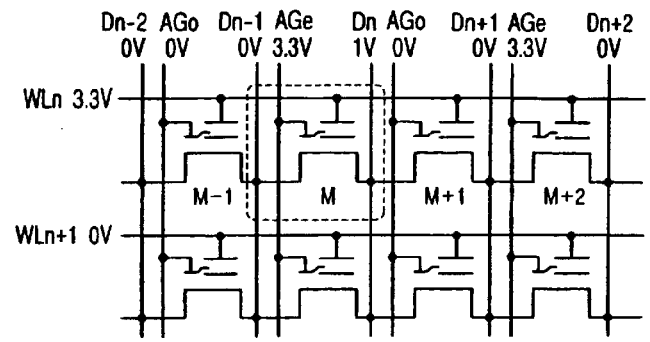
Figure 21B:
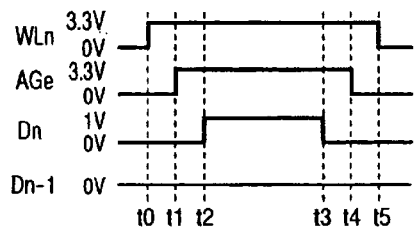

As shown in FIG. 21B, after +3.3 V is applied to the selected word line WLn at the timing to, +3.3 V is applied to the third gate AGe at the timing t1 (t0<t1). Next, +1 V is applied to the diffusion layer Dn at the timing t2 (t1<t2). After this voltage is kept for a predetermined read time t (t=t3−t2), the voltage of the diffusion layer Dn is returned to 0 V at the timing t3 and the voltage of the third gate AGe is returned to 0 V at the timing t4 (t3<t4). Further, the voltage of the selected word line WLn is returned to 0 V at the timing t5 (t4<t5). Alternatively, as shown in FIG. 21D, after +3.3 V is applied to the third gate AGe at the timing t0, +3.3 V is applied to the selected word line WLn at the timing t1 (t0<t1). Next, +1 V is applied to the diffusion layer Dn at the timing t2 (t1<t2). This voltage is kept for a predetermined read time t (t t3−t2), and the voltage of the diffusion layer Dn is returned to 0 V at the timing t3. The voltage of the selected word line is returned to 0 V at the timing t4 (t3<t4), and the voltage of the third gate AGe is returned to 0 V t the timing t5 (t4<t5). When programming is made at these timings, drain disturb can be restricted because the drain voltage application time is short.

Figure 21C:
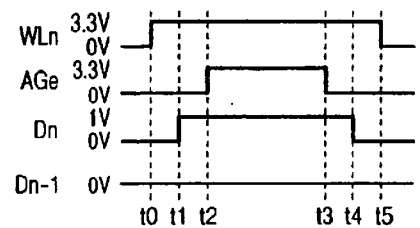
Figure 21D:
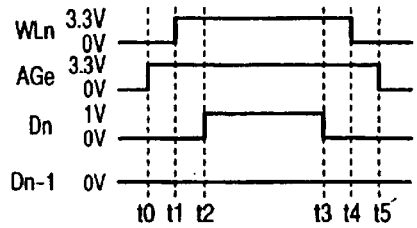
Figure 21E:
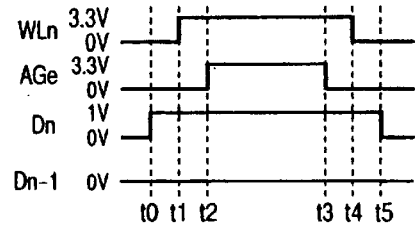

It is also possible to apply +3.3 V to the selected word line WLn at the timing t0 and +1 V to the diffusion layer Dn at the timing t1 (t0<t1) as shown in FIG. 21C. Next, +3.3 V is applied to the third gate AGe at the timing t2 (t1<t2). This voltage is kept for a predetermined read time t (t=t3−t2), and the voltage of the third gate AGe is returned to 0 V at the timing t3. The voltage of the diffusion layer Dn is returned to 0 V at the timing t4 (t3<t4), and the voltage of the selected word line WLn is returned to 0 v at the timing t4 (t3<t4). Alternatively, it is possible to apply +1 V to the diffusion layer Dn at the timing t0 and +3.3 V to the selected word line WLn at the timing t1 (t0<t1). Next, +3.3 V is applied to the third gate AGe at the timing t2 (t1<t2). This voltage is kept for a predetermined read time t (t=t3−t2) and the voltage of the third gate AGe is returned to 0 V at the timing t3. The voltage of the selected word line is returned to 0 V at the timing t4 (t3<t4), and the voltage of the diffusion layer is returned to 0 V at the timing t5 (t4<t5).

Figure 21F:
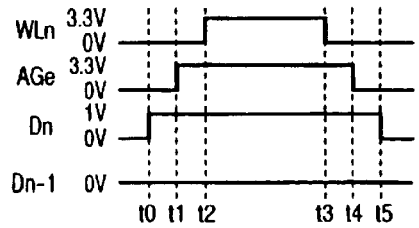
Figure 21G:
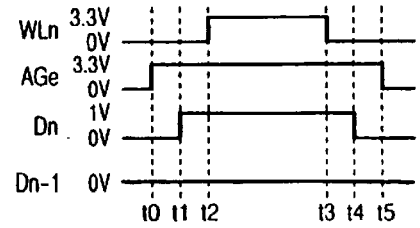

As shown in FIG. 21F, +1 V is applied to the diffusion layer Dn at the timing t0, and +3.3 V is applied to the third gate AGe at the timing t1 (t0<t1). Next, +3.3 V is applied to the selected word line WLn at the timing t2 (t1<t3). This voltage is kept for a predetermined read time t (t=t3 t2) and the voltage of the selected word line WLn is returned to 0 V at the timing t3. The voltage of the third gate AGe is returned to 0 V at the timing t4 (t3<t4). The voltage of the diffusion layer Dn is returned to 0 V at the timing t5 (t4<t5). Alternatively, it is possible to apply +3.3V to the third gate AGe at the timing t0 and +1 V to the diffusion layer Dn at the timing t1 (t0<t1). Next, +3.3 V is applied to the selected word line WLn at the timing t2 (t1<t2). After this voltage is kept for a predetermined read time t (t=t3−t2), the voltage of the selected word line WLn is returned at the timing t3 and the voltage of the diffusion layer Dn is returned to 0 V at the timing t4 (t3<t4). The voltage of the third gate AGe is returned to 0 V at the timing t5 (t4<t5). When programming is conducted at these timings, word disturb can be restricted because the word line voltage application time is short.

Incidentally, in the embodiment described above, the same voltage is applied to every other third gate in the programming and reading operations. Therefore, the layout of the voltage applied area of the third gate must be such that every other third gate (erase gate) 107a extending in the column direction above and below the array block can be bundled.

In addition to the effects brought forth by Embodiment 1, this embodiment can increase the program size and the programming rate. In other words, every other third gate 107a (AGe, AGo) is disposed and separate voltage can be applied to these third gates in this embodiment. Therefore, the number of times of operations necessary for the programming and reading operations can be reduced. Since the channel region is formed at a part below each third gate 107a, the third gate 107a can be used not only as the erase gate but also as the control gate for controlling the channel. Therefore, the third gate 107a can control the electric field inside the channel independently of the control gate 111a, and programming efficiency can be improved. As a result, an efficient and high-speed programming operation can be accomplished at a smaller channel current.

[Embodiment 3]

Figure 22:
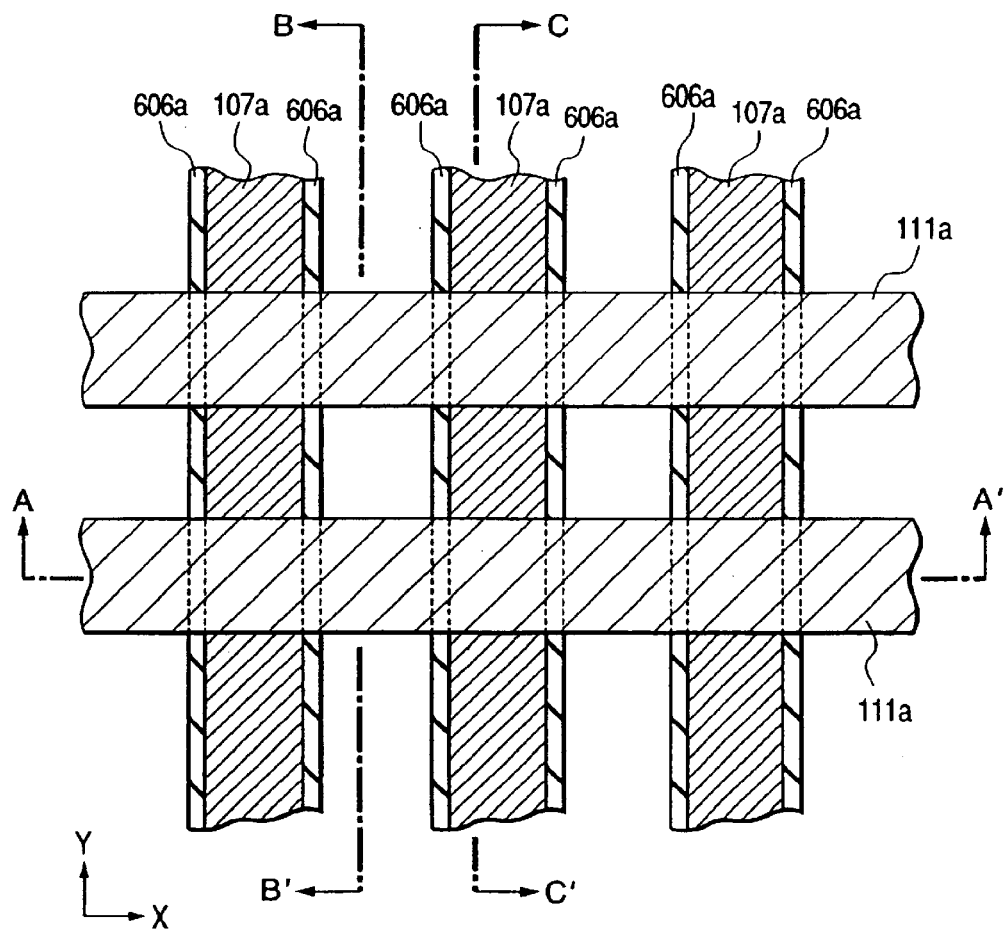
FIG. 22 is a partial plan view showing an example of the semiconductor integrated circuit device according to Embodiment 3 of the present invention.
Figure 23A:
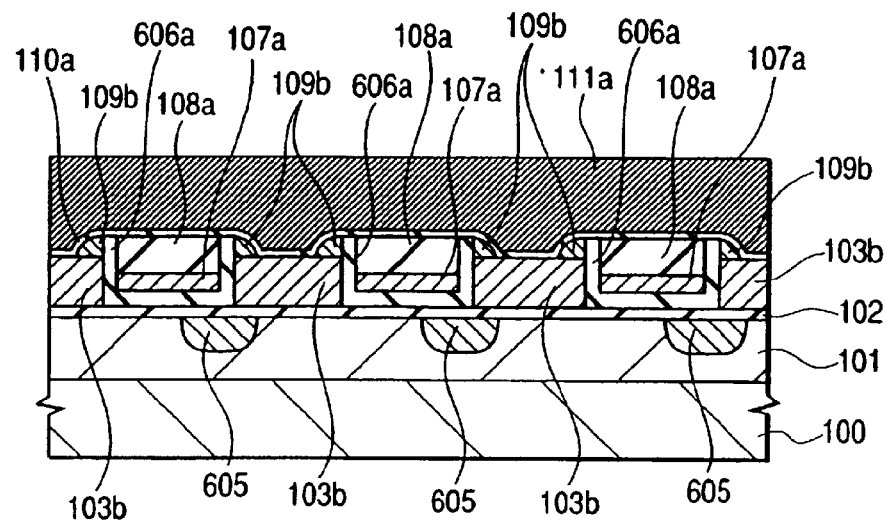
FIGS. 23A to 23C are sectional views taken along lines A–A', B–B' and C–C' in FIG. 22, respectively.
Figure 23B:
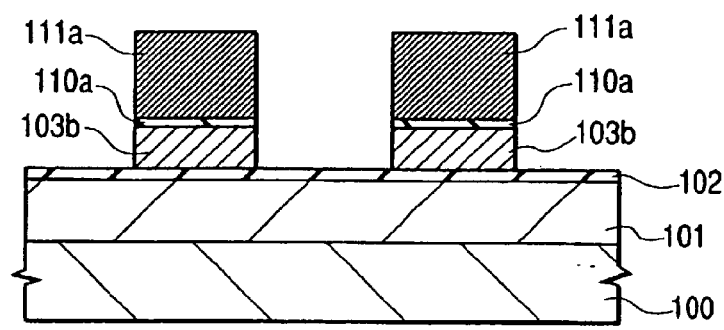
Figure 23C:
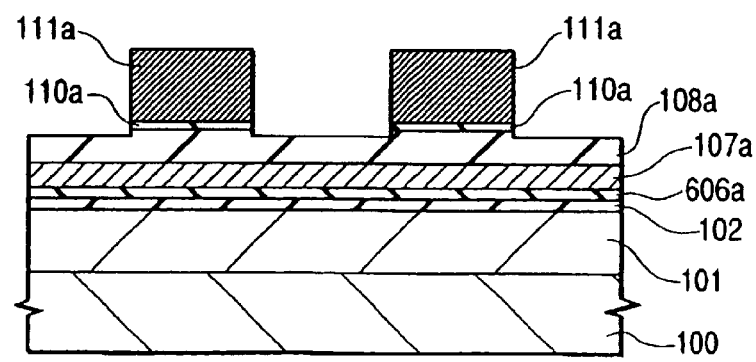

FIG. 22 is a partial plan view showing an example of the semiconductor integrated circuit device according to Embodiment 3 of the present invention, and FIGS. 23A, 23B and 23C are sectional views taken along lines A–A', B–B' and C–C' in FIG. 22, respectively. Incidentally, each member is shown hatched with some members being omitted for ease of illustration in the plan view of FIG. 22. FIGS. 23A, 23B and 23C are sectional views taken along lines A–A', B–B' and C–C' in FIG. 22, respectively.

The construction of the semiconductor integrated circuit device of this embodiment is substantially the same as that of Embodiment 2 with the exception that the film thickness of the insulator film 606a between the floating gate 103b and the third gate 107a is increased. The materials, constructions, arrangements, etc, of other members are substantially the same as those of Embodiment 2. Therefore, the explanation will be given on only the different portions and will be omitted on other members.

The film thickness of the insulator film 606a of this embodiment is increased to about 30 nm. As a result, electron ejection is made from the floating gate 103b to the substrate (well 101) in the erasing operation in this embodiment. Therefore, the film thickness of the insulator film 102 between the floating gate 103b and the substrate (well 101) is 10 nm. This point, too, is different from Embodiment 2.

Figure 24A:
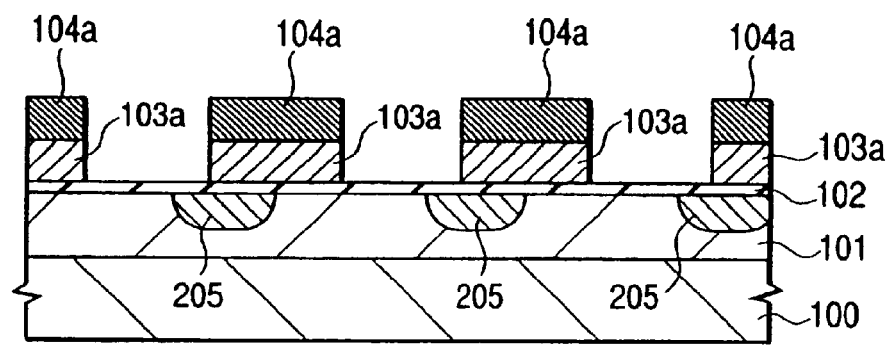
FIGS. 24A and 24B are sectional views showing stepwise a production method of the semiconductor integrated circuit device of Embodiment 3.
Figure 24B:
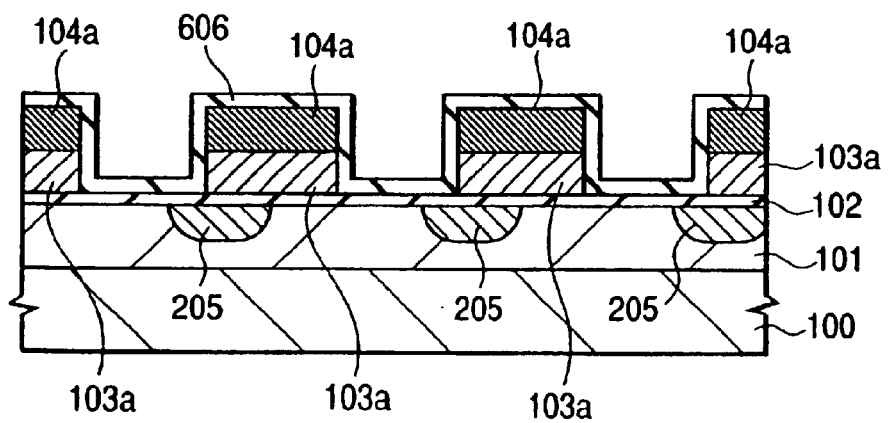

The production method of the semiconductor integrated circuit device of this embodiment is the same up to the process step shown in FIG. 17 in Embodiment 2 (FIG. 24A). However, the gate insulator film 102 cited in Embodiment 2 and shown in FIG. 3A of Embodiment 1 has a film thickness of about 10 nm, as described above. Thereafter, a nitrogen-doped silicon oxide film 606 is formed in the same way as in Embodiment 1 shown in FIG. 3E so as to isolate the floating gate and the third gate from each other. To eject the electrons built up in the floating gate to the semiconductor substrate, the film thickness of the silicon oxide film 606 is relatively large, that is, 30 nm. Since the N-doped silicon oxide film 606 is used in the same way as in Embodiment 2, ejection/trap of the electrons into this silicon oxide film during the programming operation can be restricted.

The process steps analogous to the steps shown in FIGS. 4A to 5E of Embodiment 1 are carried out in the same way as in Embodiment 2, and the memory cell can be thus completed. Incidentally, the silicon oxide film 606 is etched during the process steps described above and is converted to the silicon oxide film 606a.

Figure 25:
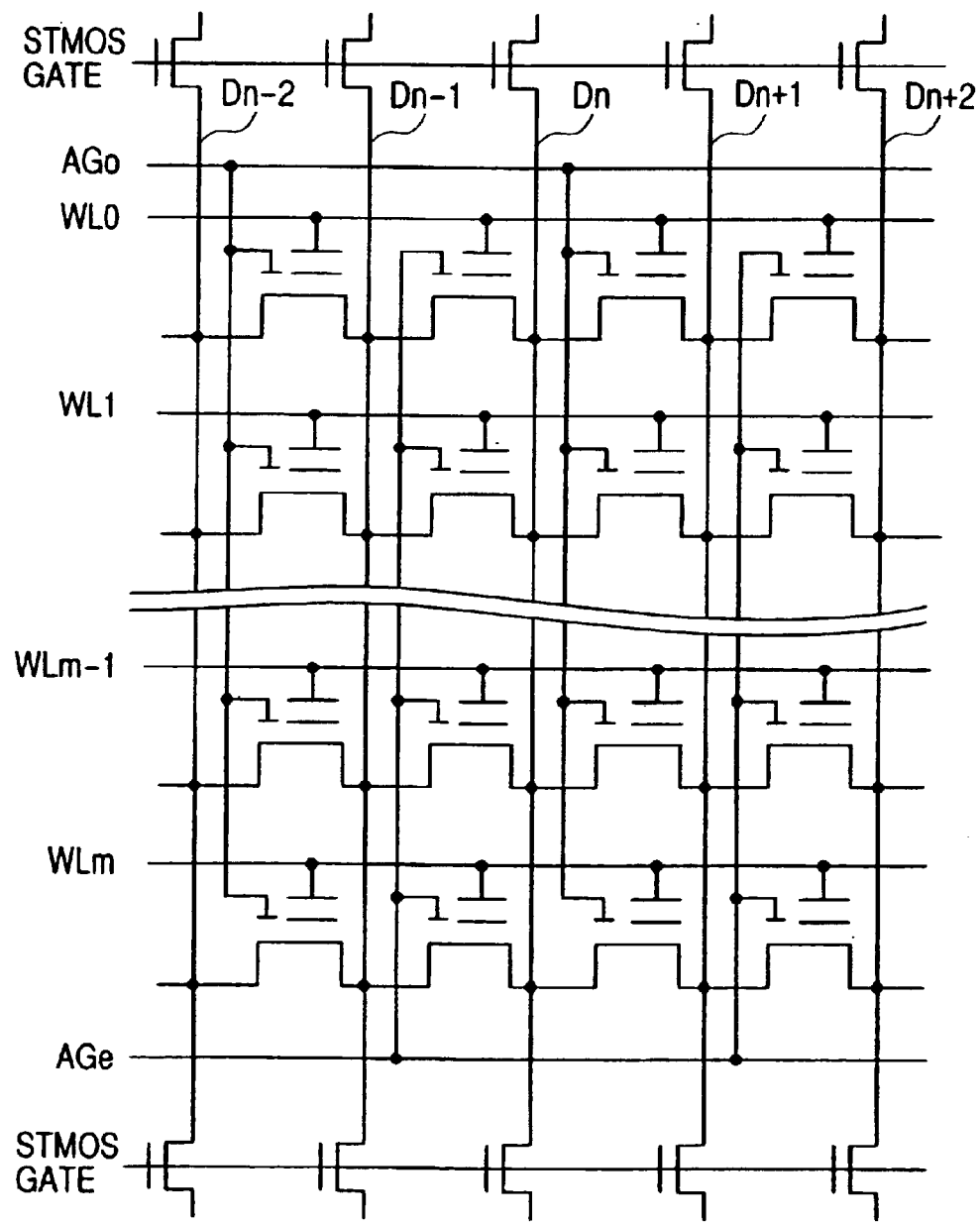
FIG. 25 shows the construction of a memory cell array of Embodiment 3.

FIG. 25 shows the construction of a memory cell array. The diffusion layers Dn (Dn−2 to Dn+2) to function as the sources/drains, the word lines WL (WL0 to WLm), the selected MOS transistors and the array block are the same as those of Embodiments 1 and 2. The third gate AG is the same as that of Embodiment 2.

Figure 26A:
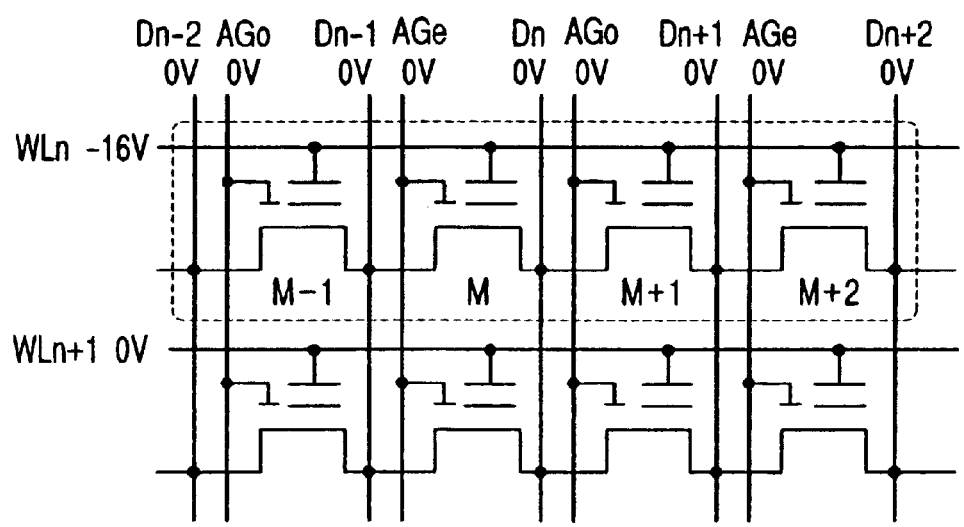
Figure 26B:
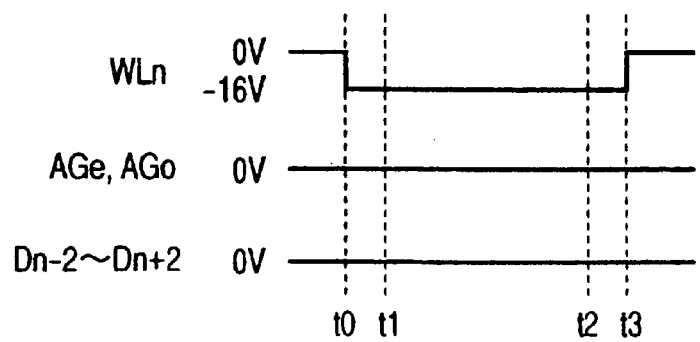

Next, the voltage application condition and the operation condition of the memory cell formed by the method described above in its programming operation, erasing operation and reading operation will be explained. FIG. 26 shows an example of the erasing operation. FIG. 26A shows an equivalent circuit and FIG. 26B show a timing chart. In FIG. 26A, the cell encompassed by dotted lines executes selectively the erasing operation. Incidentally, the explanation of the programming and reading operations will be omitted because they as the same as those of Embodiment 2.

In the erasing operation, a negative voltage of −16 V, for example, is applied to the selected word line Wn and all the third gates AGe, AGo, each diffusion layer D, the well and the unselected word line WLn+1 are kept at 0 V, as shown in FIG. 26A. In consequence, electron ejection occurs from the floating gate to the well due to the Fowler-Nordheim type tunneling phenomenon with the result that the threshold value of the memory cell drops and the erasing operation is conducted. In this way, the erasing operation is conducted for each sector having the word line as one unit.

Incidentally, in the erasing operation, it is also possible to apply a negative voltage of −16 V, for example, simultaneously to a plurality of word lines while all the third gates AG, each diffusion layer D and the well are kept at 0 V. In this case, the erasing operation is conducted in all the cells on the word line to which the negative voltage is applied.

It is also possible to apply, during the erasing operation, a positive voltage of 16 V, for example, to the well while all the third gates AG and each diffusion layer D are kept at 0 V. In this case, when the word line is set to 0 V and the unselected word line, to 16 V, the erasing operation is conducted in all the cells on one or a plurality of word lines.

It is further possible to apply, during the erasing operation, a negative voltage of −9 V, for example, to the word line WLn and a positive voltage of 4 V, for example, to each diffusion layer while all the third gates AG, the well and the unselected word line WLn+1 are kept at 0 V. In consequence, electron ejection occurs from the floating gate to the diffusion layer D in all the memory cells on the word line WLn due to the Fowler-Nordheim type tunneling phenomenon with the result that the threshold value of the memory cell drops and the erasing operation is conducted.

FIG. 26B is a timing chart showing an example of the voltage application timing to the selected word line WLn. Since the third gate AG does not function as the erase gate in this embodiment, the erasing operation is conducted by only the operation of the selected word line Wn. As shown in FIG. 26B, −16V is applied to the selected word line WLn at the timing t0 and the voltage of the selected word line WLn is then returned to 0 V at the timing t3 (t0<t3).

This embodiment provides the effects similar to those of Embodiments 1 and 2.

[Embodiment 4]

FIG. 27 is a partial sectional view showing an example of the production method of the semiconductor integrated circuit device according to Embodiment 4 of the present invention. The construction of the semiconductor integrated circuit device of this embodiment, the voltage application method of the third gate, the array construction and the operation method are the same as those of Embodiment 2, and their explanation will be hereby omitted. On the other hand, the production method of this embodiment is different from that of Embodiment 2.

This difference will be explained step-wise with reference to FIG. 27.

Figure 27A:
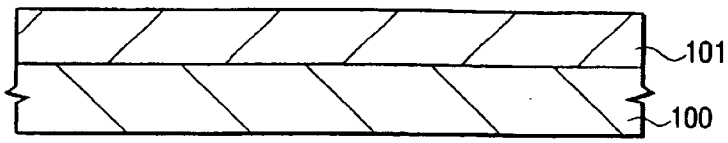
FIGS. 27A to 27E are sectional views showing step-wise a production method of the semiconductor integrated circuit device of Embodiment 4.

First, a p type well 101 is formed on a semiconductor substrate 100 (FIG. 27A).

An impurity diffusion method, an ion implantation method, and so forth, can be used for forming the well 101.

Figure 27B:
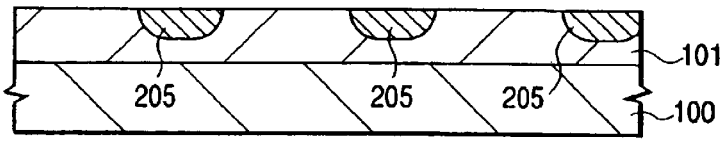

Next, a photoresist film (not shown), for example, is patterned over the semiconductor substrate 100, and arsenic (As) is implanted with this photo resist film as a mask. The arsenic (As) ions are implanted substantially vertically to the semiconductor substrate 100. A diffusion layer 205 to function as a source/drain of a memory cell is thus formed (FIG. 27B).

Figure 27C:
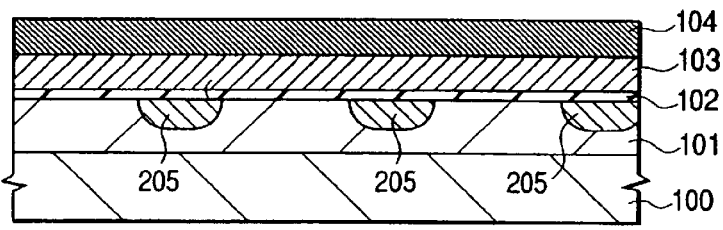

A gate insulator film 102 is then formed to a thickness of about 12 nm by thermal oxidation, for example, in the same way as in Embodiment 1. Next, a P-doped polysilicon film 103 and a silicon nitride film 104 as a first gate are deposited serially (FIG. 27C).

Figure 27D:
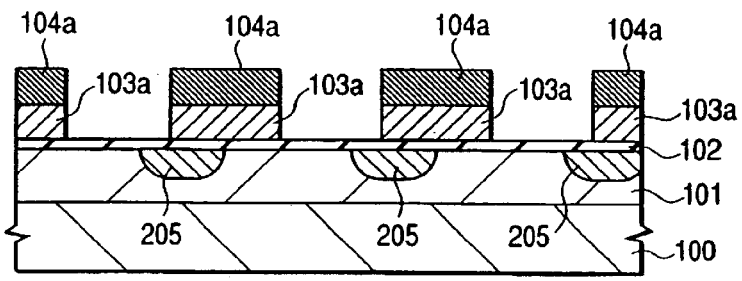

The silicon nitride film 104 and the polysilicon film 103 are then patterned by lithography and dry etching technologies, for example, in the same way as in Embodiment 1 (whereby the silicon nitride film and the polysilicon film are converted to 104a and 103a, respectively) (FIG. 27D). This patterning is conducted with mask registration so that one of the end faces of the polysilicon film 103a comes near to the center of the diffusion layer 205. In other words, the diffusion layer 205 is so disposed as to bridge both polysilicon film 103a and a third gate that is to be later formed.

Figure 27E:
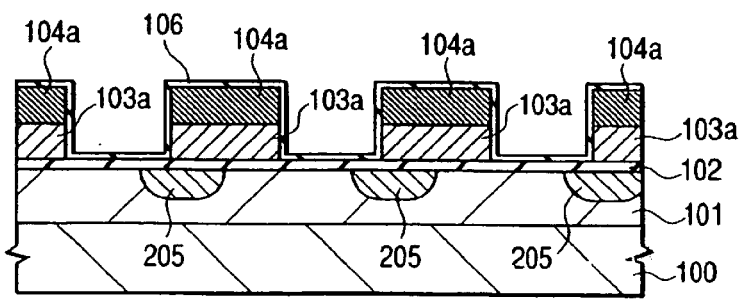

Next, an N-doped silicon oxide film is formed to thickness of 10.5 nm so as to isolate a floating gate and a third gate from each other, by the method similar to the one shown in FIG. 3E of Embodiment 1 (FIG. 27E).

Subsequent process steps are the same as those of Embodiment 1 shown in FIGS. 3E to 5E, in the same way as in Embodiment 2. Therefore, the explanation will be omitted.

According to this embodiment, the gate insulator film 102 is formed after the diffusion layer 205 is formed. Therefore, this embodiment can improve reliability of the gate insulator film 102 and the yield of the semiconductor integrated circuit device. Furthermore, this embodiment can reduce the internal operating voltage, and can increase the programming speed.

Incidentally, the erasing operation may be conducted by applying a relatively high voltage such as −17 V to the word line WLn while all the third gates AG, each diffusion layer D, the well and the unselected word line WLn+1 are kept at 0 V. Electron ejection thus occurs from the floating gate to the well in all the memory cells on the word line WLn due to the Fowler-Nordheim type tunneling phenomenon with the result that the threshold value of the memory cells drops and the erasing operation is conducted.

[Embodiment 5]

Figure 28:
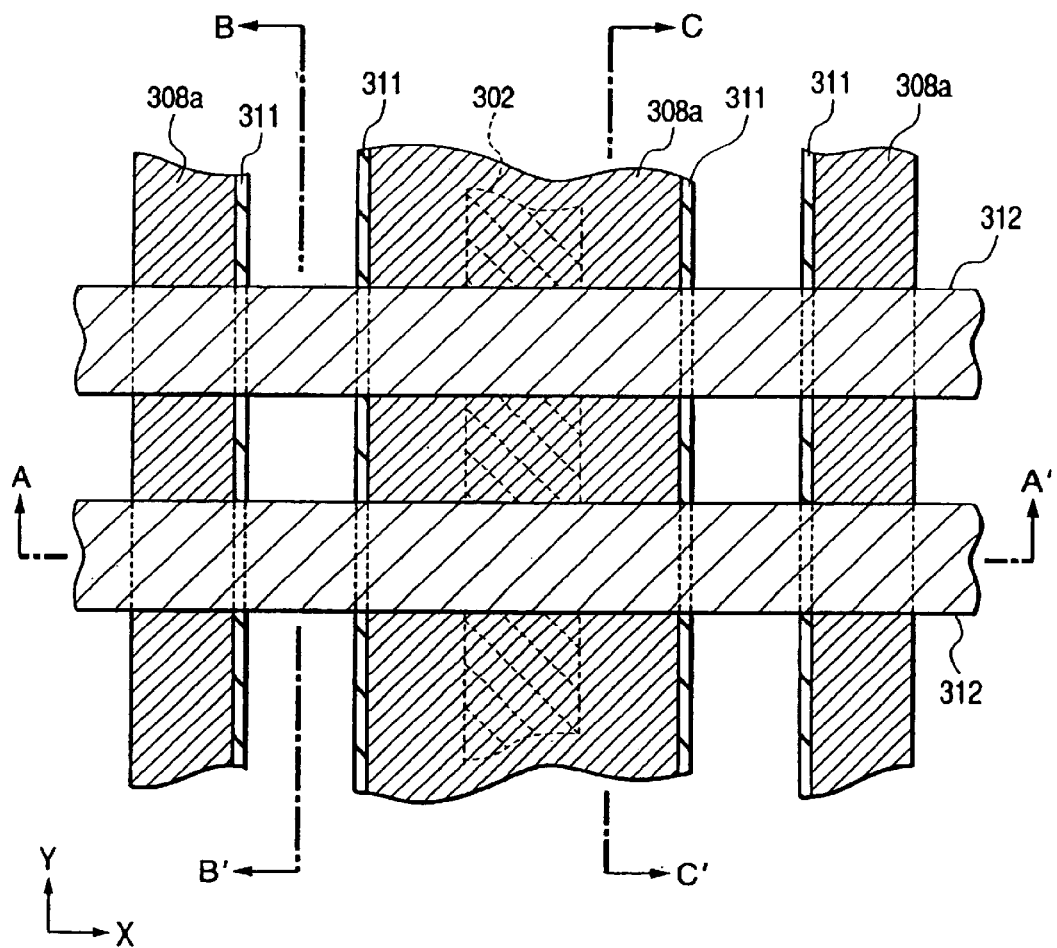
FIG. 28 is a partial plan view showing an example of the semiconductor integrated circuit device according to Embodiment 5 of the present invention.
Figure 29A:
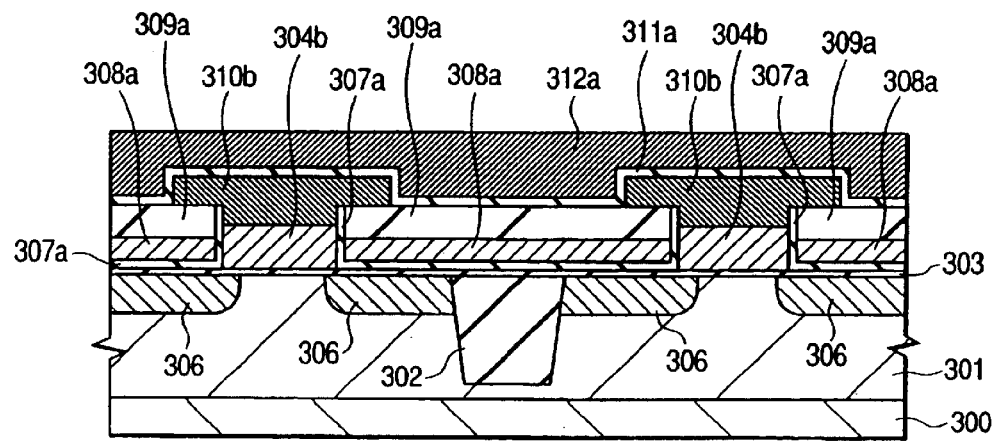
FIGS. 29A to 29C are sectional views taken along lines A–A', B–B' and C–C' in FIG. 28, respectively.
Figure 29B:
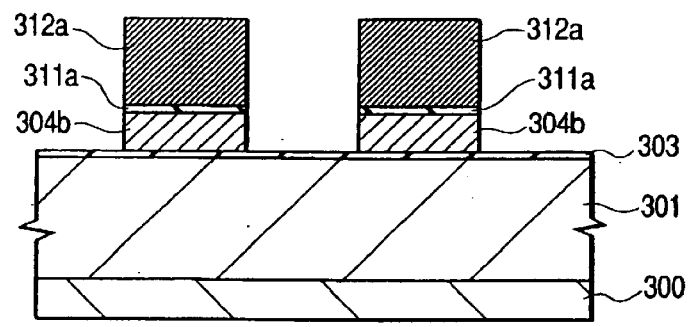
Figure 29C:
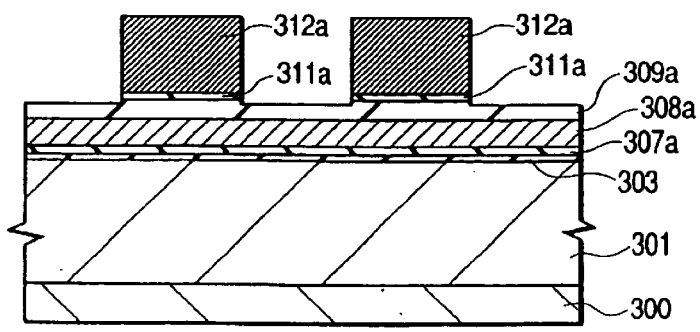

FIG. 28 is a partial plan view showing an example of the semiconductor integrated circuit device according to Embodiment 5 of the present invention, and FIGS. 29A, 29B and 29C are sectional views taken along lines A–A', B–B' and C–C' in FIG. 28, respectively. In the plan view of FIG. 28, each member is shown hatched with part of members being omitted for ease of illustration.

As shown in FIGS. 28 and 29, the memory cell of this embodiment includes the source/drain diffusion layer 306 inside the well 101, the first gates 304b and 310b (floating gate), the second gate 312a (control gate) and the third gate 308a. The control gate 312a of each memory cell is connected in the row direction (x direction) and forms the word line. The floating gate 304b and the well 301 are insolated from each other by the gate insulator film 303. The floating gates 304b and 310b and the third gate 308a are isolated from one another by the insulator film 307. The floating gate 404b and the word line (control gate) 312a are isolated from each other by the insulator film 311a. The third gate 308a and the word line 312a are isolated from each other by the insulator film 309a.

The source/drain diffusion layer 306 is disposed vertically to the word line 312a and exists as the local source line and the local data line that connect the source/drain of the memory cell in the column direction (y direction).

In other words, the semiconductor integrated circuit device of this embodiment comprises a so-called "contactless type" array that does not have a contact hole disposed for each memory cell. The channel is formed in the direction vertical to the diffusion layer 306 (x direction).

Two end faces of the third gate 308a oppose two end faces existing in the vertical direction to the word line 312a and to the channel, respectively, among the end faces of the floating gate 304b, through the insulator films, respectively.

The third gate 308a is formed and buried into the gap of the floating gates 304b existing in the direction vertical to the word line 312a and to the channel (y direction). The floating gate exists symmetrically with the third gate 308a, and the third gate 308a exists symmetrically with the floating gate 304b.

Unlike Embodiments 1 and 2, the diffusion layer 306 of the memory cells adjacent in the word line direction in this embodiment are separated by a device isolation region 302 comprising a silicon oxide film. The third gate is disposed in such a fashion that its entire surface overlaps with the device isolation region 302 and with the diffusion layer 306.

Next, the production method of the memory cell of this embodiment will be explained with reference to FIGS. 30 to 33.

Figure 30A:
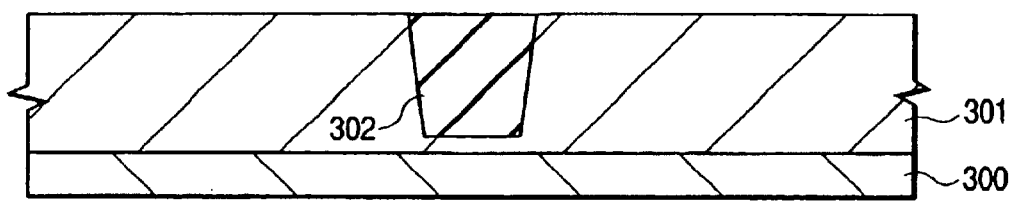
FIGS. 30A to 30C are sectional views showing an example of the production method of the semiconductor integrated circuit device of Embodiment 5.

After a p type well 301 is first formed on a semiconductor substrate 300, grooves are formed by photolithography and etching technology. A silicon oxide film, for example, is deposited by CVD to bury the grooves. The silicon oxide film on the semiconductor substrate 300 is removed by CMP, for example, and a device isolation region 302 comprising a silicon oxide film is formed (FIG. 30A).

Figure 30B:
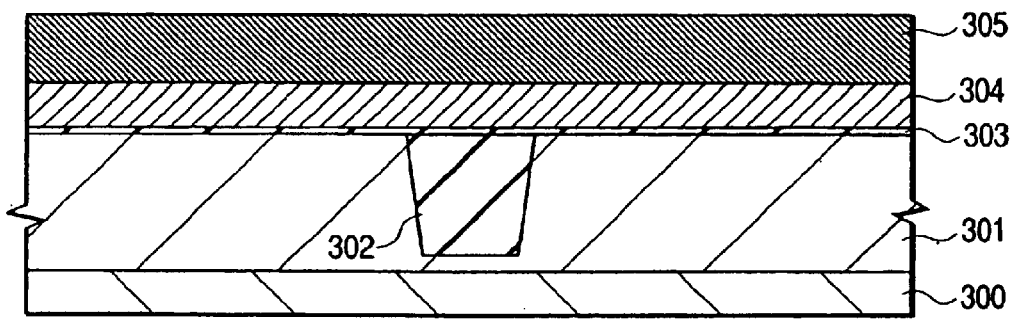

Next, a gate insulator film 303 is formed by thermal oxidation in the same way as in Embodiment 1, and a P-doped polysilicon film 304 to function as a floating gate and a silicon nitride film 305 are serially deposited (FIG. 30B).

Figure 30C:
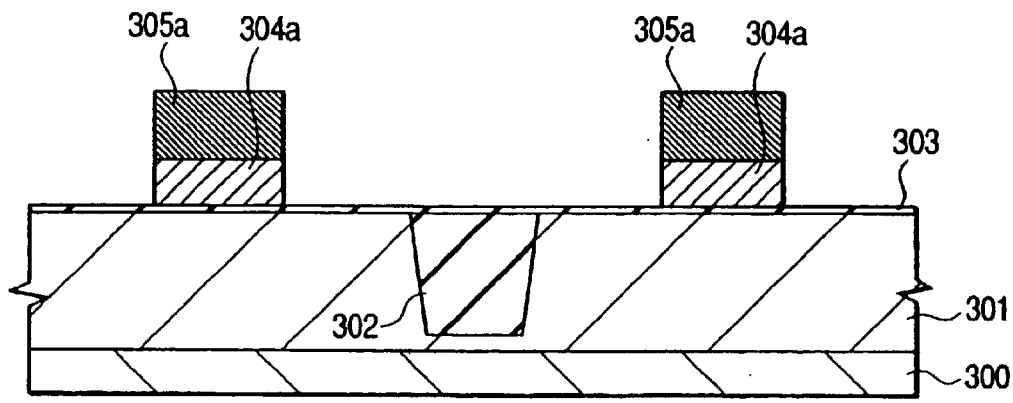

The silicon nitride film 305 and the polysilicon film 304 are then patterned in the same way as in Embodiment 1 (whereby the silicon nitride film and the polysilicon film are converted to 305a and 304a, respectively) (FIG. 30C).

Figure 31A:
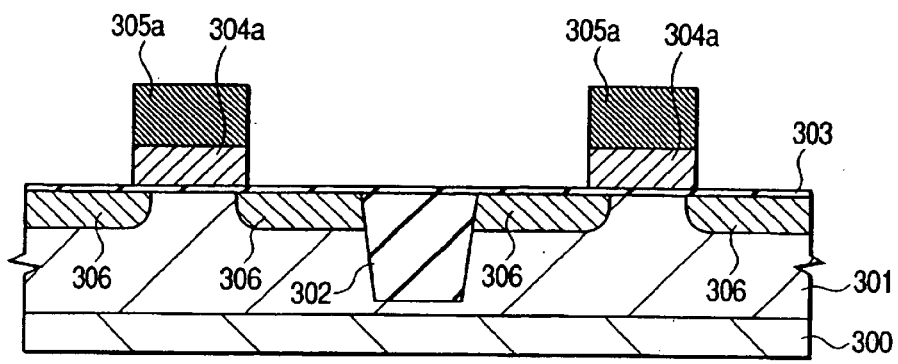
FIGS. 31A to 31C are sectional views showing an example of the production method of the semiconductor integrated circuit device of Embodiment 5.
Figure 31B:
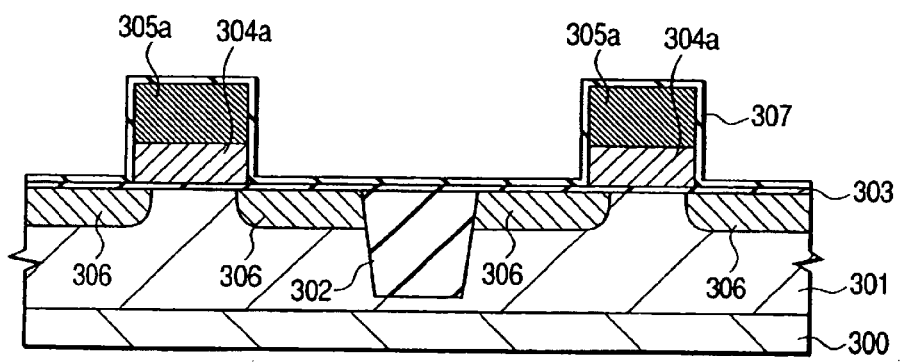

Arsenic ions are then implanted by using the ion implantation process. A diffusion layer 305 to function as the source/drain of a memory cell is formed (FIG. 31A).

Figure 31C:
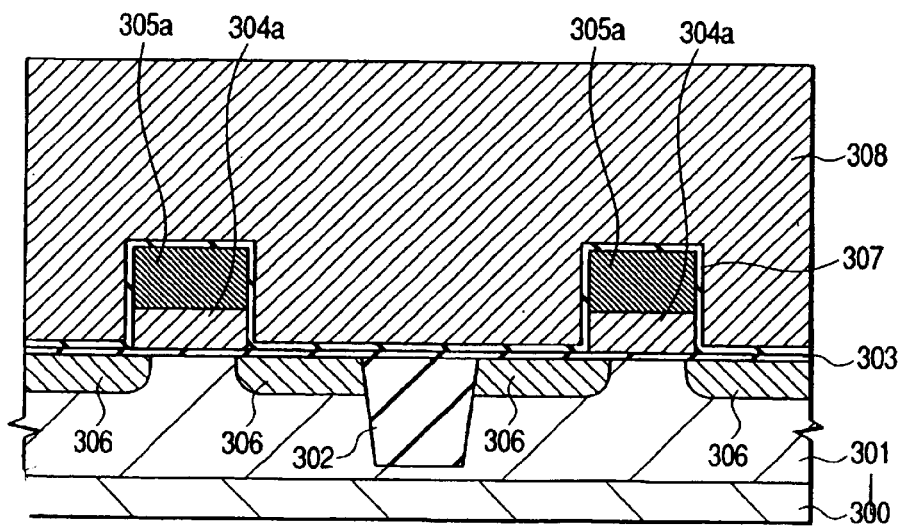

An insulator film 307 for isolating the floating gate from a third gate is formed in the same way as the step of Embodiment 1 shown in FIG. 3E (FIG. 31B), and a P-doped polysilicon film 308 to function as the third gate is deposited in such a fashion as to completely bury the gap between the floating gate patterns 304a (FIG. 31C).

Figure 32A:
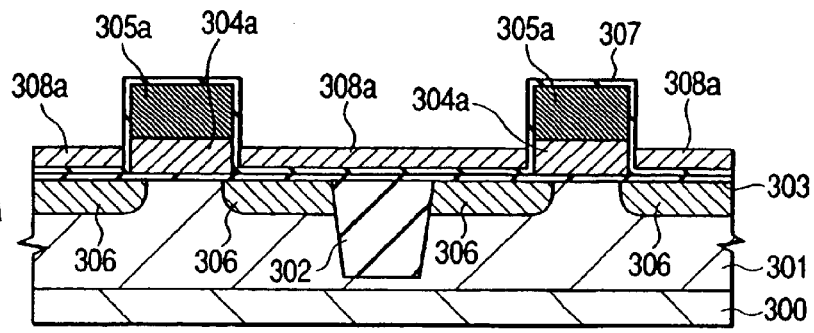
FIGS. 32A to 32D are sectional views showing an example of the production method of the semiconductor integrated circuit device of Embodiment 5.
Figure 32B:
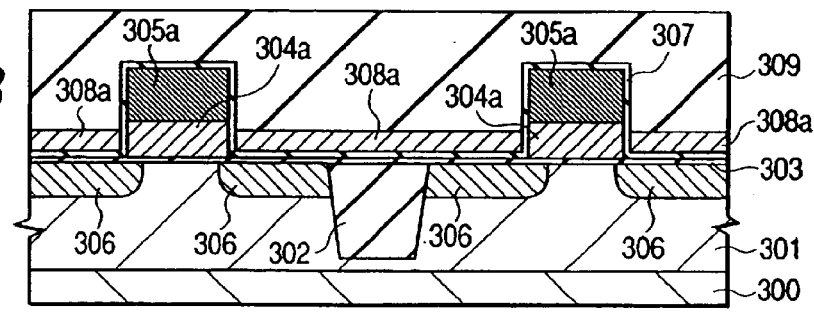
Figure 32C:
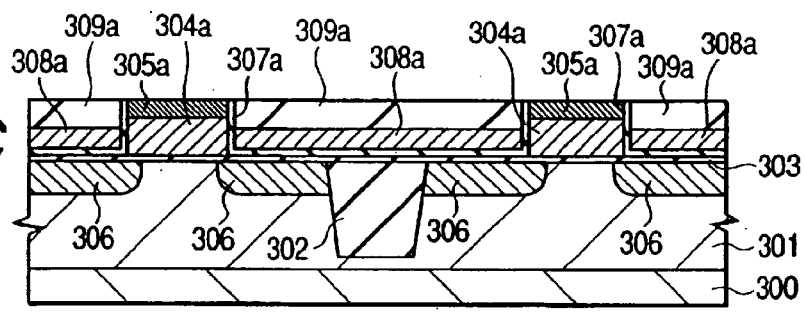
Figure 32D:
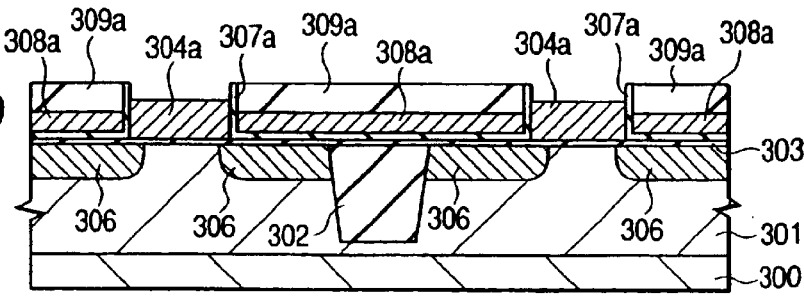

Furthermore, the polysilicon film 308 is etched back in the same way as in Embodiment 1 to form a polysilicon film 308a that is left to a predetermined thickness in the gap between the floating gate patterns 304a (FIG. 32A). Here, the film thickness of the polysilicon film 308a is smaller than that of the floating gate polysilicon 304a and the internal operating voltage can be lowered in the programming operation, in the same way as in Embodiment 1. Thereafter, a silicon oxide film 309 is deposited in such a fashion as to completely bury the gap of the floating gate patterns 304a in the same way as in Embodiment 1 (FIG. 32B) and is etched by a chemical mechanical polishing method (CMP method) until the silicon nitride film 305a is exposed (whereby the silicon nitride film 305a and the silicon oxide film 309 are converted to 305b and 309a, respectively) (FIG. 32C). The silicon nitride film 305b is removed using a hot phosphoric acid aqueous solution and the surface of polysilicon 304a is exposed (FIG. 32D).

Figure 33A:
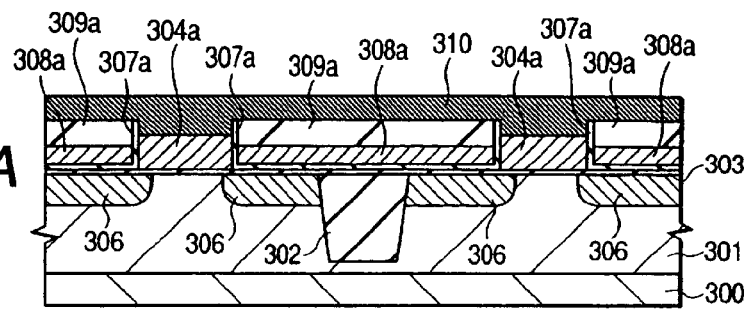
FIGS. 33A to 33D are sectional views showing an example of the production method of the semiconductor integrated circuit device of Embodiment 5.
Figure 33B:
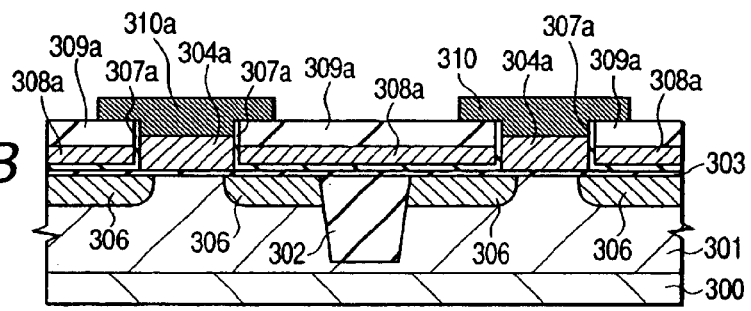
Figure 33C:
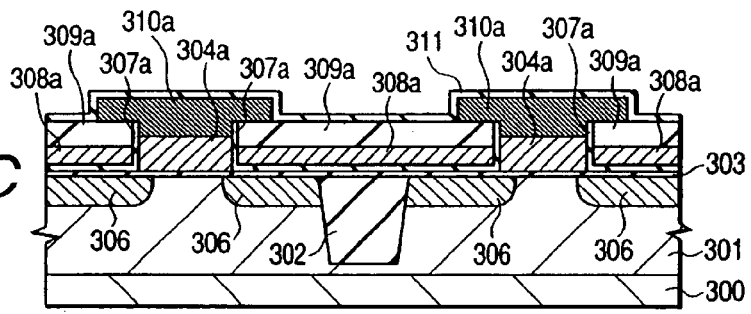

A P-doped polysilicon film 310 is deposited in the same way as in Embodiment 1 (FIG. 33A) and is then patterned to form a polysilicon film 310a (FIG. 33B). This polysilicon film 310a is electrically connected to polysilicon 304a, and these two layers of polysilicon form the floating gate. Polysilicon 310a provides the effects of increasing the surface area of the floating gate and the coupling ratio of the memory cell. In this way, the internal operating voltage can be lowered in the programming/erasing operation.

Figure 33D:
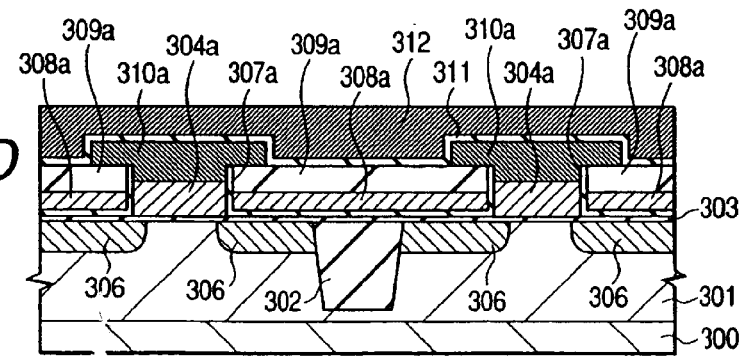

Next, an N-doped silicon oxide film 311 is formed for isolating the floating gate from the word line in the same way as in the step of Embodiment 1 shown in FIG. 3E (FIG. 32C). A laminate film of a polysilicon film, tungsten nitride film and a tungsten film, or a so-called "polymetal film" 312, is deposited (FIG. 33D). The polymetal film 312 is patterned by the lithography and dry etching technologies in the same way as in Embodiment 1 and a word line is formed (whereby the polymetal film 312 is converted to 312a). Next, the silicon oxide film 311 and the polysilicon films 310a and 304a are etched to complete the floating gate (whereby the polysilicon films 304a and 310a are converted to 304b and 310b, respectively). After an intermetal insulating film, not shown, is formed, contact holes reaching the word line 312a, the source/drain diffusion layer 306, the well 301 and the third gate 308a are formed. A metal film is subsequently deposited, and is patterned to form a wire. In this way, the memory cell is completed.

Figure 34:
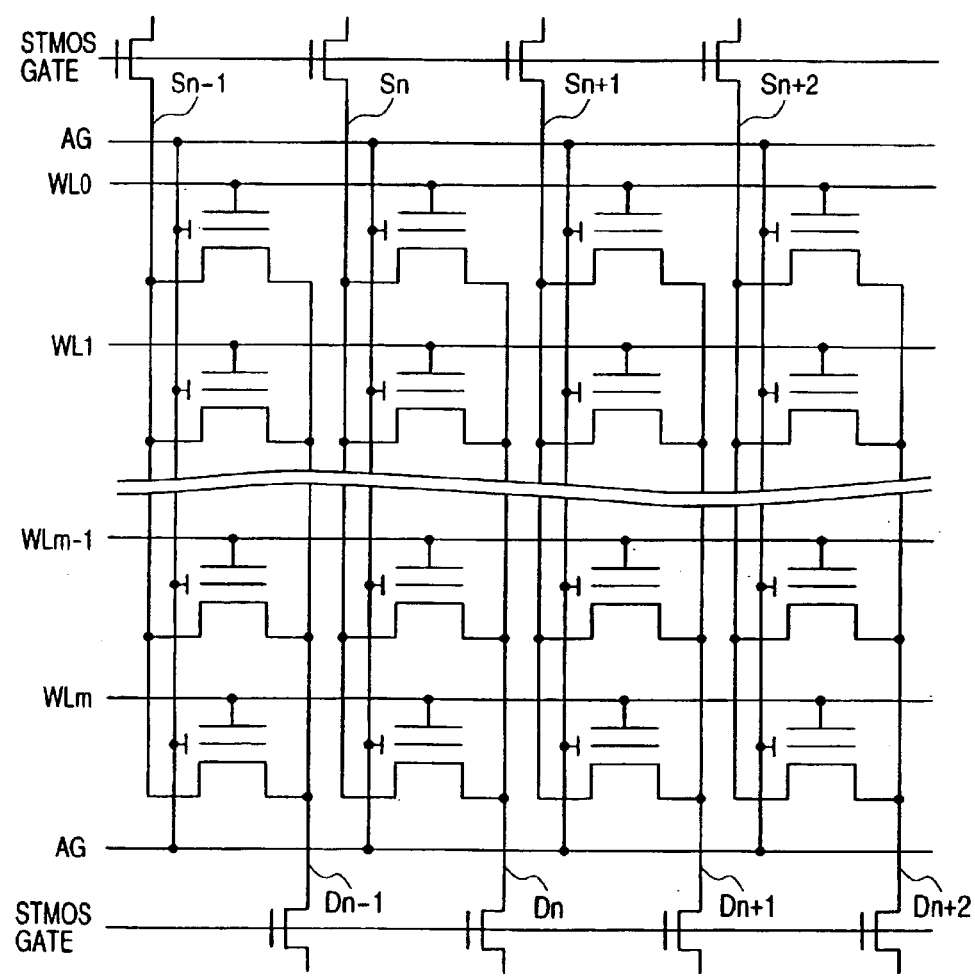
FIG. 34 is a view showing the construction of a memory cell array of Embodiment 5.

FIG. 34 shows the construction of the memory cell array. The diffusion layers to function as the source/drain extend in the direction (y direction) vertical to the extending direction (x direction) of the word line, and play the role of connecting the memory cells adjacent to one another in the x direction. Unlike Embodiments 1 through 4, the device isolation region is formed between the cells adjacent in the x direction in this embodiment. Therefore, the diffusion layer is not shared between the cells adjacent in the y direction, and the functions of the source line and the data line are fixed to the diffusion layer Sn (source line) and the diffusion layer Dn (data line), respectively. In other words, this memory cell is not of the virtual ground type.

Select transistors for selecting the source line and the data line are disposed at both ends of the diffusion layer wires Sn and Dn in the y direction. The select MOS for selecting the source line is disposed at the upper part in the drawing and the select MOS for selecting the data line, at the lower part. In this way, the select MOS are not formed at both upper and lower ends of the diffusion layer, but every other select MOS are formed alternately at the upper and lower parts in each diffusion layer. Therefore, the area for forming the select MOS can be mitigated. The region encompassed by the select MOS is called the "array block". The third gates (assist gate) AG extend in the y direction, and are bundled into one at the upper and lower ends (both ends in the y direction) of the array block.

Figure 35A:
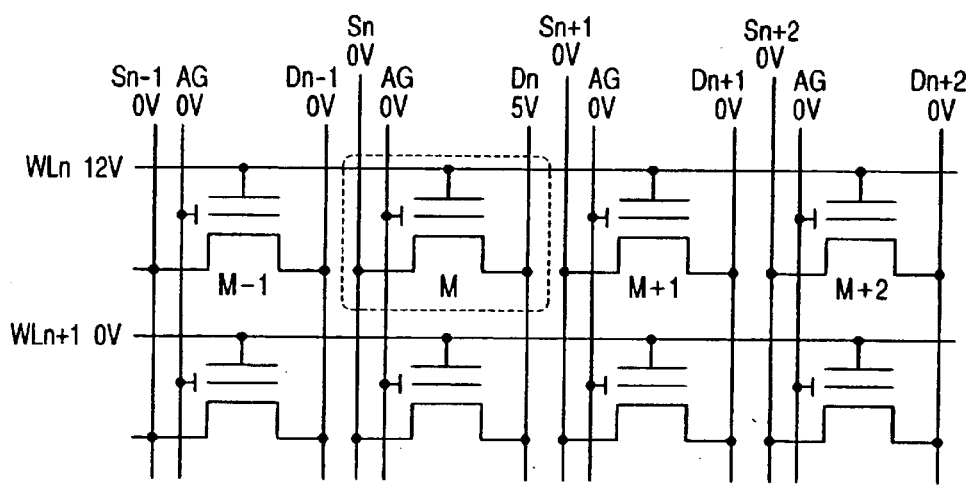

Next, the voltage application condition and the operation method of the memory cell formed by the method described above in its programming, erasing and reading operations will be explained with reference to FIGS. 35 to 37. FIG. 35 shows the programming operation. FIG. 36 shows the erasing operation and FIG. 37 shows the reading operation. In each of these drawings, A shows an equivalent circuit and B and C show timing charts. In FIGS. 35A to 37A, each of the operations is conducted selectively in the cell encompassed by dotted lines.

In the programming operation, a positive voltage of about 12 V, for example, is applied to the word line WLn of the selected cell M and a positive voltage of about 5 V is applied to the diffusion layer Dn to function as the drain of the selected cell M. The diffusion layer Dn to function as the source of the selected cell M is kept at the voltage of 0 V. As the source/drain and the word lines are kept at the predetermined voltages described above, the hot electrons develop in the channel region of the memory cell M and are injected into the floating gate. The sources/drains of the unselected cells (diffusion layers Dn−1, Dn+1, Dn+2, Sn−1, Sn+1, Sn+2), all the third gates, the well and the unselected word line WLn+1 are kept at 0 V. Consequently, hot electron injection occurs in only the selected memory cell M, the electrons are built up in the floating gate, the threshold value of the memory cell rises and programming is conducted. In the semiconductor integrated circuit device of this embodiment, the device isolation region 302 exists between the memory cells adjacent to each other in the word line direction (x direction). Therefore, the adjacent memory cells do not share the diffusion layer, and programming can be made simultaneously to the memory cells adjacent to each other in the word line direction.

Figure 35B:
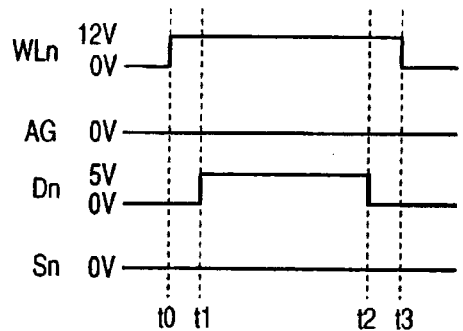
Figure 35C:
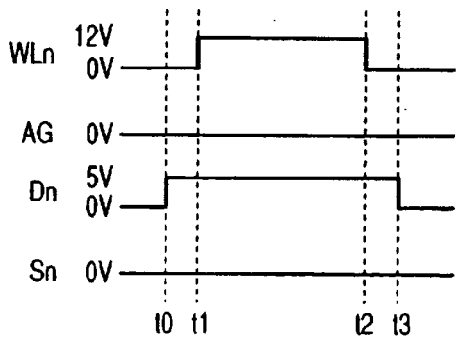
Figure 36A:
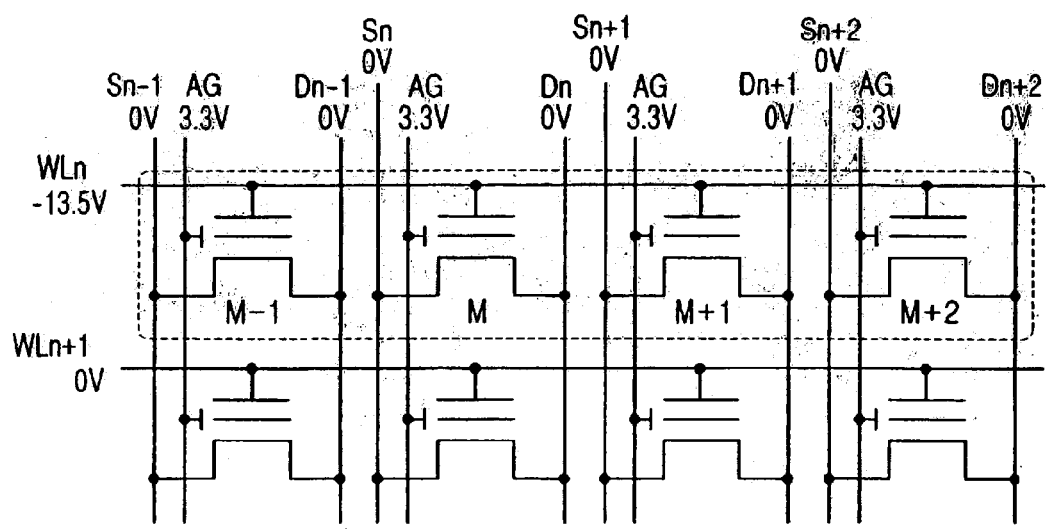

FIGS. 35B and 35C are examples of timing charts showing the voltage application timings to the selected word line WLn and to the drain diffusion layer Dn. There are two examples as shown as shown in these drawings. The timings shown in FIGS. 35B and 35C are substantially the same as the timings of Embodiment 1 shown in FIGS. 13B and 13C. However, the voltage application timing to the drain diffusion layer Dn in this embodiment is the substitution of the timing to the diffusion layers Dn and Dn+1 shown in FIGS. 13B and 13C. Therefore, the explanation of the application timing and the effect is the same as that of Embodiment 1 and is therefore omitted.

In the erasing operation, a negative voltage of −13.5 V, for example, is applied to the selected word line WLn and a relatively small positive voltage of 3.3 V, for example, is applied to all the third gates AG. Each diffusion layer (Dn−1 to Dn+2, Sn−1 to Sn+2), the well and the unselected word line WLn+1 are kept at 0 V. Consequently, electron ejection from the floating gate to the third gate occurs in all the memory cells on the word line WLn due to the Fowler-Nordheim type tunneling phenomenon with the result that the threshold value of the memory cells drops and the erasing operation is conducted.

Figure 36B:
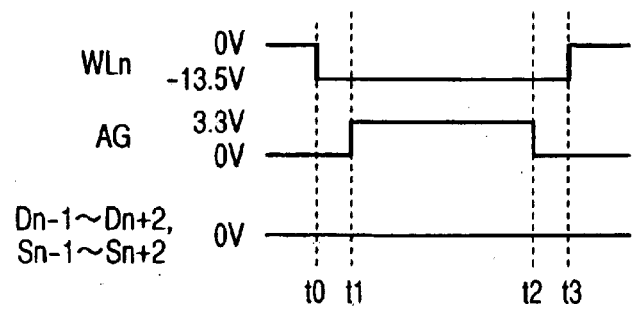
Figure 37A:
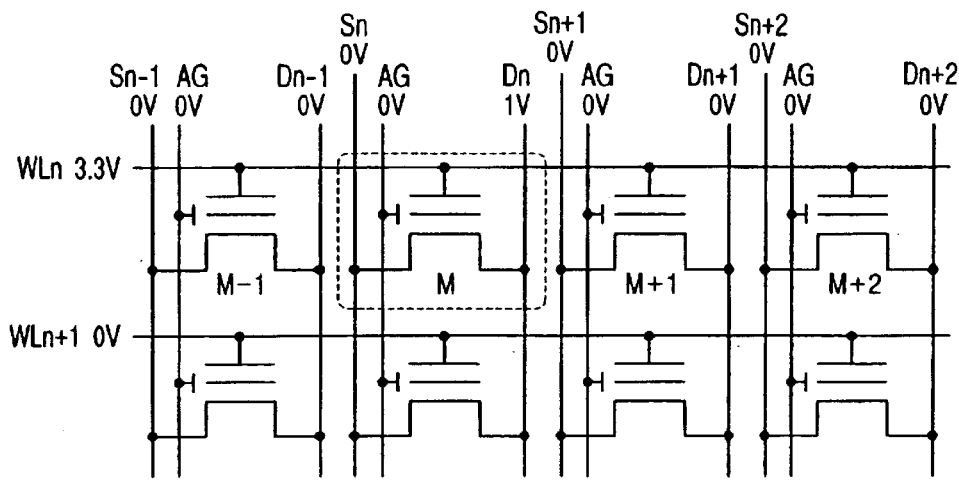

FIG. 36B is a timing chart showing an example of the voltage application timing to the selected word line WLn and the third gate AG. The application timing is the same as that of Embodiment 1 shown in FIG. 14B, and the explanation will be therefore omitted.

In the erasing operation, a negative voltage such as −13.5 V is applied simultaneously to a plurality of word lines, and a relatively small positive voltage such as 3.3 V is applied to all the third gates AG while each diffusion layer D, S and the well are kept at 0 V. In this case, the erasing operation is conducted in the cells on the word line to which the negative voltage is applied.

It is also possible to apply a relatively large voltage such as 17 V to all the third gates AG and to keep all the word lines, each diffusion layer D and the well at 0 V. In this case, the erasing operation is conducted in all the memory cells inside the block.

To conduct the read operation, a positive voltage of about 3.3 V, for example, is applied to the word line WLn of the selected cell M and a positive voltage of about 1 V, for example, is applied to the diffusion layer Dn to function as the drain of the selected cell M while the diffusion layer Sn to function as the source of the selected cell M is kept at 0 V. On the other hand, the sources/drains (diffusion layers Dn−1, Dn+1, Dn+2, Sn−1, Sn+1, Sn+2), all the third gates AG, the well and the unselected word line WLn+1 are kept at 0 V. Since the voltage is kept in this way, ON/OFF of the channel can be detected depending on the existence/absence of the electrons inside the floating gate, and the information can be read out.

Figure 37B:
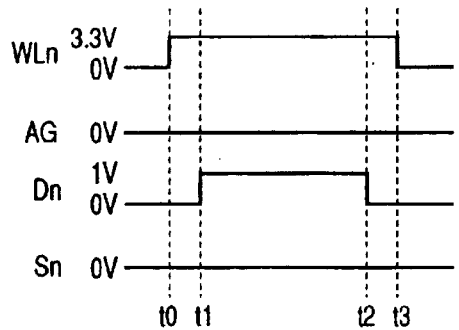
Figure 37C:
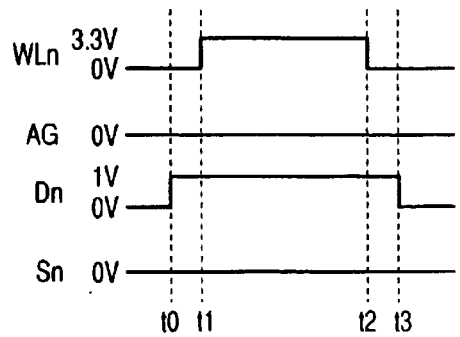

FIGS. 37B and 37C are timing charts showing examples of the voltage application timings of the selected word line WLn and the diffusion layer Dn. There are two examples as shown in FIGS. 37B and 37C. The timings shown in these drawings are substantially the same as the timings of Embodiment 1 shown in FIGS. 15B and 15C.

However, the voltage application timing to the drain diffusion layer Dn in this embodiment is the substitution of the application timing to the diffusion layers Dn and Dn+1 in FIGS. 15B and 15C. Therefore, the explanation of the application timing and the effect is the same as that of Embodiment 1 and is hereby omitted.

According to this embodiment, the memory cell produced by the method described above uses the polymetal structure for the word line, and can therefore reduce the transition delay time of the word line during the programming and reading operations. Since the word line having the polymetal structure is formed after the third gate is formed, the defect density of the silicon oxide film between the floating gate and the third gate can be reduced. It is also possible to reduce the maximum value of the absolute value of the internal operating voltage at the time of programming/erasing to 13.5 V.

Since this embodiment includes the polysilicon 310b at a part of the floating gate, the opposed area between the floating gate and the control gate increases, hence coupling between both electrodes increases, too. In consequence, the margin of the erase voltage increases and the margin for reducing the erase voltage increases, too.

[Embodiment 6]

Figure 38:
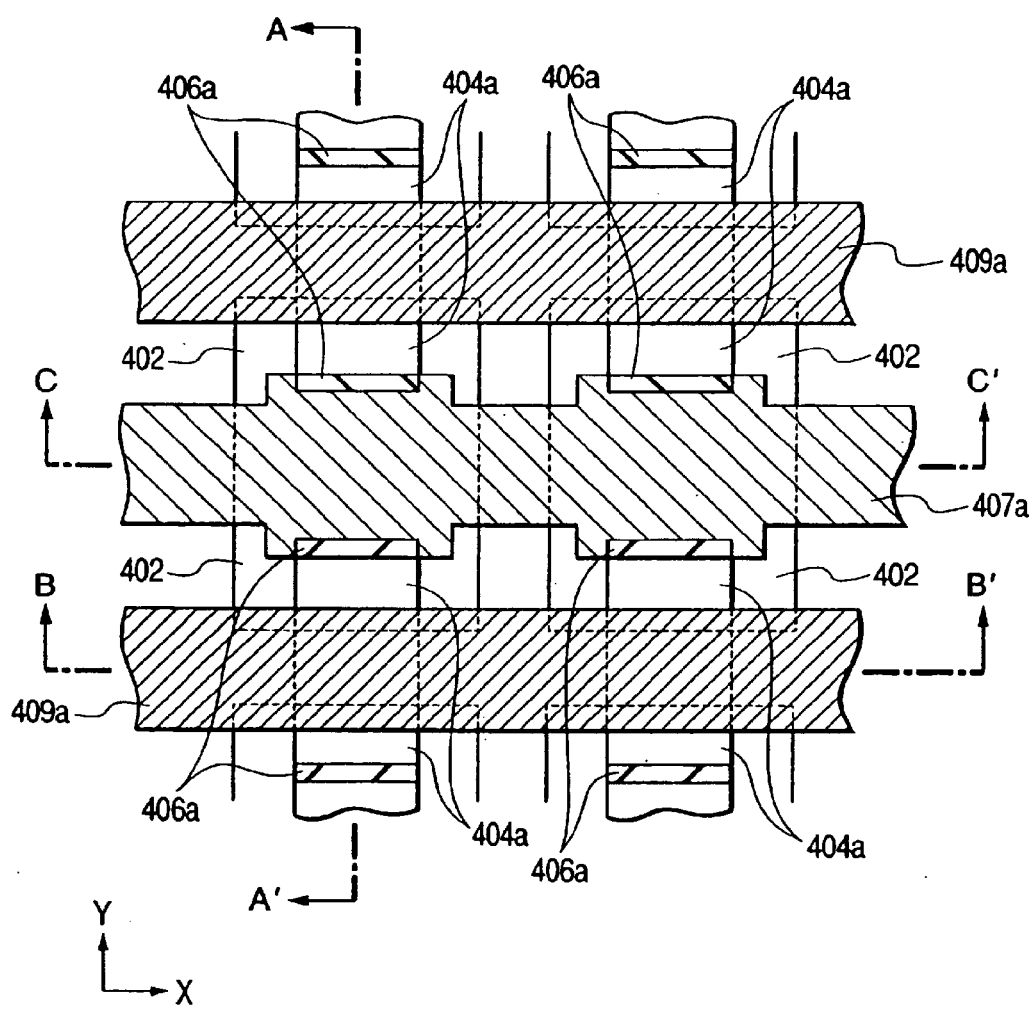
FIG. 38 is a partial plan view showing an example of the semiconductor integrated circuit device according to Embodiment 6 of the present invention.
Figure 39A:
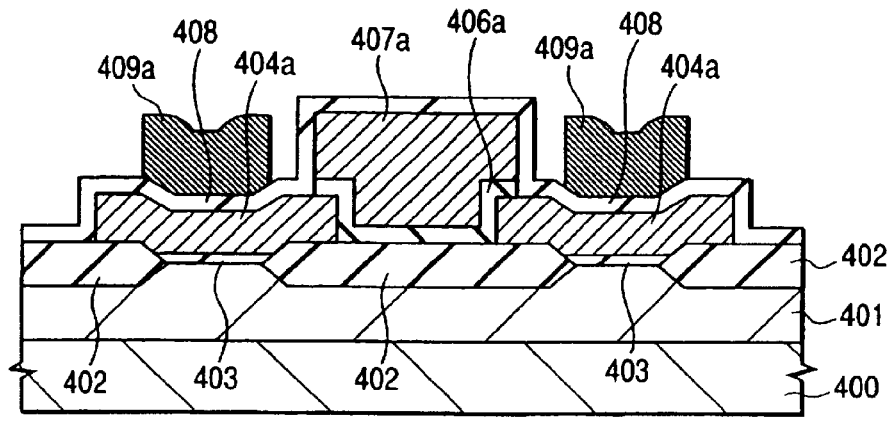
FIGS. 39A to 39C are sectional views taken along lines A–A', B–B' and C–C' in FIG. 38, respectively.
Figure 39B:
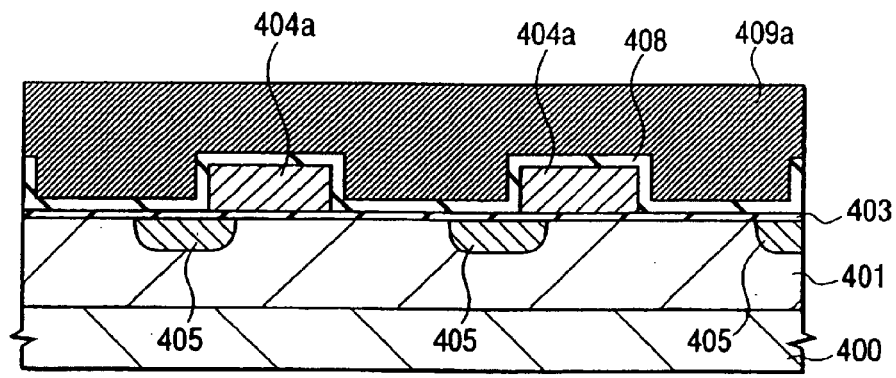
Figure 39C:
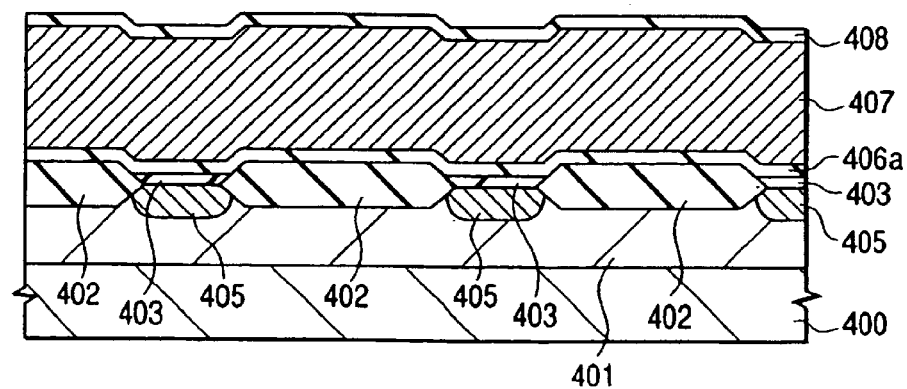

FIG. 38 is a partial plan view showing an example of the semiconductor integrated circuit device according to Embodiment 6 of the present invention, and FIGS. 39A, 39B and 39C are sectional views taken along lines A–A', B–B' and C–C' in FIG. 38, respectively. Incidentally, each member is shown hatched in the plan view of FIG. 38 for ease of illustration with a part of members being omitted.

As shown in FIGS. 38 and 39, the memory cell of this embodiment includes source/drain diffusion layers 405 in a well 401, first gates (floating gates) 404a, second gates (control gates) 409a and third gates 407a. The control gates 409a of the memory cells are connected in a row direction (x direction) and form a word line. The floating gate 404a and the well 401 are isolated from each other by a gate insulator film 403, and the floating gate 40a and the third gate 407a, by an insulator film 406a. The floating gate 404a and the word line (control gate) 409a are isolated from each other by an insulator film 408.

The source/drain diffusion layer 405 is disposed vertically to the word line 409a and exists and a local source line and a local data line that connect the source/drain of the memory cell in the column direction (y direction). A channel is formed in a direction vertical to this diffusion layer 405.

The third gate 407a keeps contact with the floating gate through an insulator film 406a at the end face of the floating gate 404a that is parallel to the word line 409a and the channel, among its end faces, in the form in which the third gate 407a is buried between the floating gate patterns 404a. The third gate 407a of this embodiment is disposed on a field oxide film 402, and is disposed in parallel with the word line 409a and with the channel, that is, in the column direction, unlike Embodiments 1 to 5.

The production method of the memory cell of this embodiment will be described with reference to FIGS. 40 to 42.

Figure 40A:
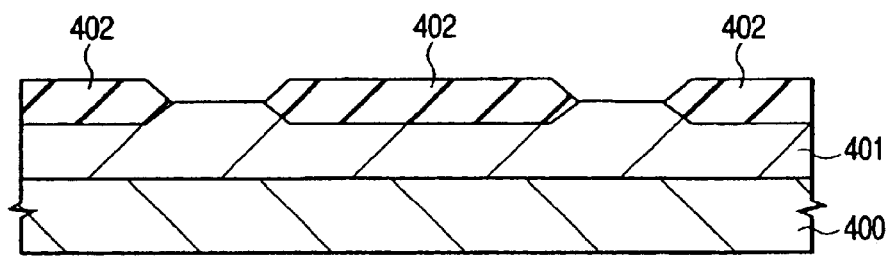
FIGS. 40A to 40D are sectional views showing an example of the production method of the semiconductor integrated circuit device of Embodiment 6.
Figure 40B:
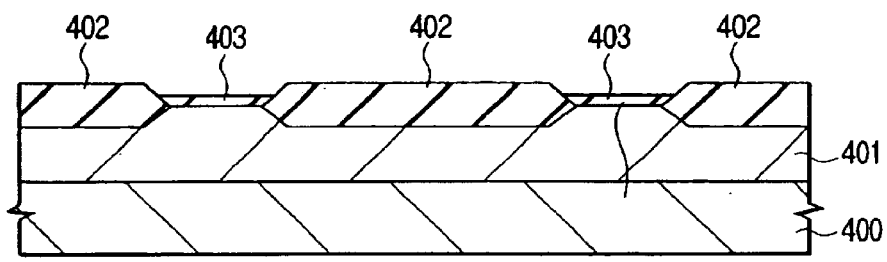

First, a p type well 401 is formed in a semiconductor substrate 400 and a field oxide film 402 to function as a device isolation region is formed on the p type well 401 by LOCOS (Local Oxidation of Silicon) (FIG. 40A).

Figure 40C:
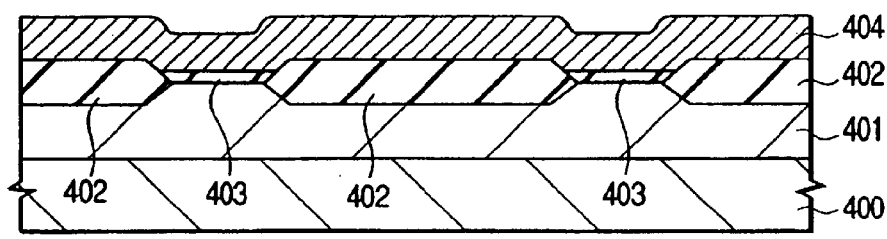
Figure 40D:
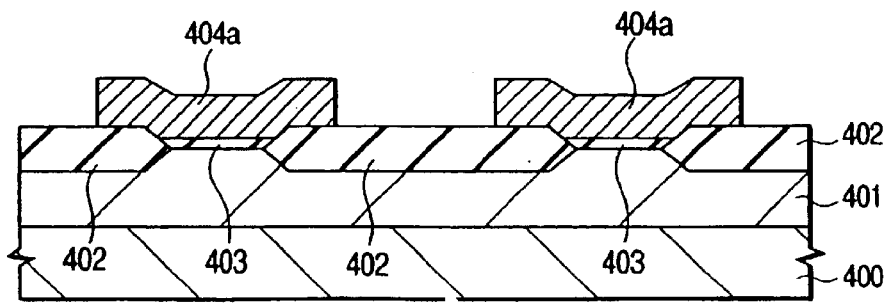

Next, a gate insulator film 403 is formed by a thermal oxidation process, for example, (FIG. 40B), and a P-doped polysilicon film 404 to function as a floating gate is deposited (FIG. 40C). The polysilicon film 404 is patterned by lithography and dry etching technologies, for example, and the floating gate 404a is formed (FIG. 40D). Arsenic (As) ions are implanted by using the ion implantation process, for example, and a drain layer 405 to function as source/drain of a memory cell is formed (not shown).

Figure 41A:
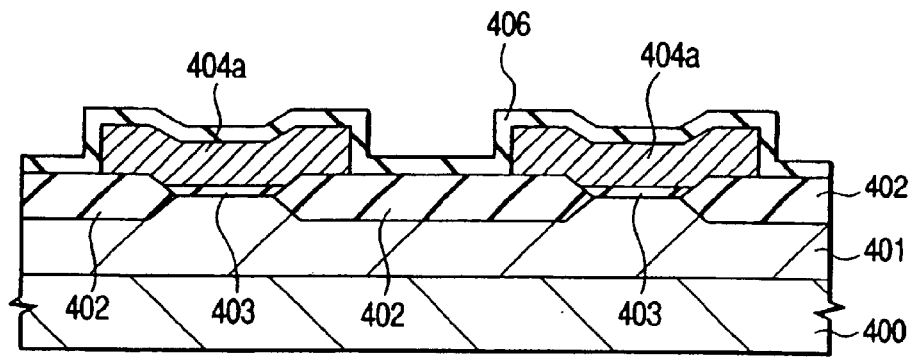
FIGS. 41A to 41C are sectional views showing an example of the production method of the semiconductor integrated circuit device of Embodiment 6.
Figure 41B:
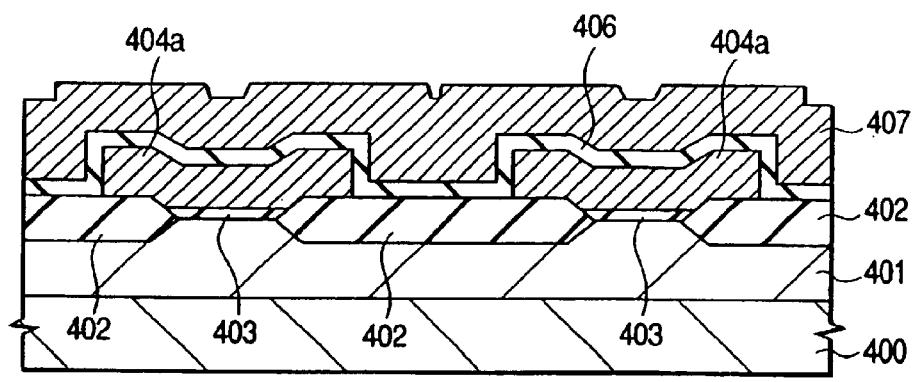
Figure 41C:
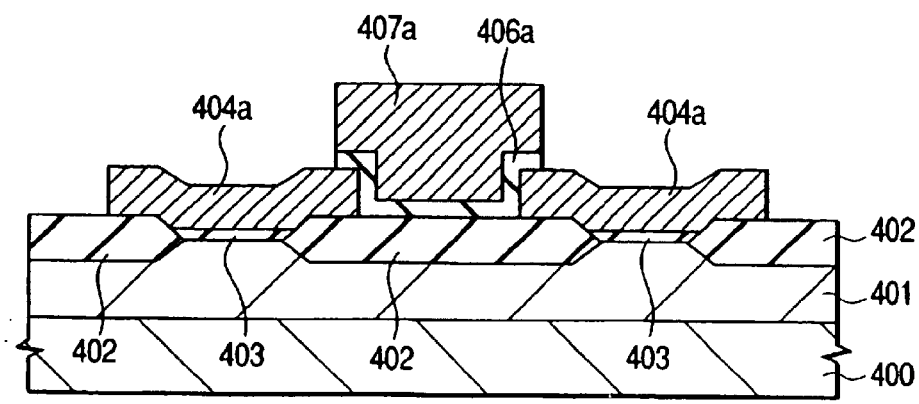
Figure 42A:
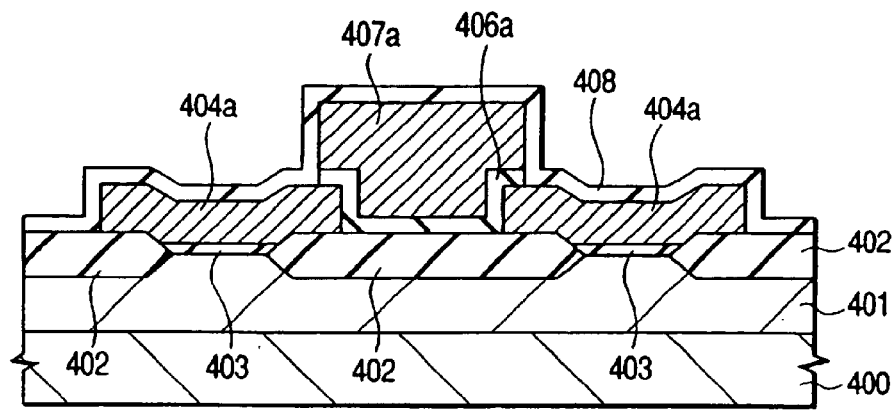
FIGS. 42A to 42C are sectional views showing an example of the production method of the semiconductor integrated circuit device of Embodiment 6.
Figure 42B:
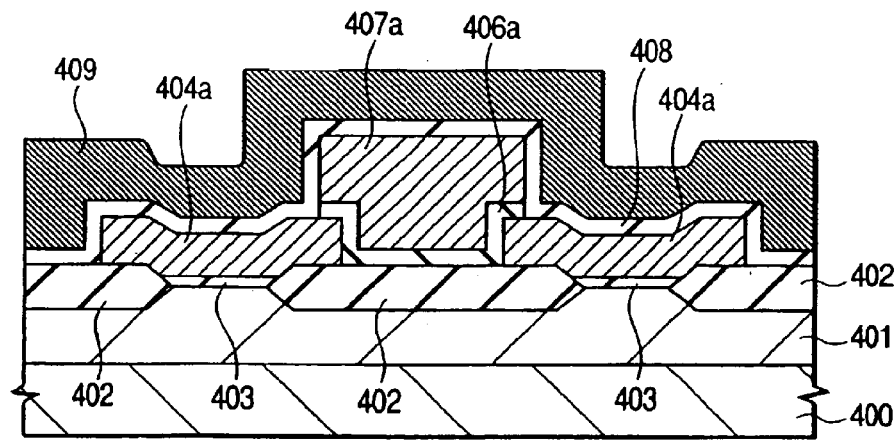

An insulator film 406 for isolating the floating gate from the third gate is formed by the method shown in FIG. 3E of Embodiment 1 (FIG. 41A). A P-doped polysilicon film 407 to function as the third gate is deposited by CVD, for example (FIG. 41B). The polysilicon film 407 is then patterned by lithography and dry etching technologies, for example, and the third gate is patterned (whereby the polysilicon 407 is converted to 407a) (FIG. 41C).

An N-doped silicon oxide film 408 for isolating the floating gate from the word line is formed by the same method as the method shown in FIG. 3E.

Figure 42C:
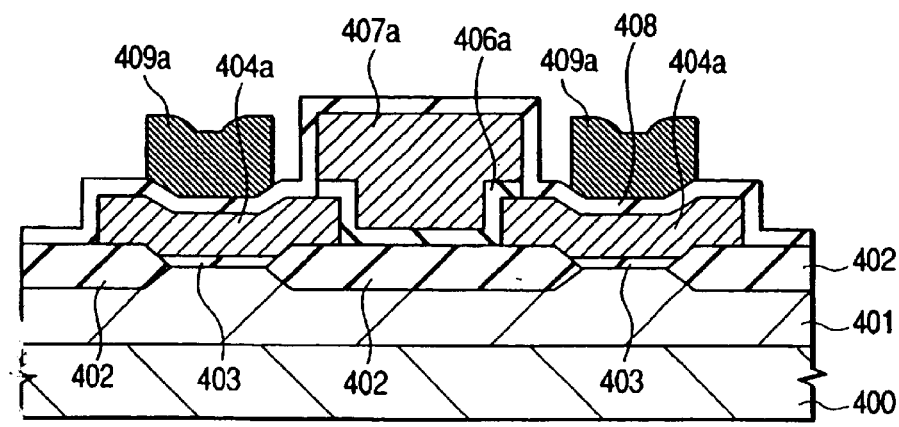

A laminate film 409 comprising a polysilicon film, a tungsten nitride film and a tungsten film, or a so-called "polymetal film", is deposited (FIG. 42B), and is then patterned by the lithography and dry etching technologies to form the word line 409a (FIG. 42C).

After an intermetal insulating film, not shown, is formed, contact holes reaching the word line 409a, the source/drain diffusion layer 405, the well 401 and the erase gate 407a are formed. Subsequently, a metal film is deposited and is patterned to form a wire. In this way, the memory cell can be completed.

Figure 44A:
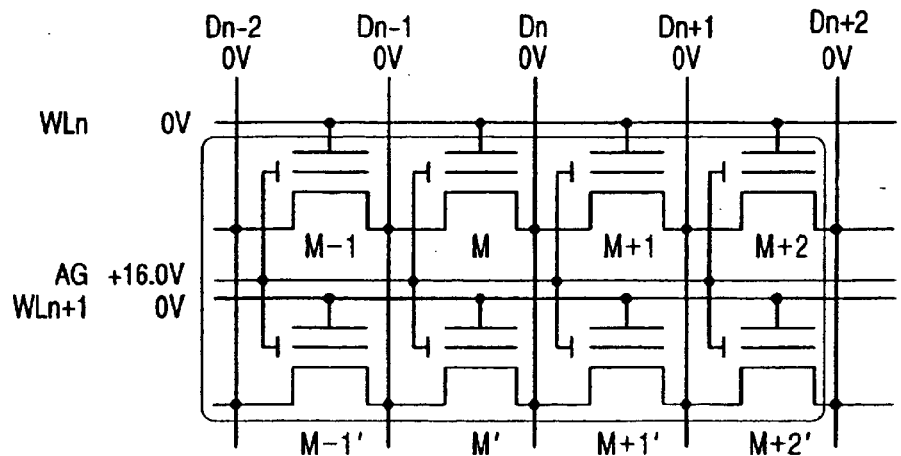
Figure 44B:
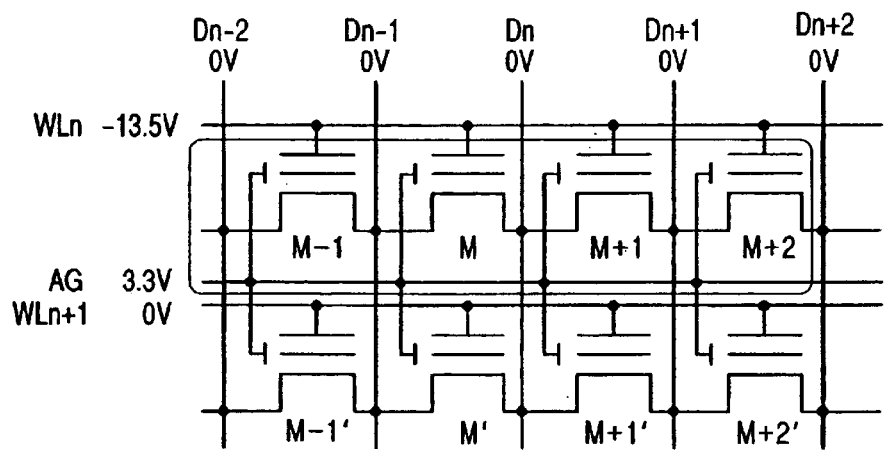
Figure 44C:
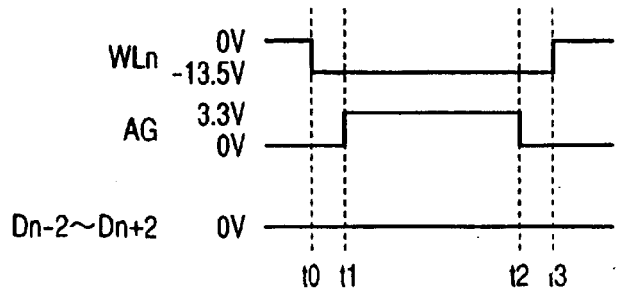
Figure 45A:
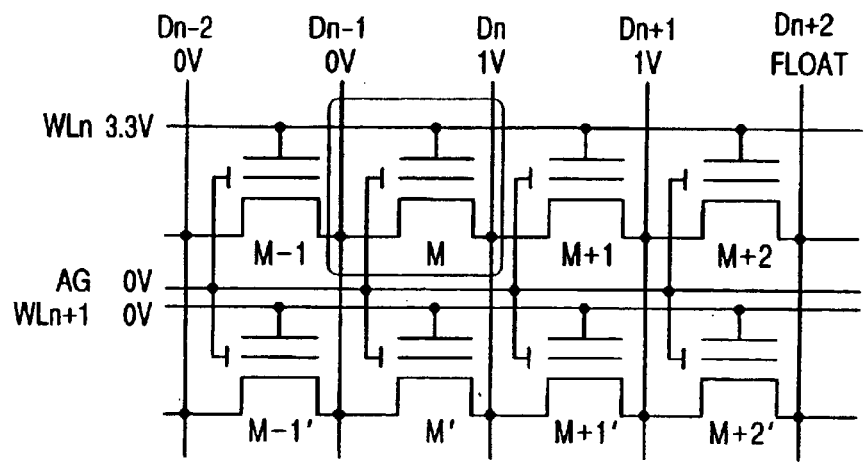

Next, the voltage application condition and the operation method of the memory cell formed by the method described above in the programming, erasing and reading operations will be explained with reference to FIGS. 43 to 45. FIGS. 43, 44 and 45 show the programming operation, the erasing operation and the reading operation, respectively. In these drawings, A shows an equivalent circuit and B or C shows a timing chart. In FIGS. 43 to 45A, the cell encompassed by dotted lines conducts selectively the respective operations.

Figure 43A:
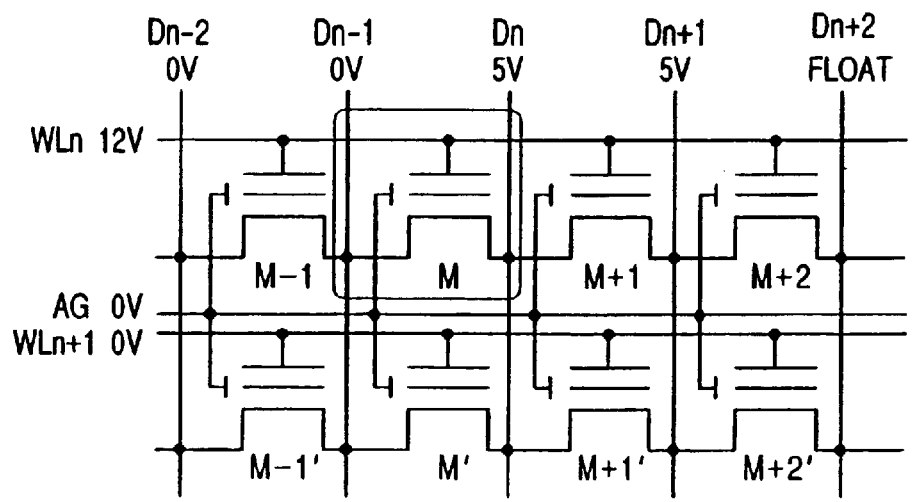

First, in the programming operation, a positive voltage of about 12 V, for example, is applied to the word line WLn of the selected cell M and a positive voltage of about 5 V. For example, is applied to the diffusion layer Dn to function as the drain of the selected cell M, as shown in FIG. 43A. The diffusion layer Dn−1 to function as the source of the selected cell M is kept at 0 V. In this way, miss-programming can be prevented in the same way as in Embodiment 1. In consequence, hot electron injection occurs in the memory cell M alone, and the electrons are built up in the floating gate with the result that the threshold voltage of the memory cell rises and programming is conducted. On the other hand, all the third gates AG, the well and the unselected word line WLn+1 are kept at 0 V. Furthermore, the diffusion layers Dn−2, Dn+1 and Dn+2 are kept at 0 C, 5 V and under the floating state, respectively. As described above, the semiconductor integrated circuit device of this embodiment uses four adjacent cells as one unit, selects one of them and conducts programming. To program all the cells on one word line, therefore, the programming operation must be carried out at least four times.

Figure 43B:
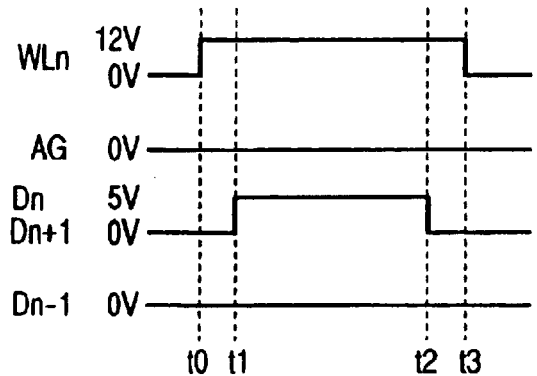
Figure 43C:
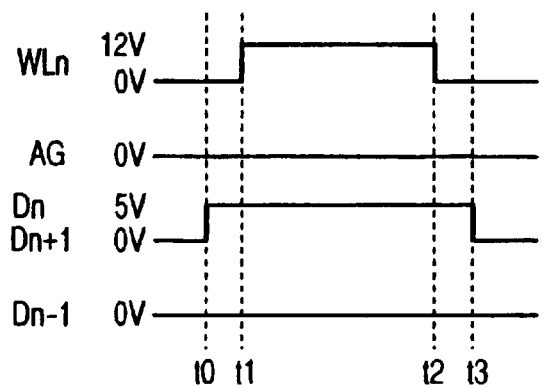

FIGS. 43B and 43C are timing charts showing examples of the voltage application timings to the selected word line WLn and the diffusion layers Dn and Dn+1. There are two examples as shown in these drawings. The timings shown in FIGS. 43B and 43C are the same as those of Embodiment 1 shown in FIGS. 13B and 13C.

Next, the erasing operation will be explained. As shown in FIG. 44A, the third gate Agn+1 is selected and a positive voltage of 16 V, for example, is applied to this gate. Each diffusion layer, the well and all the word lines are kept at 0 V. Consequently, electron ejection occurs from the floating gate to the third gate in the two rows of memory cells M−1 to M+2 and M−1' to M+2' (portions encompassed by dotted lines) adjacent and parallel to the third gate AGn+1 due to the Fowler-Nordheim type tunneling phenomenon, so that the threshold value of the memory cells drops and the erasing operation is conducted. In other words, the erasing operation is conducted in the unit of two word lines. In this instance, the selected third gate AG may be plural.

Another erasing method is as follows. As shown in FIG. 44B, a negative voltage of −13.5 V, for example, is applied to the selected word line WLn and a relatively small positive voltage of 3.3 V, for example, is applied to the adjacent third gate AG. Each diffusion layer D, the well and the unselected word lines WLn+1 are kept at 0 V. Consequently, electron ejection occurs from the floating gate to the third gate in all the memory cells on the word line WLn and the erasing operation is conducted. FIG. 44C is a timing chart showing a voltage application timing to the selected word line WLn and the third gate AG. Since this application timing is the same as that of Embodiment 1 shown in FIG. 14B, the explanation will be omitted.

Still another erasing method is as follows. A negative voltage of −13.5 V, for example, is applied simultaneously to a plurality of word lines and a relatively small positive voltage of 3.3 V, for example, is applied to all the third gates AG while each diffusion layer D and the well are kept at 0 V. In this case, the erasing operation is conducted in the cells on the word line to which the negative voltage is applied.

Next, the reading operation will be explained. As shown in FIG. 45A, a positive voltage of 3.3 V, for example, is applied to the word line WLn of the selected cell M and a positive voltage of 1 V, for example, is applied to the diffusion layer Dn that functions as the drain of the selected cell M. The diffusion layer Dn−1 to function as the source of the selected cell M, all the third gates AG, the well and the unselected word line WLn+1 are kept at 0 V. Furthermore, the diffusion layers Dn−2, Dn+1 and Dn+2 are kept at 0 V, 1 V and under the floating state, respectively, to prevent miss-read in the same way as in Embodiment 1. In this way, the semiconductor integrated circuit device of this embodiment uses four adjacent memory cells as one unit in the same way as in the programming operation, and selects one of them to conduct the read operation. Therefore, to conduct the reading operation in all the cells on one word line, the reading operation is conducted at least four times.

Figure 45B:
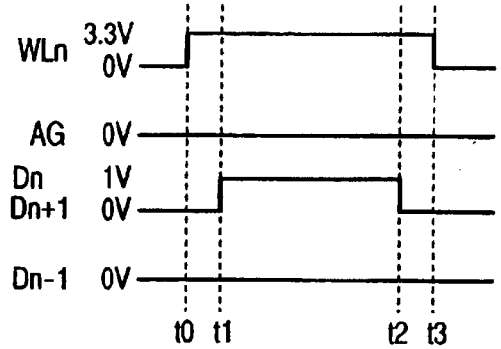
Figure 45C:
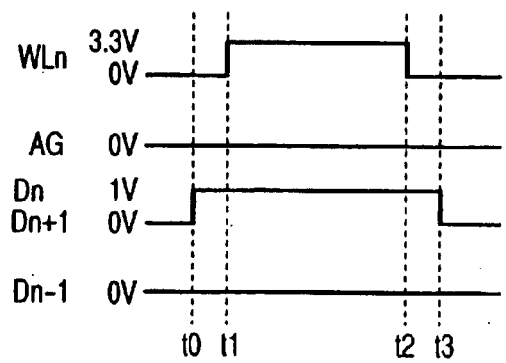

FIGS. 45B and 45C are timing charts showing examples of the voltage application timing to the selected word line Wln and the diffusion layers Dn and Dn+1. There are two examples as shown in these drawings. The timings shown in FIGS. 45B and 45C are the same as the timings of Embodiment 1 shown in FIGS. 15B and 15C.

In this embodiment, the memory cell employs the polymetal structure for the word line. Therefore, this embodiment can reduce the transition delay time of the word line in the programming, erasing and reading operations. Since the word line having the polymetal structure is formed after the third gate is formed, the defect density of the silicon oxide film between the floating gate and the third gate can be lowered. This embodiment can also lower the maximum value of the absolute value of the internal operating voltage in the programming/erasing operation to 13.5 V.

[Embodiment 7]

Figure 46:
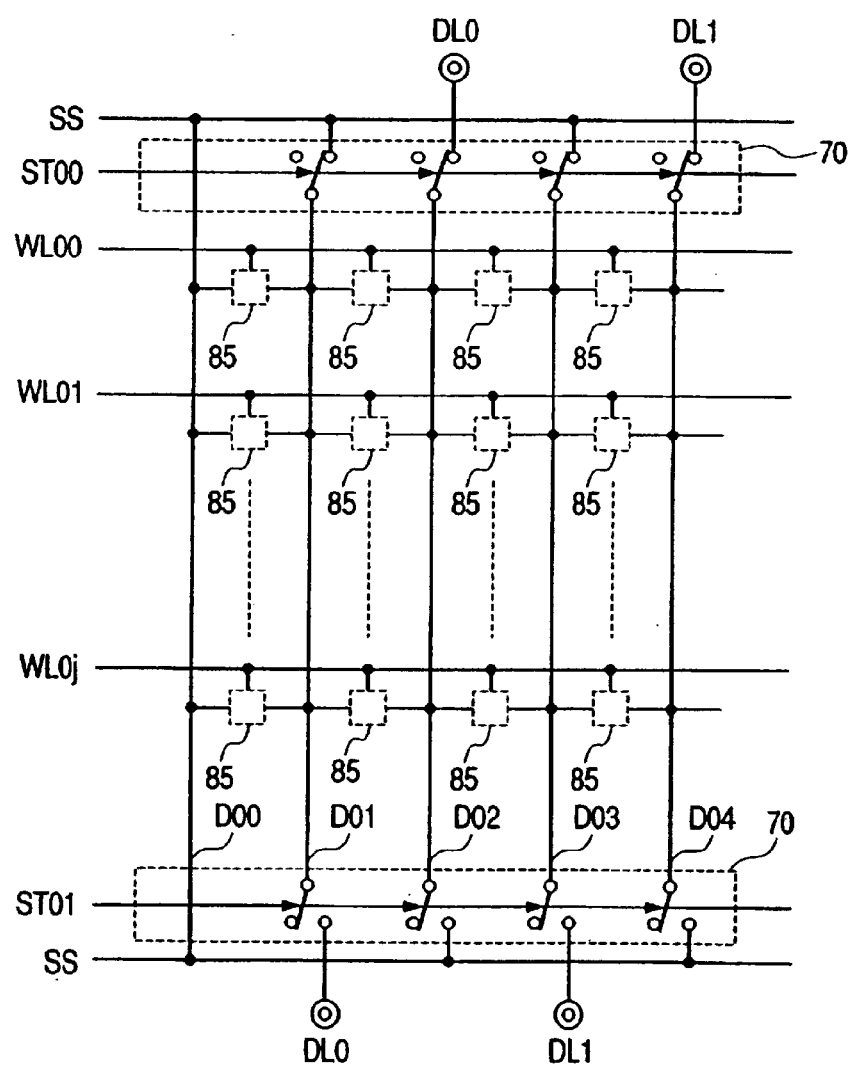
FIG. 46 is a circuit diagram showing an example of the semiconductor integrated circuit device according to Embodiment 7 of the present invention.

FIG. 46 is a circuit diagram showing conceptually an example of the semiconductor integrated circuit device according to Embodiment 7 of the present invention.

As shown in FIG. 46, memory cells 85 are disposed in matrix and form a memory cell array. FIG. 46 shows one memory cell array divided into blocks. The memory cells explained in Embodiments 1 to 5 can be applied to the memory cells 85 of this embodiment. Diffusion layer wires D00 to D04 that mutually connect the memory cells 85 in the column direction (y direction) are formed in the memory cell array. A source line SS is connected to the diffusion layer D00, and each select transistor (select MOS) 70 is disposed at each of the upper and lower ends of the diffusion layer wires D01 to D04. The drain of the select transistor 70 is connected to the diffusion layer wires D11 to D04 and the source of the select transistor is connected to either one of global data line DLn and source line SS. However, when the source of the select transistor 70 is connected to the global data line Dln at the upper end of the diffusion layer wires Dn (D01 to D04), the source of the select transistor 70 at the lower end is connected to the source line SS. When it is connected to the source line SS at the upper end of the diffusion layer wire Dn (D01 to D04), on the contrary, the source of the select transistor 70 at the lower end is connected to the global data line DLn at the lower end. This arrangement is repeated alternately for every other diffusion layer wires Dn. This arrangement constitutes the virtual ground type memory array.

The word lines WLn (WL00 to WL0j) are disposed in the row direction (x direction) and are shared as the control gate of the memory cells 85 adjacent to one another in the x direction.

The same signal is inputted to the gates of the select transistors 70 adjacent to one another in the word line direction (x direction), and two gate wires ST00 and ST01 are disposed for each block. One global data line DLn is shared by two diffusion layer wires Dn.

In such a construction of the select transistors, only two gate signals of the select transistors adjacent in the word line direction exist for each block. Therefore, the increase of the area of the select transistor portion can be inhibited, and the chip area can be restricted to minimum. Sir-e two diffusion layer wires share one global data line, the arrangement of the global data line and the sense circuit connected to the former becomes easy. In other words, the pitch of the global data line and the sense circuit can be relaxed. Furthermore, when all the memory cells existing on one word line are programmed or read, the operation can be completed by the operations made twice, that are minimum necessary in the virtual ground type memory cell array.

Figure 47:
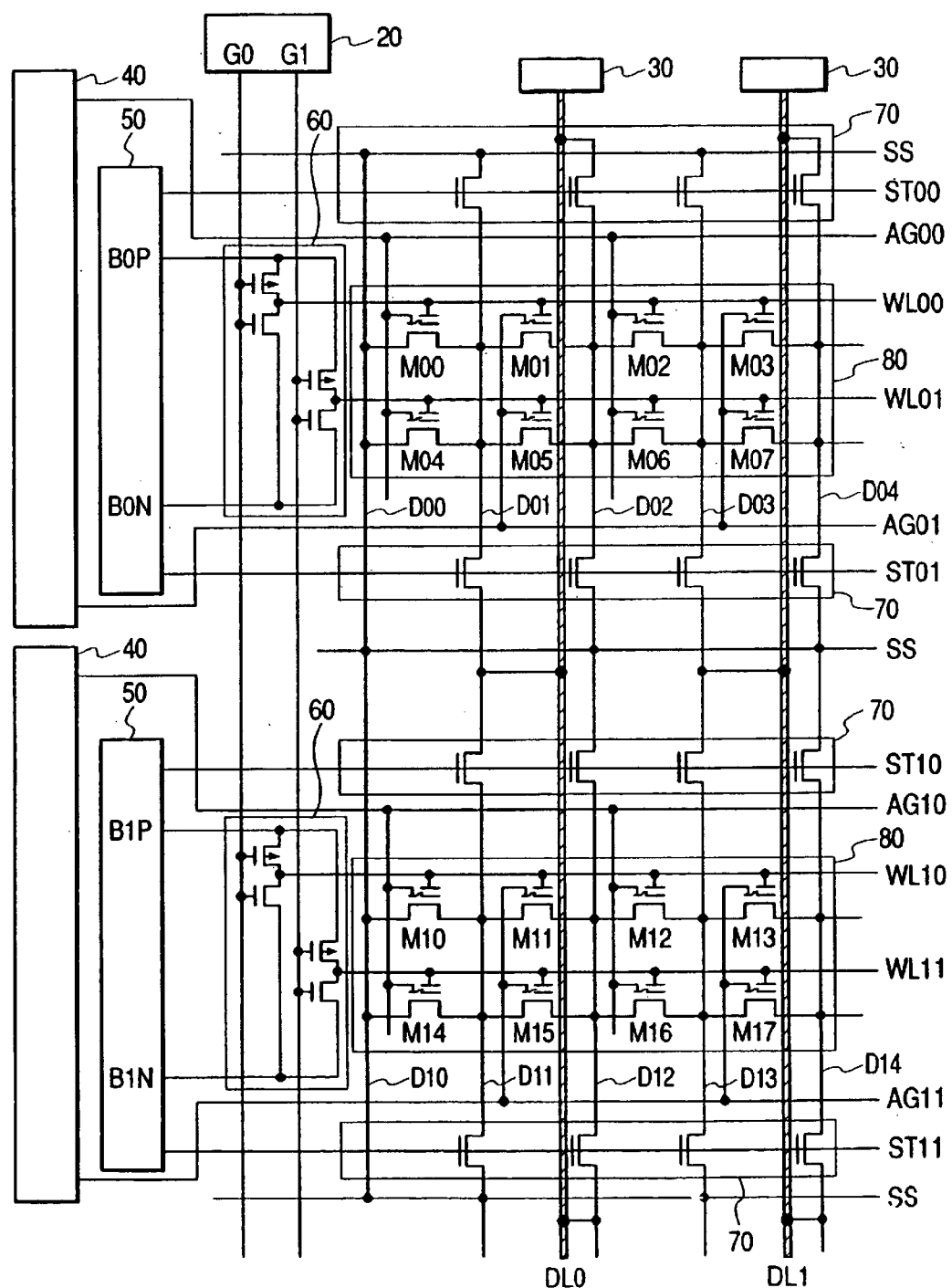
FIG. 47 is a circuit diagram showing the arrangement of a memory cell array, a block decoder, a sub-decoder, etc, of Embodiment 7.
Figure 48:
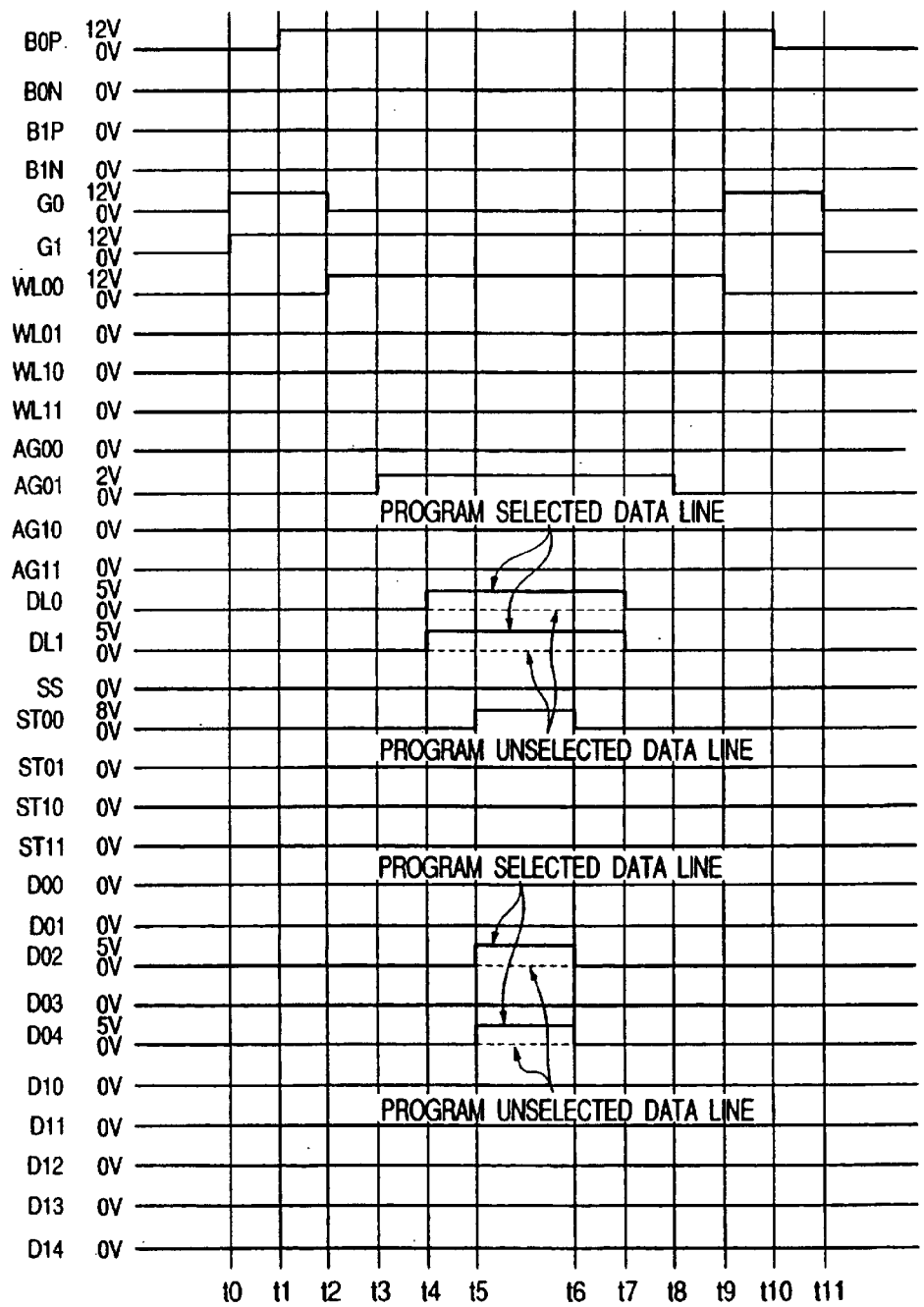
FIG. 48 is a timing chart showing the timing of the programming operation in the semiconductor integrated circuit device having a select transistor structure of Embodiment 7.
Figure 49:
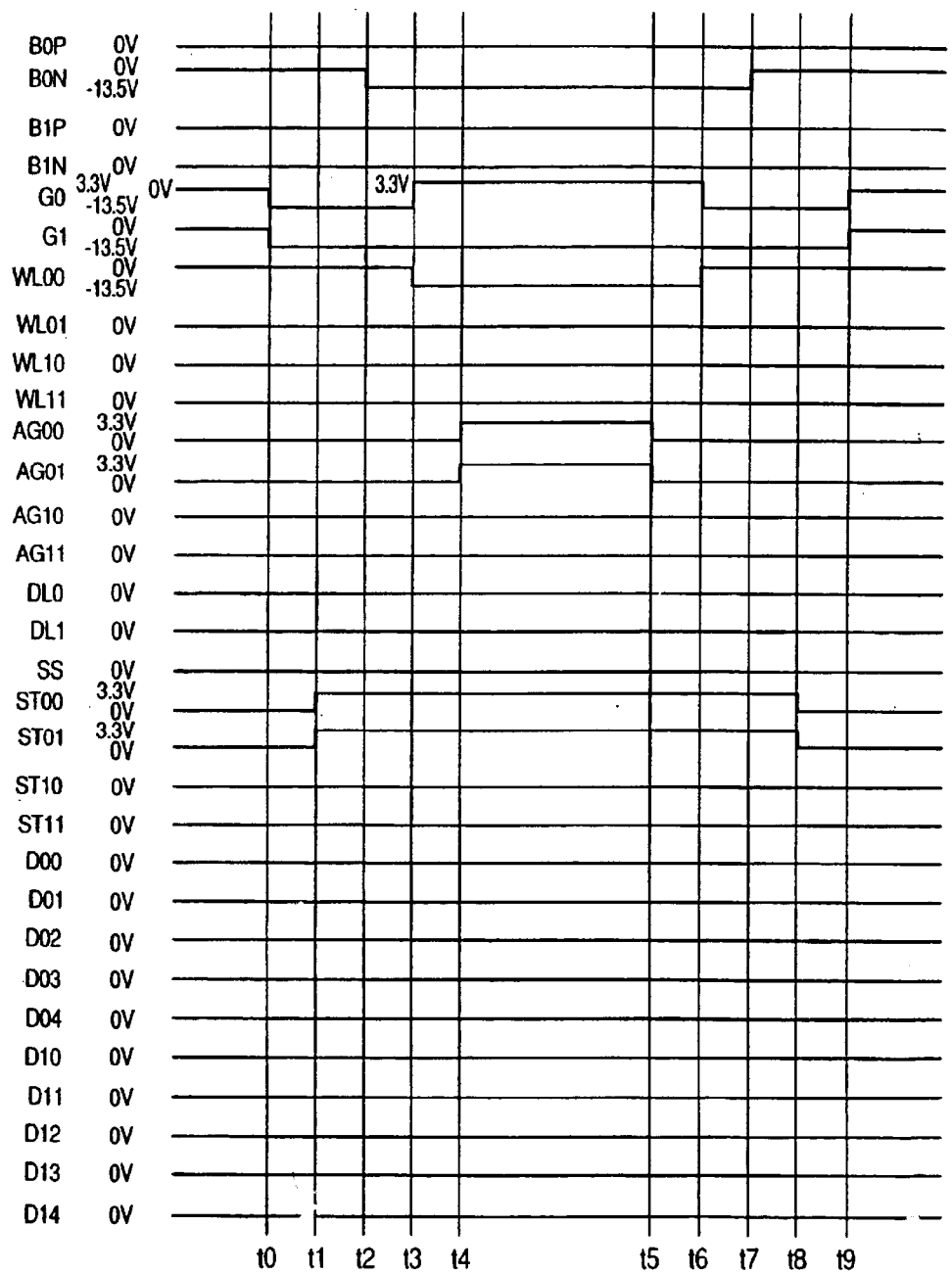
FIG. 49 is a timing chart showing the timing of the erasing operation in the semiconductor integrated circuit device having the select transistor structure of Embodiment 7.
Figure 50:
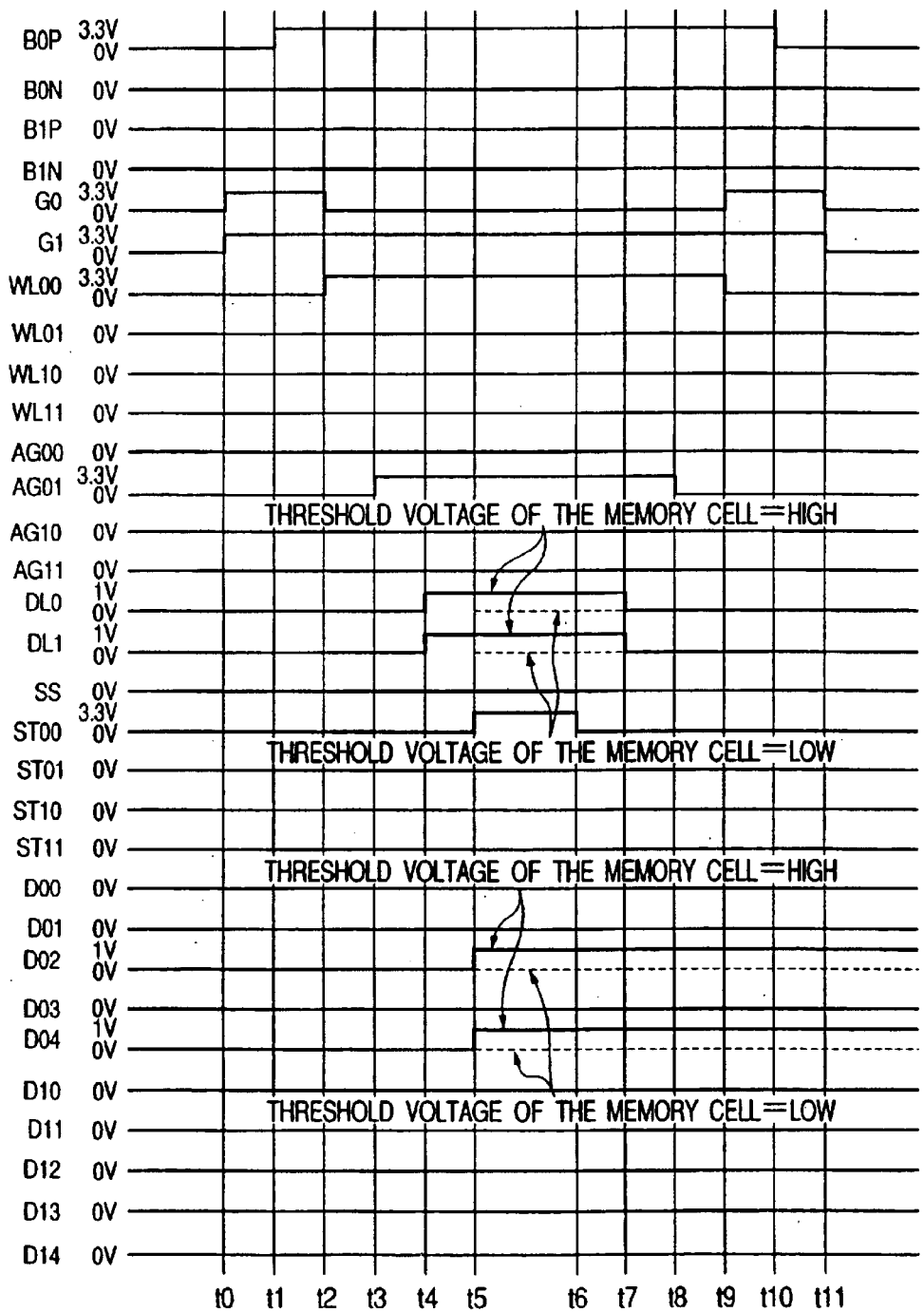
FIG. 50 is a timing chart showing the timing of the programming operation in the semiconductor integrated circuit device having the select transistor structure of Embodiment 7.

Hereinafter, the semiconductor integrated circuit device of this embodiment will be explained with reference to a detailed circuit diagram and an operation timing chart. FIG. 47 is a circuit diagram showing the arrangement of the memory cell array, the block decoders, the sub-decoders, etc, in Embodiment 7. In FIG. 47, the construction of the memory cells represents the case where the memory cells of Embodiments 2 to 4, in which the third gate 107*a* (AG) functions also as the assist gate for controlling the split gate channel, are applied. FIGS. 48 to 50 are timing charts useful for explaining the programming, erasing and reading operations of the semiconductor integrated circuit device having the select transistor construction of this embodiment. Incidentally, FIG. 47 shows the memory cell arrays for two block, in which two word lines WL and two global data lines DL are shown disposed, for ease of illustration. The sub-decoder 60 has the inverter construction, but it is not particularly limited thereto.

The semiconductor integrated circuit device of this embodiment includes memory cell arrays 80, assist gate decoders 40, block decoders 50, sub-decoders 60, gate decoders 20, select transistors 70 and sense circuits 30. To improve the processing speed, the word decoder has a hierarchical construction comprising the block decoder 50, the sub-decoder 60 and the gate decoder 20.

Though the sub-decoder 60 is shown disposed on only the left side of the memory cell array 80 for ease of explanation, it is so disposed in practice as to divide and sandwich the memory cell array 80. This is to reduce the length of the word line WL and its load by dividing the memory cell array 80 when the memory capacity becomes great and the length of the word line WL increases to invite the increase of the load of the word line WL. The high processing speed can be thus accomplished.

The arrangement wherein the sub-decoders 60 are disposed on both sides of the memory cell array 80 provides the following two effects. First, pitch relaxation can be achieved at the junction between the word line WL and the sub-decoder 60 (inverter, in this drawing). The sub-decoder 60 is always necessary for the word line on the 1:1 basis. Therefore, when the sub-decoder 60 is disposed on one of the sides of the memory cell array 80, the word line WL and the sub-decoder 60 must be connected in match with the pitch of one word line. In contrast, when the sub-decoders 60 are disposed on both sides of the memory cell array 80, even-numbered word lines may be connected to the sub-decoder 60 disposed on the right side of the memory cell array 80 with odd-numbered word lines being connected to the sub-decoder 60 disposed on the left side of the memory cell array 80. In other words, the word lines to be connected to the sub-decoders 60 may be divided to the right and left segments and every other word line may be connected to the respective sub-decoder 60. In this way, layout design of the junction portion between the word line WL and the sub-decoder 60 becomes easier.

Another effect is pitch relaxation of the arrangement of the sub-decoders 60. The sub-decoder 60 must essentially be disposed for the word line on the 1:1 basis as described above. Therefore, when the sub-decoder 60 is disposed on one of the sides of the memory cell array 80, one sub-decoder 60 must be disposed inside the region of one word line. When the sub-decoders 60 are disposed on both sides of the memory cell array 80, in contrast, one sub-decoder 60 may be disposed in the region of two word lines, and the layout design of the sub-decoders 60 becomes easier.

In this embodiment, two diffusion layer wires (for example, D01 and D02) share one global data line DL (for example, DL0) and relaxes the pitch of the data line. Therefore, one global data line DL and one sense circuit 30 connected to the former may be wired and disposed by using the regions of two memory cells aligned in the word line WL direction.

In this embodiment, the gate signals of the select transistors 70 aligned in the word line WL direction are all the same signal and the number of the gate signals of the select transistors 70 in one block is only two. In consequence, the increase of the area of the portion of the select transistors 70 can be restricted and the chip area can be limited to minimum.

As described below in detail, the operation can be completed by conductiing the operation twice, that is the minimum number of times necessary when the programming or reading operation is conducted to or from all the memory cells existing on one word line in the virtual ground type memory cell array.

Next, the programming operation will be explained. FIG. 48 is a timing chart showing the timing of the programming operation.

It will be assumed hereby that the memory cells as the object of programming are M01 and M03. First, the initial voltage of all signals is 0 V. Next, the output signals G0 and G1 of the gate decoder 20 are set to 12 V at the timing t0, and all the word lines WL00 to WL11 are reliably set to 0 V.

Next, a PMOS power source BOP of the sub-decoder 60 in the selected block is set to 12 V at the timing t1.

The output signal G0 of the gate decoder 20 is set to 0 V at the timing t2.

Consequently, the selected word line WL00 inside the selected block is 12 V, the unselected word line WL01 is 0 V and the word lines WL10 and WL11 inside the unselected block are 0 V.

The output signal AG01 of the assist gate decoder 40 is set to 2 V at the timing t3 and the assist gate (third gate AG) of the memory cell as the object of programming is set to 2 V.

Next, a voltage is applied at the timing t4 from the sense circuit 30 to the global data lines DL0 and DL1 by the data to be programmed. When the programming data is programmed to the memory cell M01, for example, the global data line DL0 is set to 5 V, and to 0 V when the data is not programmed. The global data line DL1 is set to 5 V when the programming data is programmed to the memory cell M03 and to 0 V when the data is not programmed.

Next, the gate signal ST00 of the select transistor 70 is set to 8 V at the timing t5. Consequently, the sources D01 and D03 of the memory cells Mol and M03 as the programming object are set to 0 V, and the voltage corresponding to the programming data is applied to the drains D02 and D04. When it is desired to program the programming data to the memory cell M01, for example, 5 V is applied to the drain D02, and 0 V is applied when the data is not programmed. A 5 V voltage is applied to the drain D04 when the programming data is to be programmed to the memory cell M03, and 0 V is applied when the data is not programmed. The programming voltage is applied under this state to the memory cells M01 and M03 as the programming object, and arbitrary data is programmed.

To complete the programming operation, the gate signal ST00 of the select transistor 70 is set to 0 V at the timing t6. As a result, the drains D02 and D04 of the memory cells M01 and M03 as the programming object becomes 0 V.

Next, the global data lines DL0 and DL1 are set to 0 V at the timing t7.

The output signal AG01 of the assist gate decoder 40 is set to 0 V at the timing t8, and the assist gates of the memory cells as the programming object are set to 0 V.

The output signal G0 of the gate decoder 20 is set to 12 V at the timing t9, and the selected word line WL00 inside the selected block becomes 0 V.

Next, the PMOS power source BOP of the sub-decoder 60 in the selected block is set to 0 V at the timing t10.

Finally, the output signals G0 and G1 of the gate decoder 20 are set to 0 V at the timing t11, and the programming operation is completed.

When programming is made to the memory cells M01 and M03 in the programming operation of this embodiment, the programming voltage is applied during the timing t5 to t6 in which the gate signal ST00 of the select transistor 70 reaches 8 V. The gate signal ST00 of this select transistor 70 is the signal for controlling the drain voltage of the memory cell. In this embodiment, therefore, the application time of the drain voltage becomes the shortest among the word line voltage, the assist gate voltage and the drain voltage applied to the selected memory cell. For this reason, the embodiment can be said an optimal system for relaxing the drain disturb. Various variations are possible as the application timing of the word line voltage, the assist gate voltage and the drain voltage applied to the selected memory cell as explained already in Embodiments 1 to 6, and they have the respective features. Therefore, the system of this embodiment is not particularly restrictive.

When programming is made to the memory cells M00 and M02 and all the memory cells on one word line are programmed, the programming operation described above may be similarly repeated for M00 and M02. In this way, this system can complete the programming operation to all the memory cells on one word line by conduction of the programming operation twice. Therefore, when the programming operation is repeated twice, a sector operation (one-word line) operation, that takes the programming unit=erasing unit=reading unit into account, becomes feasible. A page operation that does not repeat the programming operation but changes the programming unit to a ½ sector (½ word line) can also be made.

Next, the erasing operation will be explained. FIG. 49 is a timing chart showing the timing of the erasing operation.

It will be assumed hereby that the memory cells as the erasing object are M01 to M03 existing on the word line WL00. First, the initial voltage is 0 V for all the members.

Next, the output signals G0 and G1 of the gate decoder 20 is set to −13.5 V at the timing t0, and all the word lines WL00 to WL11 are set reliably to 0 V.

The gate signals ST00 and ST01 of the select transistor 70 are set to 3.3 V at the timing t1, and the sources/drains of the memory cells M0 to M03 as the erasing object are set reliably to 0 V.

The NMOS power source BON of the sub-decoder 60 in the selected block is set to −13.5 V at the timing t2.

The output signal G0 of the gate decoder 20 is set to 3.3 V at the timing t3. In consequence, the selected word line WL00 inside the selected bock is −13.5 V, its unselected word line WL0 is 0 V and the word lines WL10 and WL11 inside the unselected block are 0 V.

The output signals AG00 and G01 of the assist gate decoder 40 are set to 3.3 V at the timing t4, and 3.3 V is applied to the assist gate of the memory cell as the erasing object. Under this state, the erase voltage is applied to the memory cells M01 to 03 as the erasing object and the data is erased.

To complete the erasing operation, the output signals AG00 and AG01 of the assist gate decoder 40 are set to 0 V at the timing t5 and the assist gate of the memory cell as the erasing object is set to 0 V.

Next, the output signal G0 of the gate decoder 20 is set to −13.5 V at the timing t6. As a result, all the word lines WL00 to WL 11 are set to 0 V.

Next, the NMOS power source BON of the sub-decoder 60 in the selected block is set to 0 V at the timing t7.

The gate signals ST00 and ST01 of the select transistor 70 are set to 0 V at the timing t8.

Finally, the output signals G0 and G1 of the gate decoder 20 are set to 0 V at the timing t9, and the erasing operation is completed.

When the erasing operation is conducted for the memory cells M0 to M03 in this embodiment, the erasing voltage is applied during the period t4 to t5 in which the assist gate signals G00 and AG01 reach 3.3 V. In this system, the voltage application time of the assist gate voltage is shorter than the word line voltage application time. Therefore, this system can be said most optimal for relaxing disturb by the assist gate for the memory cells connected to the unselected word line.

In this embodiment, the erasing voltage is applied during the period t4 to t5 in which the assist gate signals AG00 and AG01 reach 3.3 V. Therefore, the voltage rise time and the voltage fall time of the assist gate signals determine the erasing time. Since this voltage switching width of the assist gate signals is as small as 3.3 V, the rise/fall time is fast. Therefore, this system can be said as a system having excellent controllability of the erasing time. As to the timing of the word line voltage and the assist gate voltage to be applied to the selected memory cell, however, other variations may be possible as described already in Embodiments 1 to 6, and they have respective features. Therefore, this system is in no way restrictive.

When the erasing operation is conducted for the memory cells M01 to M03 in this system, the gate signals ST00 and ST01 of the select transistor and the assist gate signals AG00 and AG01 are operated simultaneously. To erase all the memory cells existing on one word lines, therefore, the erasing operation can be completed by one operation, and the sector (1 word line) operation that takes the programming unit=erasing unit=reading unit into account becomes feasible.

Incidentally, the voltage values used in this explanation are merely illustrative but in no way restrictive.

Next, the reading operation will be explained. FIG. 50 is a timing chart showing the timing of the read operation.

It will be assumed that the memory cells as the reading object are M01 and M03. First, the initial voltage of all signals are set to 0 V.

Next, the output signals G0 and G1 of the gate decoder 20 are set to 3.3 V at the timing t0, and all the word lines WL00 to WL11 are reliably set to 0 V.

The PMOS power source BOP of the sub-decoder 60 in the selected block is set to 3.3 V at the timing t1.

The output signal G0 of the gate decoder 20 is set to 0 V at the timing t2.

As a result, the selected word line WL00 of the selected bock is 3.3 V, its unselected word line WL01 is 0 V, and the word lines WL10 and WL11 inside the unselected block are 0 V.

Next, the output signal AG01 of the assist gate decoder 40 is set to 3.3 V at the timing t3, and 3.3 V is applied to the assist gate of the memory cell as the reading object.

Next, 1 V is applied to the global data lines DL0 and DL1 from the sense circuit 30 at the timing t4.

Further, 1 V is applied from the sense circuit 30 to the global data lines DL0 and DL1 at the timing t4.

The gate signal ST00 of the select transistor 70 is set to 3.3 V at the timing t5. The reading voltage is applied under this state to the memory cells M01 and M03 as the reading object and the data is read. When the threshold value of the memory cell M01 as the reading object is low in this case, the memory cell M01 is turned ON and the current flows. As a result, the drain voltage D02 of the memory cell M01 and the global data line DL0 connected to the memory cell M01 change to 0 V. When the threshold value of the memory cell M01 as the reading object is high, the memory cell M01 is turned OFF and no current flows. In consequence, the drain voltage D02 of the memory cell M01 and the global data line DL0 connected to the former are kept at 1 V. When the threshold value of the memory cell M03 as the reading object is high, the memory cell M03 is turned OFF and no current flows. Therefore, the drain voltage D04 of the memory cell M03 and the global data line DL1 connected to this memory cell M03 are kept at 1 V. The sense circuit 30 discriminates the voltage change of this global data line DL or its current change. In this way, the reading operation is conducted.

To complete the reading operation, the gate signal ST00 of the select transistor 70 is first set to 0 V at the timing t6. As a result, the drains D02 and D04 of the memory cells M01 and M03 as the reading object are cut off from the sense circuit 30.

Next, the global data lines DL0 and DL1 are set to 0 V at the timing t7.

The output signal AG01 of the assist gate decoder 40 is set to 0 V at the timing t8, and the assist gate of the memory cell as the reading object is set also to 0 V.

Next, the output signal G0 of the gate decoder 20 is set to 3.3 V at the timing t9. In consequence, the selected word line WL00 inside the selected block changes to 0 V.

The PMOS power source BOP of the sub-decoder 60 in the selected block is set to 0 V at the timing t10.

Finally, the output signals G0 and G1 of the gate decoder 20 are set to 0 V at the timing t11 and the reading operation is completed.

When the reading operation is conducted for the memory cells M01 and M03 in this embodiment, the reading voltage is applied during the period t5–t6 in which the gate signal ST00 of the select transistor 70 reaches 3.3 V. The gate signal ST00 of this select transistor 70 is the signal for controlling the drain voltage of the memory cell. In this system, the application time of the drain voltage is the shortest among the word line WL voltage, the assist gate voltage and the drain voltage to be applied to the selected memory cells. Therefore, this system can be said most optimal for relaxing drain disturb. As to the timing of the word line voltage, the assist gate voltage and the drain voltage to be applied to the selected memory cell, however, various variations are possible as explained in Embodiments 1 to 6, and they have respective features. Therefore, this system is not particularly restrictive.

When the reading operation is conducted for the memory cells M00 and M02, too, and all the memory cells on one word line are read, the reading operation described above may be repeated for the memory cells M00 and M02 in the same way as described above. In this way, the present system can complete the reading operation to read all the memory cells on one word line by two operations. As the reading operations are repeated twice, the sector (1 word line) operation that takes the programming unit=erasing unit=reading unit into account becomes feasible. A page operation that divides the reading unit to a ½ sector (½ word line) becomes possible without repeating the reading operation. Incidentally, the voltage values used in this explanation are merely examples and in no way restrictive.

Figure 51:
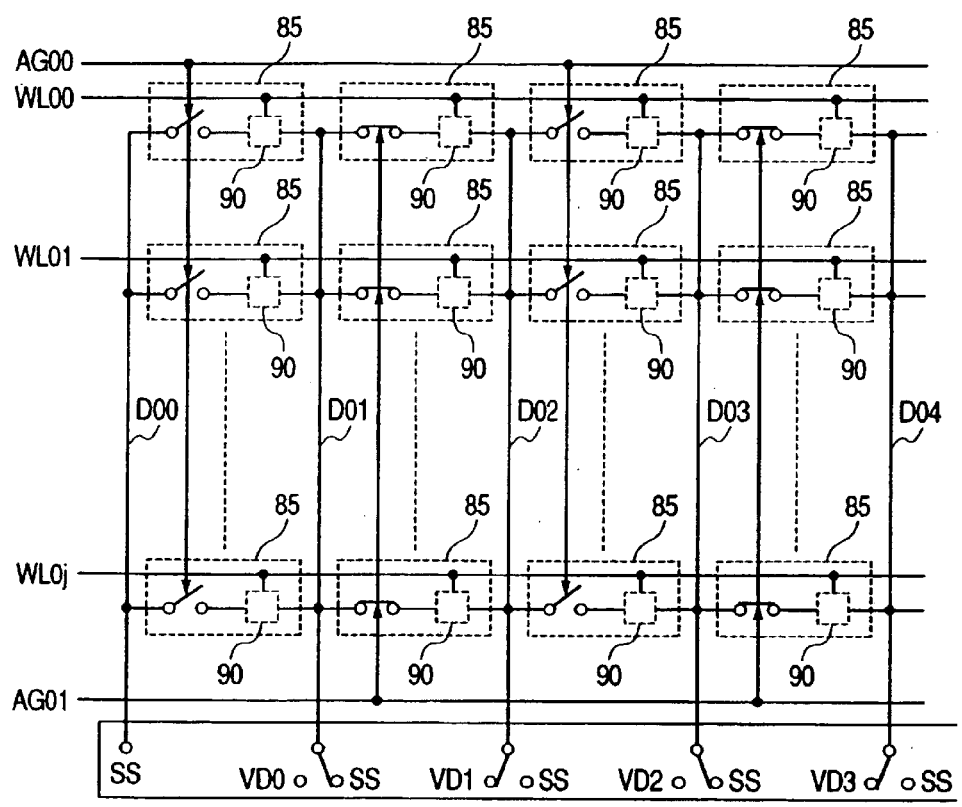
FIG. 51 is a circuit diagram useful for explaining the advantages of a virtual ground type memory cell array equipped with an assist gate.

Next, the advantages of the virtual ground type memory cell array equipped with the assist gate will be explained with reference to FIG. 51. The semiconductor integrated circuit device shown in FIG. 51 includes a virtual ground type memory cell array that shares the drains/sources of the memory cells adjacent to one another in the word line direction, and select transistors for switching the voltage of the diffusion layer wire to the drain voltage VDn and the source voltage SS. The diffusion layer wire is connected to the global data line and to the source line through the selector transistor, and has an assist gate that prevents the drain voltage from being applied to the sources of other memory cells adjacent in the word line direction when the drain voltage is applied to the drain of one memory cell. The assist gates are bundled above and below the block encompassed by the select transistors for every other memory cell adjacent in the word line direction.

To program or read all the memory cells existing on one word line in such a semiconductor integrated circuit device, the operation can be completed by the operations made twice that are minimum necessary in the virtual ground type memory cell array.

The operation of this semiconductor integrated circuit device will be explained. In the virtual ground type memory cell, the drains and sources of the memory cells adjacent to one another in the word line direction are shared. Therefore, when the different voltages are applied to the drains and the sources as in the programming and reading operations, the drain voltage VD and the source voltage SS must be switched by the switch (select transistor). To program or read all the memory cells existing on one word line, therefore, the operations must be conducted at least twice. Assuming that the assist gates (AG00 and AG01) do not exist and that the drain voltage is applied to D02, for example, the drain voltage is applied to the drain of the memory cell on the left side of D02 and at the same time, the drain voltage is applied to the source of the memory cell on the right side, too. To bring the memory cell, to the source of which the drain voltage is applied, into the unselected state, the same voltage must be applied to the drain side (D03), too. Therefore, to program or read all the memory cells existing on one word line, the operations must be conducted four or more times and are not suitable for the high-speed operation. However, the semiconductor integrated circuit device of this embodiment includes the assist gates (AG00 and AG01). These assist gates (AG00 and AG01) play the role of the switch that applies the drain voltage to only the cell on the left side of D02 when the drain voltage is applied to D02. In other words, when the drain voltage is applied to D02, the assist gate (AG00) of the cell on the right side of D02 is turned OFF lest the drain voltage is applied to the cell on the right side of D02. Consequently, when all the cells existing on one word line are programmed or read out, the operation can be completed by the operations made twice that are minimum necessary in the virtual ground type memory cell array.

The mechanism of such assist gates is applied to the semiconductor integrated circuit device of this embodiment, too.

Figure 52A:
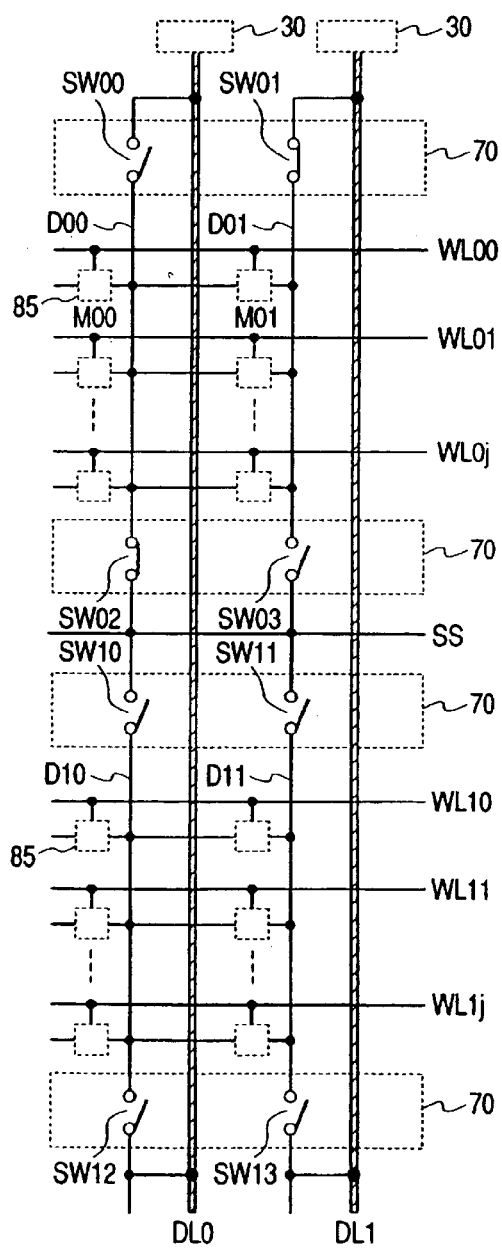
FIGS. 52A and 52B are circuit diagrams useful for explaining the necessity for the select transistor.
Figure 52B:
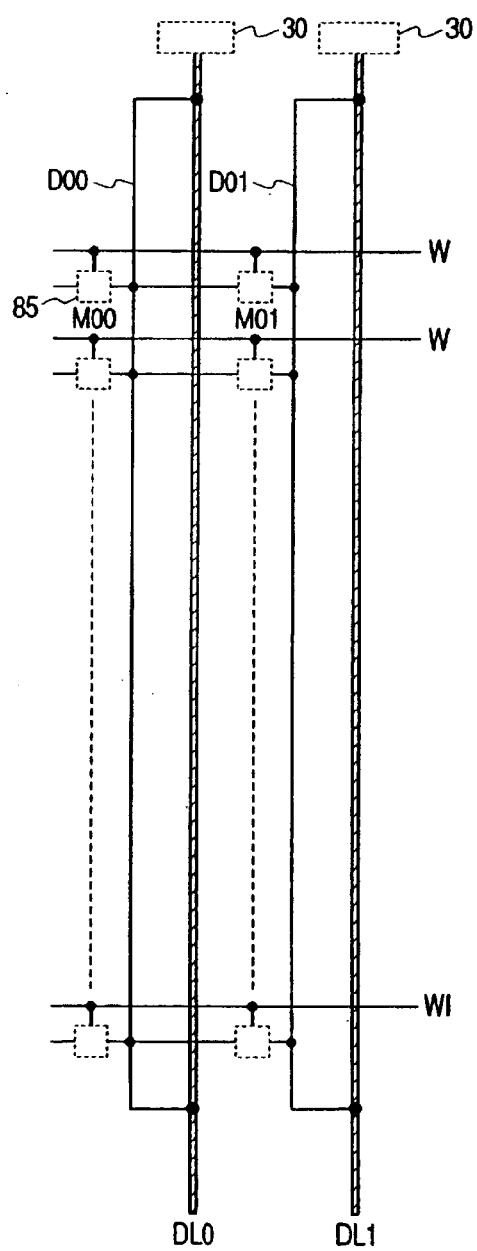

Next, the necessity for the select transistor will be explained with reference to FIG. 52. FIG. 52A shows a circuit diagram when the select transistor is disposed, and FIG. 52B shows a circuit diagram when it is not. In the semiconductor integrated circuit device shown in FIG. 52A, the drain/source (D00 to D11) of each memory cell comprises the diffusion layer wire and this circuit includes the select transistor for cutting off the diffusion layer wire of the selected block from that of the unselected block. When the circuit includes such a select transistor (FIG. 52A), the load of the diffusion layer wire can be reduced and the high-speed operation can be conducted. Because the number of the memory cells to which the drain voltage is applied, though they are the unselected memory cells (the memory cells existing on the unselected wore line) becomes smaller, the drain disturb can be reduced. In this way, this embodiment (and other embodiments, too) disposes the select transistor and obtains the effect described above. Though the explanation is given about the virtual ground type memory cell array sharing the drains/sources of the memory cells adjacent to one another in the word line direction, it of course holds true of other arrays.

This embodiment can accomplish pitch relaxation of the global word lines, hence pitch relaxation of the sense circuit, as described above.

This feature will be explained with reference to FIGS. 53 and 54.

In the semiconductor integrated circuit device shown in FIG. 53, the sense circuit connected to the global data line DL can be disposed not only on one of the sides of the memory cell array, but can be disposed alternately and above and below every other global data lines. In this way, the sense circuit 30 connected to the global data line DL can be disposed in the region of the four bits of the memory cells.

Figure 54:
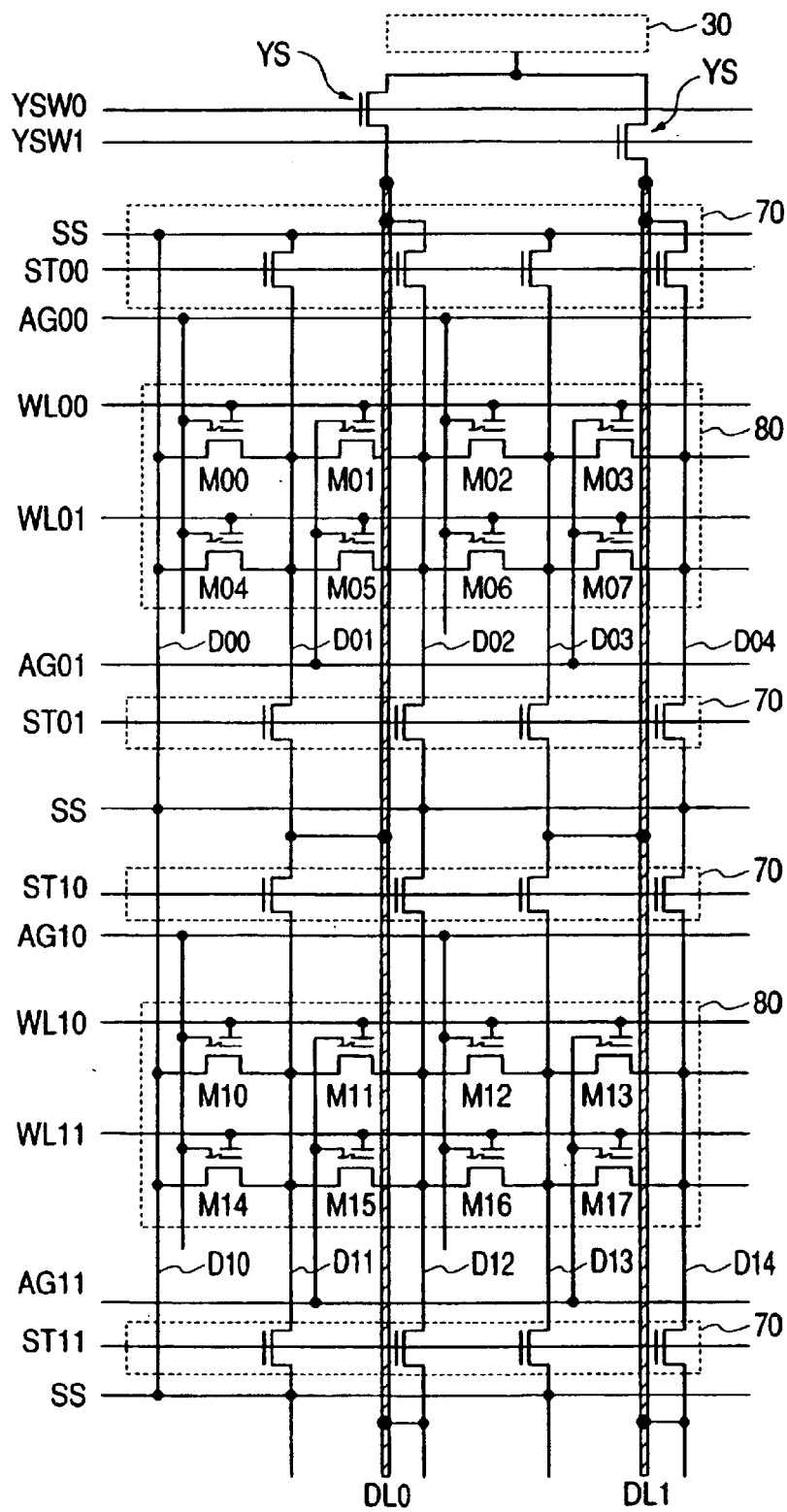
FIG. 54 is a circuit diagram useful for explaining pitch relaxation of the sense circuit.

In the semiconductor integrated circuit device shown in FIG. 54, switch MOS transistors YS are interposed between the sense circuits 30 connected to the global data lines DL so that one sense circuit can be used in common by two global data lines DL. In this way, the sensor circuit 30 connected to the global data lines DL can be disposed in the region of the four bits of the memory cells.

Figure 53:
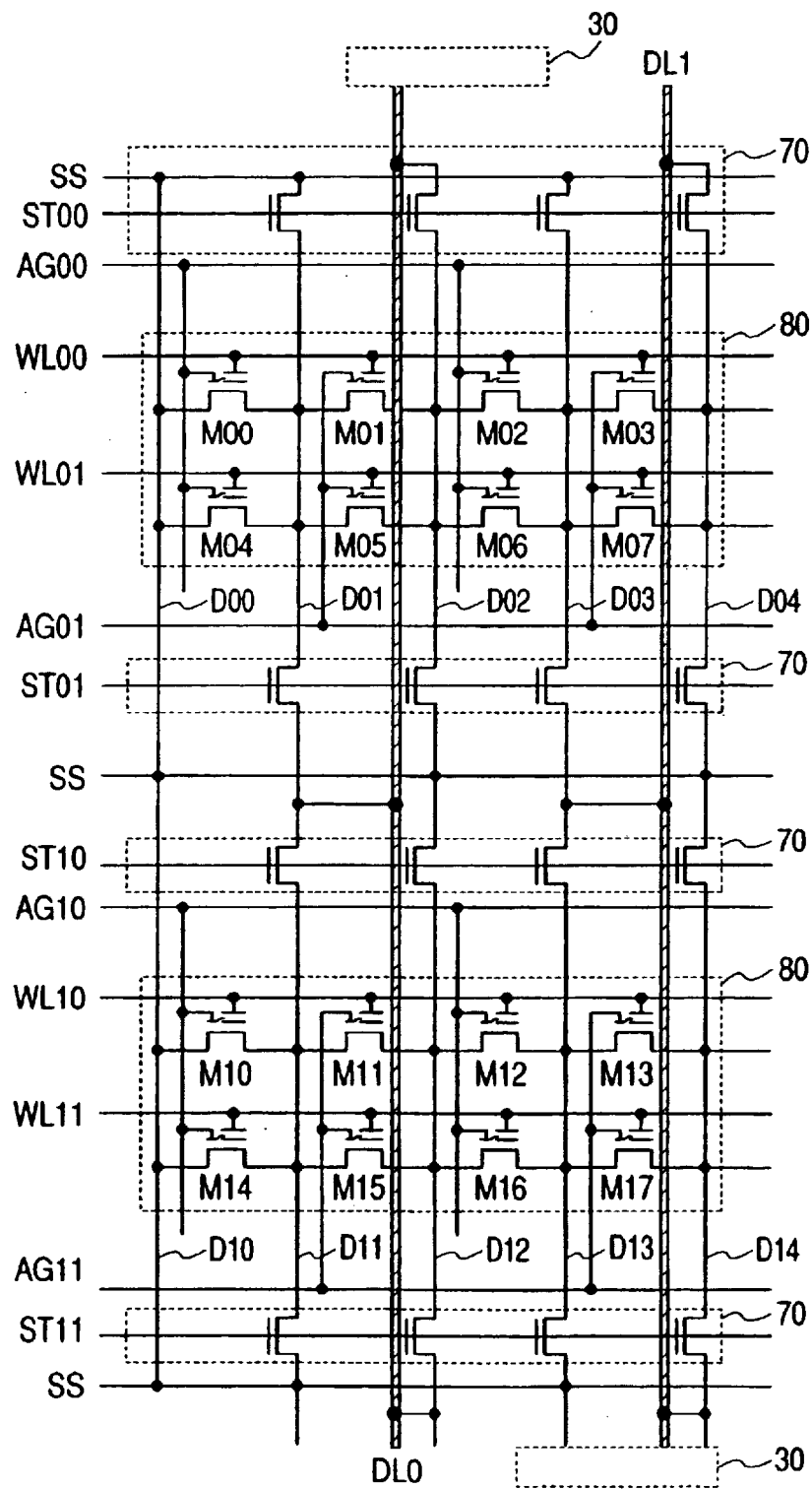
FIG. 53 is a circuit diagram useful for explaining pitch relaxation of a sense circuit.

When the systems shown in FIGS. 54 and 53 are combined, the sense circuit 30 connected to the global data line DL can be disposed in the region of the eight bits of the memory cells.

[Embodiment 8]

Figure 55:
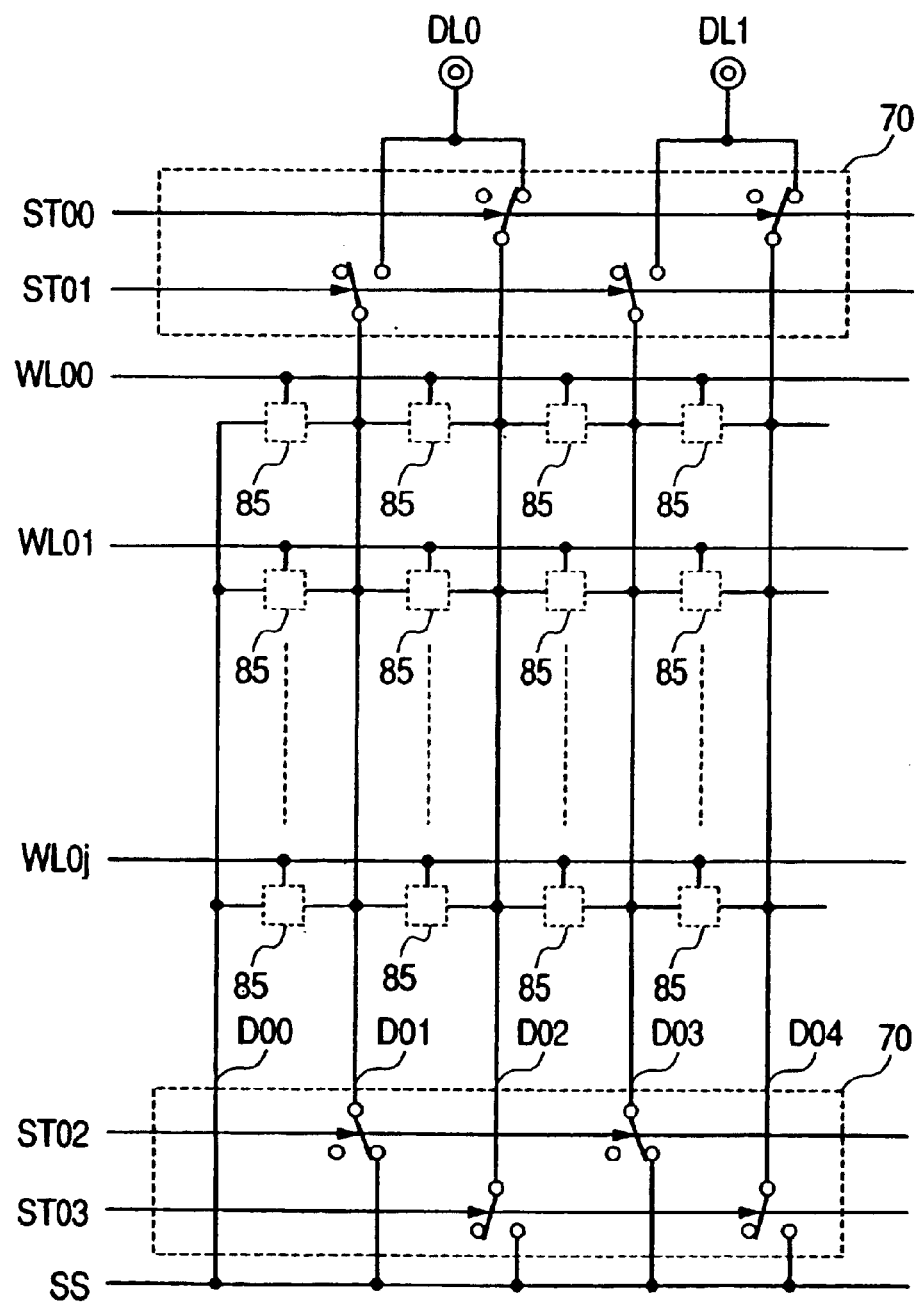
FIG. 55 is a circuit diagram showing conceptually an example of the semiconductor integrated circuit device according to Embodiment 8 of the present invention.

FIG. 55 is a circuit diagram showing conceptually an example of the semiconductor integrated circuit device according to Embodiment 8 of the present invention.

The semiconductor integrated circuit device of this embodiment is different from Embodiment 7 in the arrangement of the select transistors and their operation, but the memory cells remain unchanged from that of Embodiment 7.

Therefore, the explanation of the memory cell 85, the memory cell array 80, the memory block, the diffusion layer wires D00 to D04 and the word lines WLn are the same as those of Embodiment 7 and will be hereby omitted. One each select transistor (select MOS) 70 is disposed at the upper and lower ends of each diffusion layer wire D01 to D40 and the drain of the select transistor 70 is connected to the diffusion layer wires D11 to D04 in the same way as in Embodiment 7. When the source of the select transistor 70 is connected to the global data line DLn at the upper end of the diffusion layer wire Dn (D01 to D04), however, the source of the select transistor 70 at the lower end is connected to the source line SS. When it is connected to the source line SS at the upper end of the diffusion layer wire Dn (D01 to D04), the source of the select transistor 70 is connected to the global data line DLn at the lower end. In other words, the sources are unified inside the block unlike the arrangement of Embodiment 7 wherein the source is disposed repeatedly for every other diffusion layer wires Dn.

The same signal is inputted to the gates of the select transistors 70 adjacent to one another in the word line direction (x direction) for every other diffusion layer wires, and different signals are applied between the diffusion layer wires adjacent to one another. Four gate wires ST00 to ST03 are disposed for each block. Two diffusion layer wires Dn use in common one global data line DLn.

In such a construction of the select transistors, the gate signal of the select transistor comprises for gate wires for each block, and the application timing of the source voltage and the application timing of the drain voltage can be set arbitrarily. In other words, since the drain voltage can be applied after the source voltage reliably reaches 0 V, the stable operation can be conducted. Since two diffusion layer wires use in common one global data line, the arrangement of the global data line and the sense circuit connected to the former becomes easier (or the pitch can be relaxed). To program or read all the memory cells existing on one word line, the operation can be completed by two operations that are minimum necessary in the virtual ground type memory cell array.

Figure 56:
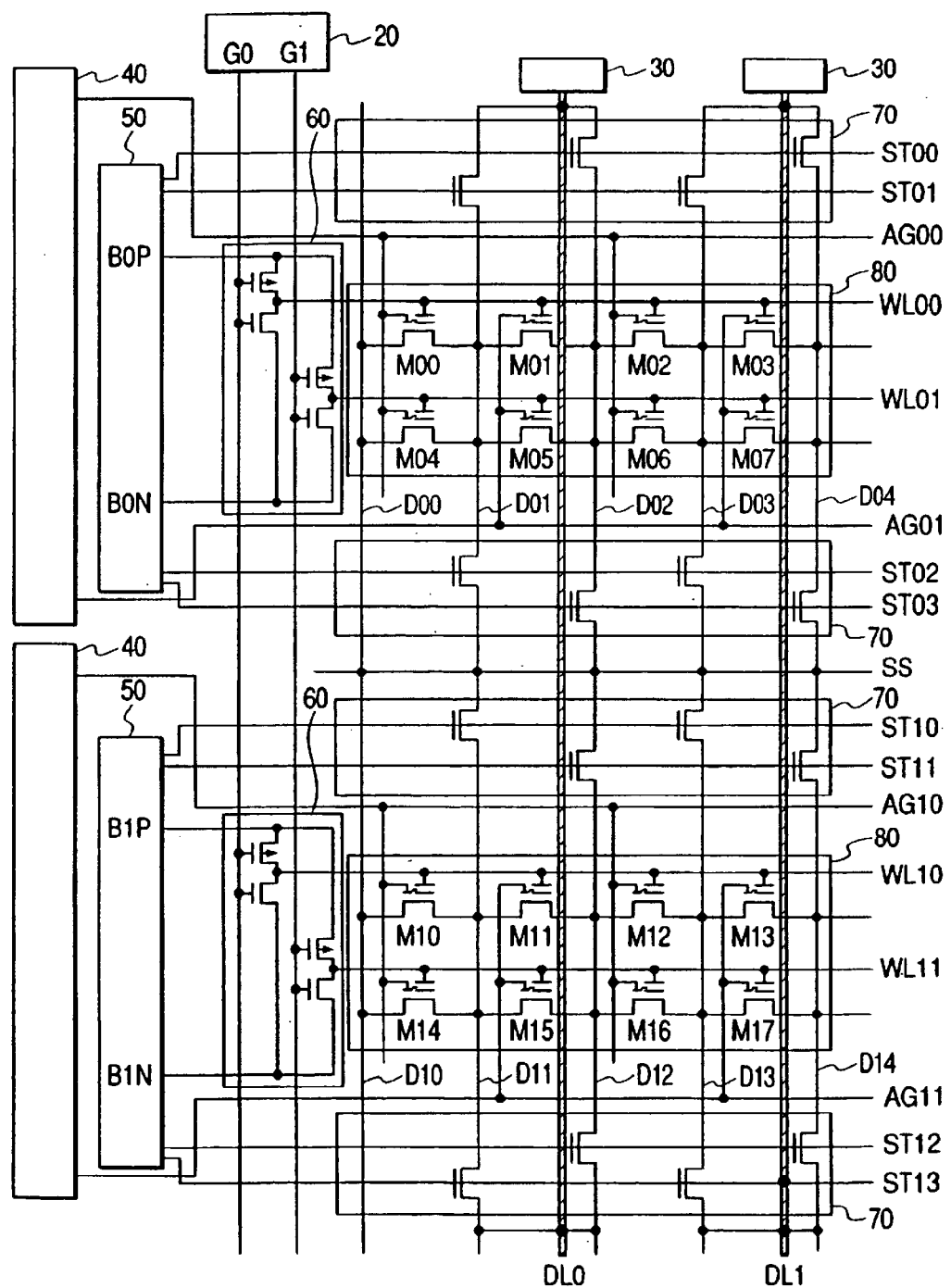
FIG. 56 is a circuit diagram showing the arrangement of a memory cell array, a block decoder, a sub-decoder, etc, of Embodiment 8.
Figure 57:
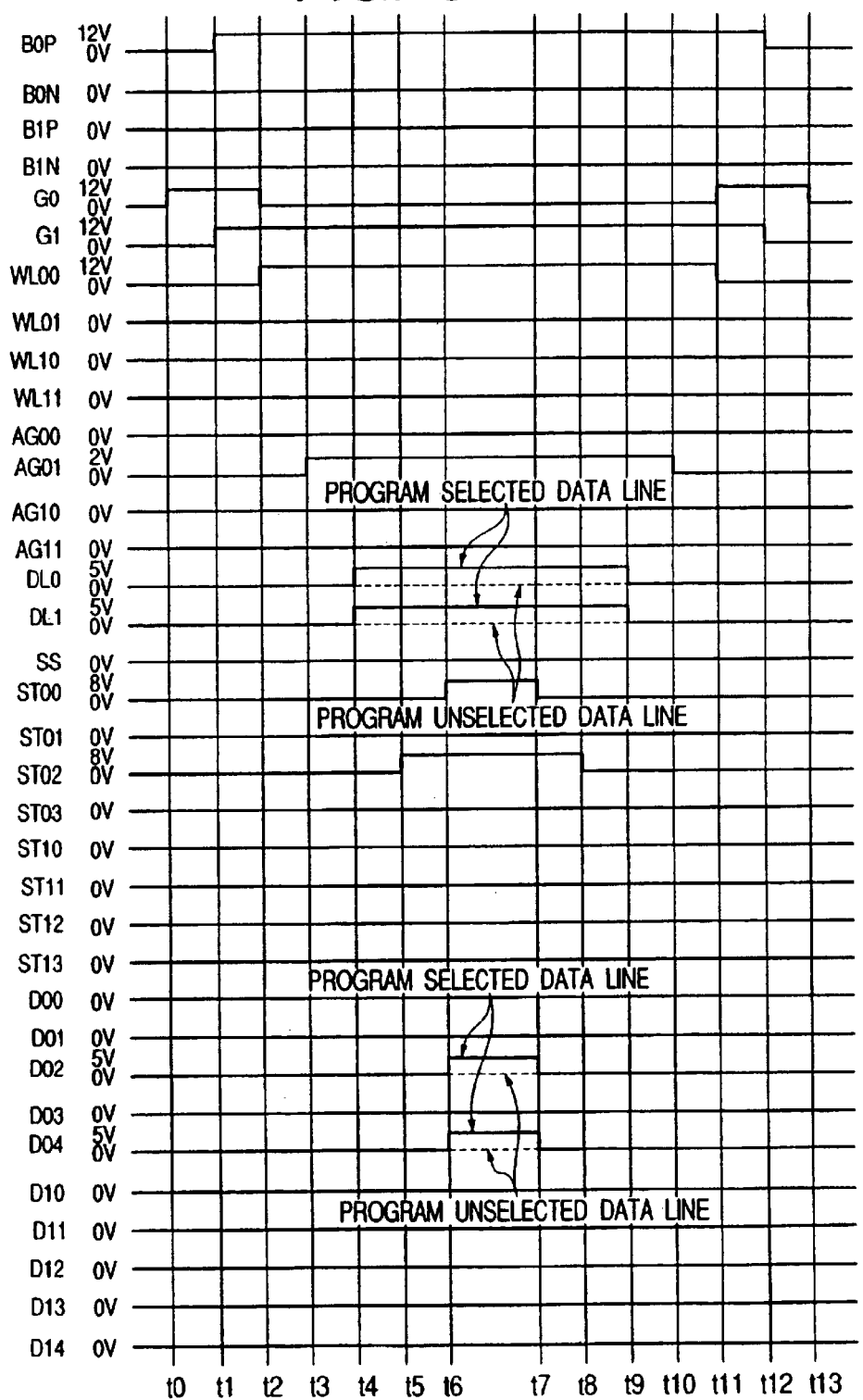
FIG. 57 is a timing chart useful for explaining a programming operation in the semiconductor integrated circuit device having a select transistor structure according to Embodiment 8.
Figure 58:
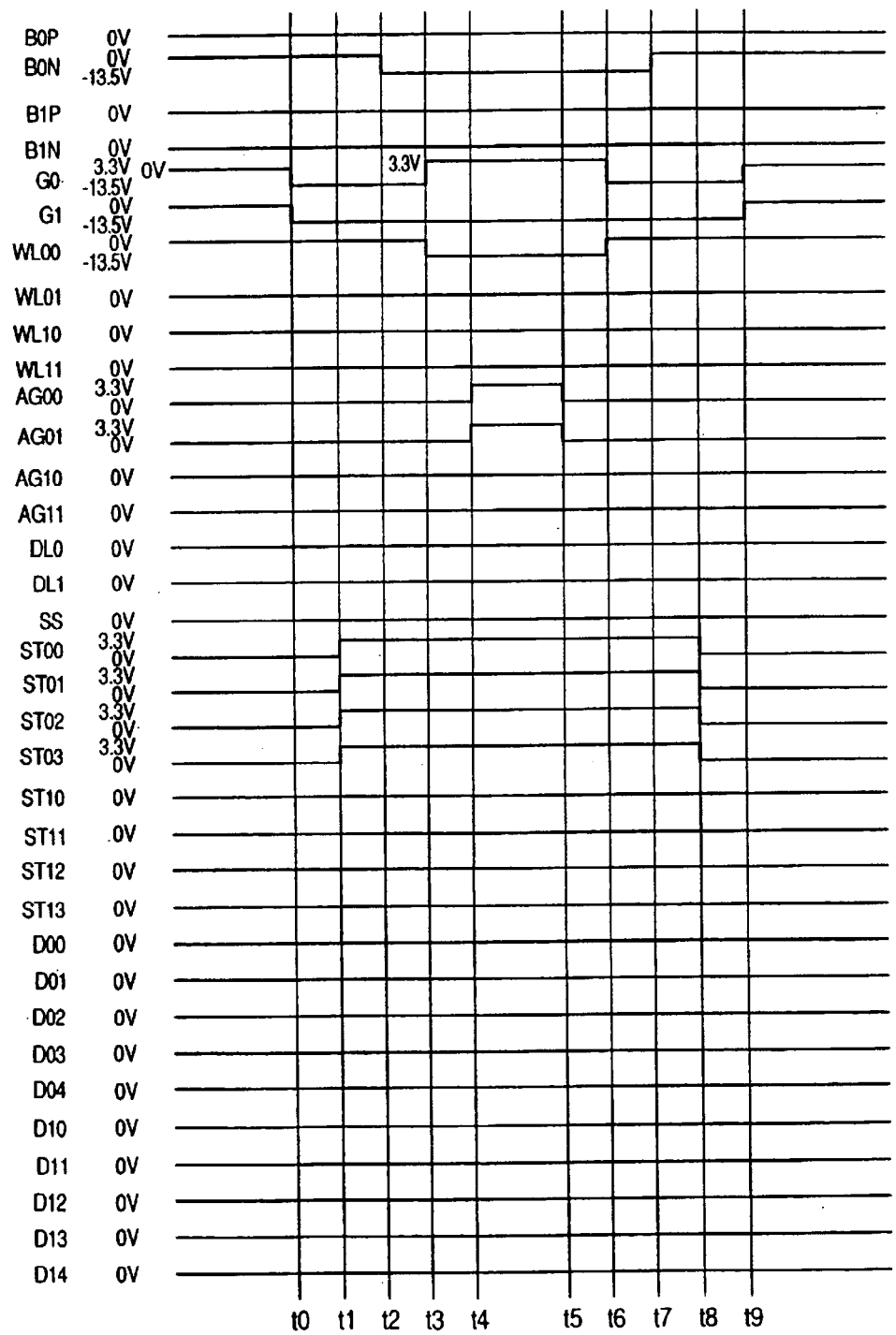
FIG. 58 is a timing chart useful for explaining an erasing operation in the semiconductor integrated circuit device having the select transistor structure according to Embodiment 8.
Figure 59:
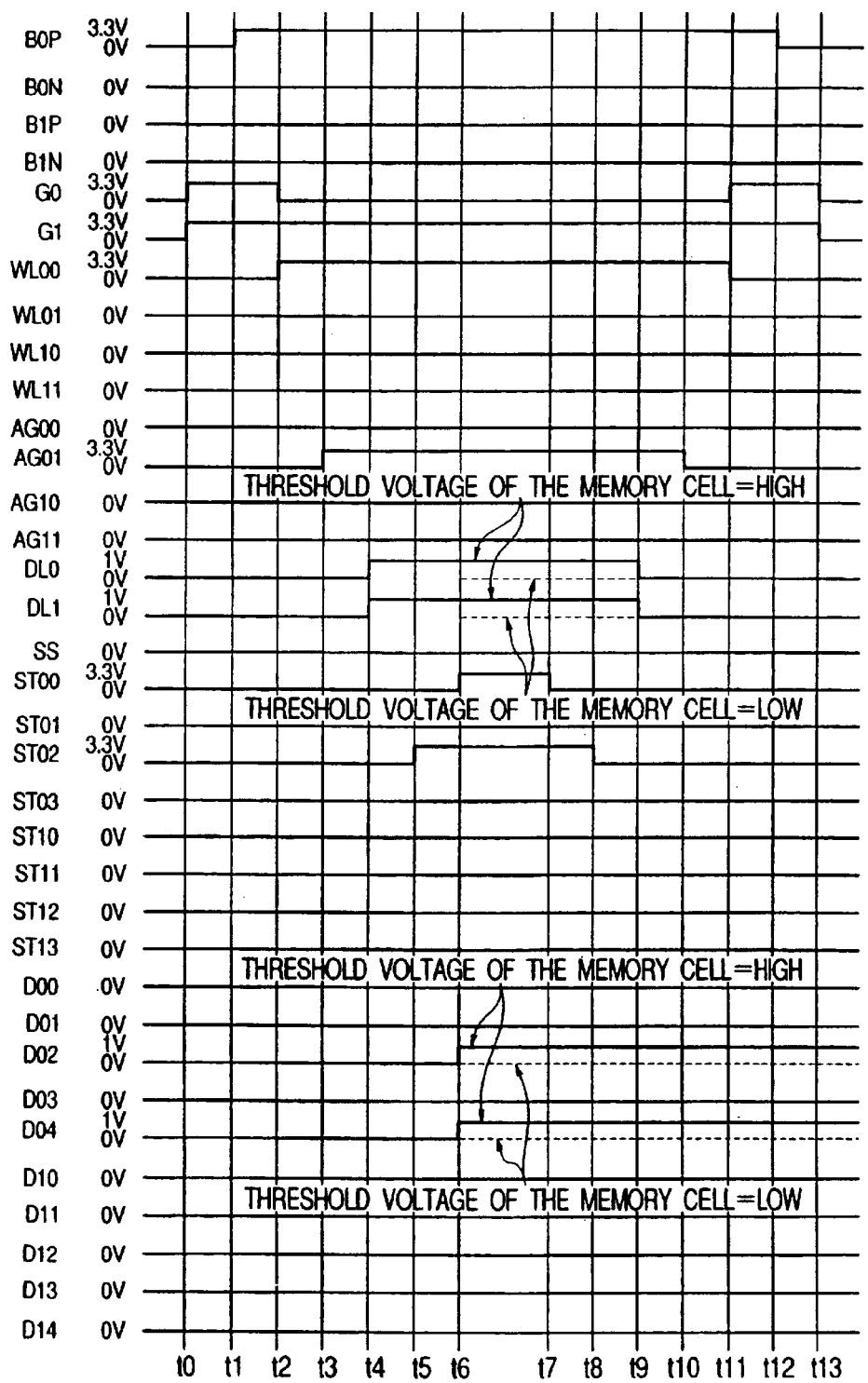
FIG. 59 is a timing chart useful for explaining a reading operation in the semiconductor integrated circuit device having the select transistor structure according to Embodiment 8.

The semiconductor integrated circuit device of this embodiment will be explained hereinafter with reference to a detailed circuit diagram and operation timing charts. FIG. 56 is a circuit diagram showing the arrangement of memory cell arrays, block decoders, sub-decoders, etc, of Embodiment 8. In FIG. 56, the memory cells of Embodiments 2 to 4, in which the third gates 107a (AG) function also as the assist gate, are applied to the memory cell construction of this embodiment. FIGS. 57 to 59 are timing charts useful for explaining the programming, erasing and reading operations of the semiconductor integrated circuit device having the select transistor construction of this embodiment. Incidentally, FIG. 56 shows a memory cell array 80 for two blocks, and word lines WL in one block is two while the global data line DL is two. The sub-decoder 60 has an inverter construction but is not limited thereto, in particular.

In the semiconductor integrated circuit device of this embodiment shown in FIG. 56, the memory cell array 80, the assist gate decoder 40, the block decoder 50, the sub-decoder 60, the gate decoder 20, the select transistor 70, the sense circuit 30 and the word decoder are the same as those of Embodiment 7. The arrangement in which the sub-decoders 60 can be so disposed as to sandwich the cell array 80 and which can thus achieve pitch relaxation of the sub-decoder is also the same as that of Embodiment 7. Further, two diffusion layer wires share one global data line DL and pitch relaxation of the data line can be achieved, in the same way as in Embodiment 7. Incidentally, the sense circuit 30 connected to the global data line DL can relax the pitch by the method explained with reference to FIGS. 53 and 54.

Each block in this embodiment is disposed symmetrically with respect to the X axis (word line formation direction). In this way, two block share one source line SS and the formation area of the memory cell array 80 can be reduced.

In this embodiment, the gate signals of the select transistors 70 aligned in the word line direction are different for every other diffusion layer wire, and each block comprises four word lines.

Therefore, the application timing of the source voltage and the application timing of the drain voltage can be set arbitrarily. Since the drain voltage can be applied after the source voltage reaches reliably 0 V, the stable operation becomes possible. When all the memory cells existing on one word line are programmed or read out, each operation can be completed by the operations made twice, that are minimum necessary in the virtual ground type memory cell array 80, as will be explained in detail in the paragraph of the explanation of the operation.

FIG. 57 shows the timing of the programming operation, and the programming operation will be explained. The memory cells as the programming object are assumed to be M01 and M03. First, the initial voltage of all the signals is 0 V.

Next, the output signals G0 and G1 of the gate decoder 20 are set to 12 V at the timing t0, and all the word lines WL00 to WL 11 are reliably set to 0 V.

Next, the PMOS power source BOP of the sub-decoder 60 in the selected block is set to 12 V at the timing t1.

The output signal G0 of the gate decoder 20 is set to 0 V at the timing t2.

In consequence, the selected word line WL00 inside the selected block is 12 V, the unselected word line WL01 is 0 V and the word lines WL10 and WL11 inside the unselected block are 0 V.

The output signal AG01 of the assist gate decoder 40 is set to 2 V at the timing t3 and 2 V is applied to the assist gate of the memory cell as the programming object.

Next, a voltage is applied from the sense circuit 30 to the global data lines DL0 and DL1 at the timing t4 depending on the data that is to be programmed. When the data is to be programmed to the memory cell M01, for example, the global data line DL0 is set to 5 V. When the data is not programmed, it is set to 0 V. When the data is to be programmed to the memory cell M03, the global data line DL1 is set to 5 V. When the data is not programmed, it is set to 0 V.

The gate signal ST00 of the select transistor 70 is set to 8 V at the timing t6. In consequence, the voltages corresponding to the data to be programmed are applied to the drains D02 and D04 of the memory cells M01 and M03 as the programming object. When the program data is to be programmed to the memory cell M01, for example, 5 V is applied to the drain D02 and when the data is not programmed, 0 V is applied When the program data is to be programmed to the memory cell M03, 5 V is applied to the drain D04 and when it is not programmed, 0 V is applied. The program voltages are applied to the memory cells M01 and M03 as the programming object under this state, and arbitrary data are programmed.

To complete the programming operation, the gate signal ST00 of the select transistor 70 is set to 0 V at the timing t7. Consequently, the drains D02 and D04 of the memory cells M01 and M03 as the programming object are set to 0 V.

Next, the gate signal ST02 of the select transistor 70 is set to 0 V at the timing t8.

The global data lines DL0 and DL1 are set to 0 V at the timing t9.

The output signal AG01 of the assist gate decoder 40 is set to 0 V at the timing t10 and the assist gate of the memory cell as the programming object is set to 0 V.

The output signal G0 of the gate decoder 20 is set to 12 V at the timing t11. In consequence, the selected word line WL00 inside the selected block changes to 0 V.

Next, the PMOS power source BOP of the sub-decoder 60 is set to 0 V at the timing t12.

Finally, the output signals G0 and G1 of the gate decoder 20 are set to 0 V at the timing t13 and the programming operation is completed.

When the programming operation is conducted for the memory cells M01 and M03 in this embodiment, the gate signal ST02 of the select transistor 70 is first raised and then ST00 is raised. Therefore, the drain voltage is applied after the source voltages of the memory cells M01 and M03 reach reliably 0 V. Therefore, the operation can be conducted stably.

When the programming operation is conducted to the memory cells M01 and M03 in this embodiment, the programming voltage is applied during the period t6 to t7 in which the gate signal ST00 of the select transistor 70 reaches 8 V. The gate signal ST00 of this select transistor 70 is the signal for controlling the drain voltage of the memory cell. Therefore, since the application time of the drain voltage is the shortest among the word line voltage, the assist gate voltage and the drain voltage to be applied to the selected memory cell in this embodiment, the system of this embodiment can be said as most optimal for relaxing drain disturb. As to the application timing of the word line voltage, the assist gate voltage and the drain voltage to be applied to the selected drain memory cell, various variations are possible as explained in Embodiments 1 to 6, and they have respective features. Therefore, this system is not particularly restrictive.

When programming is conducted to the memory cells M00 and M02, too, and to all the memory cells on one word line, the programming operation described above may be repeated for M00 and M02. To program all the memory cells existing on word line WL in this way in this embodiment, the operation can be completed when the operations are conducted twice. Therefore, when the programming operation is repeated twice, the sector (1 word line) operation that takes the programming unit=erasing unit=reading unit into account can be done. The page operation that does not repeat the programming operation but divides the programming unit into the ½ sector (½ word line) is also feasible.

Incidentally, the voltage values used in this embodiment are merely illustrative but in no way restrictive.

Next, FIG. 58 shows the timing of the erasing operation, and the erasing operation will be explained with reference to this drawing. The memory cells as the erasing object are assumed to be M01 to M03 existing on the word line WL00. First the initial voltages are all set to 0 V.

The output signals G0 and G1 of the gate decoder 20 are set to −13.5 V at the timing t0 and all the word lines WL00 to WL11 are set reliably to 0 V.

The gate signals ST00 and ST01 of the select transistor 70 are set to 3.3 V at the timing t1, and the drains/sources D00 to D04 of the memory cells M01 to M03 as the erasing object are reliably set to 0 V.

Next, the NMOS power source BON of the sub-decoder 60 in the selected block is set to −13.5 V at the timing t2.

The output signal G0 of the gate decoder 20 is set to 3.3 V at the timing t3. In consequence, the selected word line WL00 inside the selected block is 13.5 V and its unselected word line WL01 is 0 V, while the word lines WL10 and WL11 inside the unselected block are 0 V.

The output signals AG0 and AG01 of the assist gate decoder 40 are set to 3.3 V at the timing t4, and 3.3 V is applied to the assist gate of the memory cell as the erasing object. The erasing voltage is applied to the memory cells M0 to M03 as the erasing object, and the data is erased.

To complete the erasing operation, the output signals AG00 and AG01 of the assist gate decoder 40 are set to 0 V at the timing t5, and the assist gates of the memory cells as the erasing object are set to 0 V.

Next, the output signal G0 of the gate decoder 20 is set to −13.5 V at the timing t6. In consequence, all the word lines WL00 to WL11 are set to 0 V.

Next, the NMOS power source BON of the sub-decoder 60 in the selected block is set to 0 V at the timing t7.

The gate signals ST00 and ST01 of the select transistor 70 are then set to 0 V at the timing t8.

Finally, the output signals G0 and G1 of the gate decoder 20 are set to 0 V at the timing t9, and the erasing operation is finished.

To erase the memory cells M01 to M03 in this embodiment, the erasing voltage is applied during the period t4 to t5 in which the assist gate signals G00 and AG01 reaches 3.3 V. In this embodiment, the application time of the assist gate voltage is shorter among the word line WL voltage and the assist gate voltage applied to the selected memory cell. Therefore, this system can be said as most optimal for relaxing disturb of the assist gate for the memory cell connected to the unselected word line.

In this embodiment, the erasing voltage is applied during the period t4 to t5 in which the assist gate signals AG00 and AG01 reach 3.3 V. Therefore, the erasing time is determined by the fall and rise of the voltage of the assist gate signals. Since the voltage switching width of the assist gate signals is as small as 3.3 V, the rise and fall time is fast. Therefore, this system can be said as the system that is excellent in controllability of the erasing time. As to the timing of the word line WL voltage and the assist gate voltage applied to the selected memory cell, however, other variations are possible as explained in Embodiments 1 to 6, and they have respective features. Therefore, the present system is in no way restrictive.

To erase the memory cells M0 to M03 in this embodiment, the gate signals ST00 to ST03 of the select transistor 70 inside the selected block and the assist gate signals AG00 to AG01 are operated simultaneously.

Therefore, all the memory cells existing on one word line can be erased by the operation made one time, and the sector (1 word line) operation that takes the programming unit=erasing unit=reading unit into account becomes feasible.

Incidentally, the voltage values used in this embodiment are merely illustrative but in no way restrictive.

FIG. 59 shows the timing of the reading operation, and the reading operation will be explained. The memory cells as the reading object are assumed to be M01 and M03.

First, the initial voltages of all the signals are set to 0 V. The output signals G0 and G1 of the gate recorder 20 are set to 3.3 V at the timing t0 and all the word lies WL00 to WL11 are set reliably to 0 V.

Next, the PMOS power source BOP of the sub-decoder 60 in the selected block is set to 3.3 V at the timing t1.

The output signal G0 of the gate decoder 20 is then set to 0 V at the timing t2.

Consequently, the selected word line WL00 inside the selected block is 3.3 V, the unselected word line WL01 is 0 V, and the word lines WL10 and WL11 inside the unselected block are 0 V.

Next, the output signal AG01 of the assist gate decoder 40 is set to 3.3 V at the timing t3, and 3.3 V is applied to the assist gate of the memory cell as the reading object.

1 V is then applied from the sense circuit 30 to the global data lines DL0 and DL1 at the timing t4.

The gate signal ST02 of the select transistor 70 is set to 3.3 V at the timing t5, and the sources D01 and D03 of the memory cells M01 and M03 as the reading object are set reliably to 0 V.

The gate signal ST00 of the select transistor 70 is set to 3.3 V at the timing t6. The reading voltage is applied under this state to the memory cells M01 and M03 as the reading objects and the data is read out. When the threshold value of the memory cell M01 as the reading object is low at this time, the memory cell M01 is turned ON and the current flows. As a result, the drain D02 of the memory cell M01 and the global data line DL0 connected to the former change to 0 V. When the threshold value of the memory cell M01 as the reading object is high, the memory cell M01 is turned OFF and no current flows. Therefore, D02 of the memory cell M01 and the global data line connected to the former are kept at 1 V. In the memory cell M03 as the reading object, too, the memory cell M03 is turned ON when its threshold value is low, and the current flows. As a result, the drain D04 of the memory cell M03 and the global data line DL1 connected to the former turn to 0 V.

When the threshold value of the memory cell M03 as the reading object is high, the memory cell M03 is turned OFF and no current flows. Therefore, D04 of this memory cell M03 and the global data line DL1 connected to the former are kept at 1 V.

The sense circuit 30 discriminates the voltage change or the current change of this global data line DL, and the reading operation is conducted.

To complete the reading operation, the gate signal ST00 of the select transistor 70 is first set to 0 V at the timing t7. In consequence, the drains D02 and D04 of the memory cells M01 and M03 as the reading object are cut off from the sense circuit 30.

Next, the gate signal ST02 of the select transistor is set to 0 V the timing t8.

The global data lines DL0 and DL1 are then set to 0 V at the timing t9.

The output signal AG01 of the assist gate decoder 40 is set to 0 V at the timing t10, and the assist gate of the memory cell as the reading object is set also to 0 V.

Next, the output signal G0 of the gate decoder 20 is set to 3.3 V at the timing t11 with the result that the selected word line WL00 inside the selected block changes to 0 V.

The PMOS power source BOP of the sub-decoder 60 in the selected block is set to 0 V at the timing t12.

Finally, the output signals G0 and G1 of the gate decoder 20 are set to 0 V at the timing t13, and the reading operation is completed.

When the memory cells M01 and M03 are read in this embodiment, ST00 is raised after the gate signal ST02 of the select transistor 70 is raised. Therefore, the drain voltage is applied after the source voltages of the memory cells M01 and M03 reach reliably 0, and the stable operation can be conducted.

When the memory cells M01 and M03 are read in this embodiment, the reading voltage is applied during the period t6 to t7 in which the gate signal ST00 of the select transistor 70 reaches 3.3 V. The gate signal ST00 of the select transistor 70 is the signal for controlling the drain voltage of the memory cell. In this system, therefore, the application time of the drain voltage is the shortest among the word line voltage, the assist gas voltage and the drain voltage to be applied to the selected memory cell. For this reason, this system can be said as most optimal for relaxing drain disturb. As to the timing of the word line voltage, the assist gate timing and the drain voltage to be applied to the selected memory cell, however, various variations are available as explained in Embodiments 1 to 6 and they have respective features. Therefore, this system is in no way restrictive.

When the memory cells M00 and M02 are also read to read all the memory cells on one word line, the reading operation described above is similarly repeated for the memory cells M00 and M02.

To read all the memory cells existing on one word line, this embodiment needs the operations to be made twice. Therefore, when the reading operations are repeated twice, the sector (1 word line) operation that takes the programming unit=erasing unit=reading unit into account becomes feasible. The page operation that does not repeat the reading operation but sets the reading unit to the ½ sector (½ word line) can be conducted, too. Incidentally, the voltage values used in this embodiment are illustrative but in no way restrictive.

[Embodiment 9]

FIG. 9 is a circuit diagram showing the semiconductor integrated circuit device according to Embodiment 9 of the present invention. This embodiment explains an example of the decoder arrangement. Incidentally, the memory cell array 80, the assist gate 40, the block decoder 50, the sub-decoder 60, the gate decoder 20, the select transistor 70 and the sense circuit 30 are the same as those of Embodiments 7 and 8, and their explanation will be omitted.

In this embodiment, one each of the block decoder 50 and the assist gate decoder 40 is disposed on one of the sides of the memory cell array 80. Since the assist gate signals inside one block are two, the operation needs be repeated twice to program or read all the memory cells existing on one word line.

Figure 60:
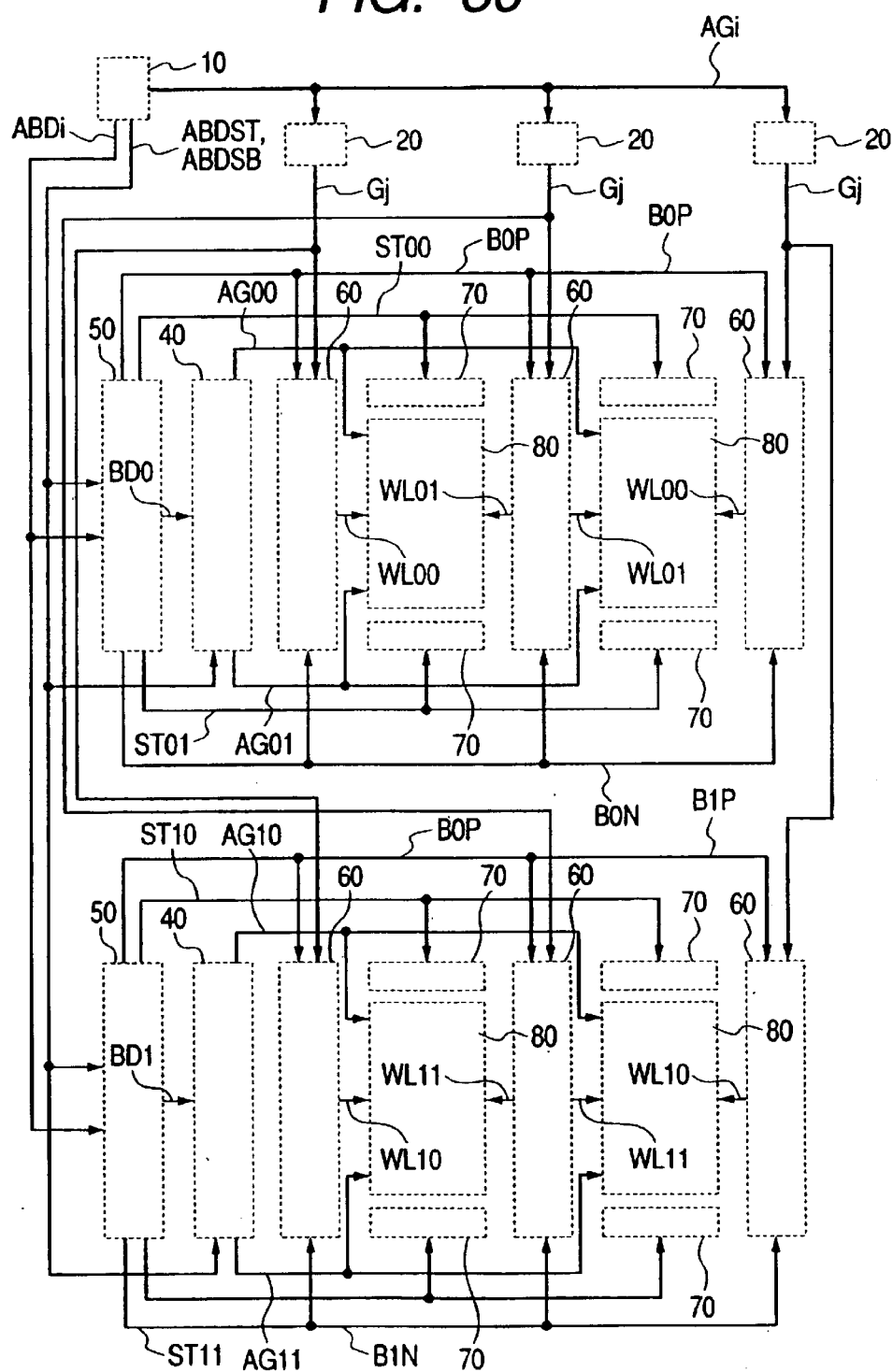
FIG. 60 is a circuit diagram showing a semiconductor integrated circuit device according to Embodiment 9.

FIG. 60 shows the circuit diagram of two blocks for ease of explanation. In the semiconductor integrated circuit device of this embodiment, the memory cell array 80 inside one block is divided into two parts, and the sub-decoders 60 are so disposed as to interpose the memory cell array. Needless to say, the number of division of the memory cell array 80 is not limited to two, in particular.

The sub-decoders 60 are disposed on both sides of the memory cell array, and the assist gate decoder 40, the block decoder 50 and the sub-decoder 60 are disposed in the extending direction of the word line.

The assist gate signals inside one block are two, that is, AG00 and AG01 or AG10 and AG11. The gate signals of the select transistor 70 inside one block are two, that is, ST00 and ST01 or ST10 and ST11.

The PMOS power source signal BOP or BIP and the NMOS power source signal BON or BIN that are the output signals of the block decoder 50 generate the address select signal ABDi for selecting the block as the input signal.

The gate signals ST00 and ST01 or ST10 and ST11 of the select transistor 70 generate the address select signal ABDi for selecting the block and the address signal ABDST or ABDSB for halving further the block as the input signals.

The assist gate signals AG00 and AG01 or AG10 and AG11 generate the block select signal BD0 or BD1 and the address select signal ABDST or ABDSB for halving further the block as the input signals.

The input signal to the assist gate decoder 40 uses the block select signal BD0 or BD1 generated inside the block decoder 50, and the assist gate decoder 40 is disposed adjacent to the block decoder 50.

The assist gate decoder 40 and the block decoder 50 are disposed on either the right side or the left side of the memory cell array (on the left side in FIG. 60) but their positional relationship may be reversed.

Since various variations are available for selecting the assist gate decoder 40 and the block decoder 50 as will be described later, the flow of each signal need not be limited to this embodiment.

This embodiment halves the memory cell array 80 inside one block and disposes the sub-decoders 60 in such a manner as to interpose the memory cell array 80. Therefore, this embodiment can reduce the length of the word line as well as its load, and can improve the operation speed of the semiconductor integrated circuit device.

Since the sub-decoders 60 are disposed on both sides of the memory cell array 80, the word lines inside the memory cell array 80 connected to the sub-decoder 60 may be assorted to the right and left of the memory cell array 80 and every other word lines may be taken out. This arrangement makes the layout design at the junction portions between the word lines and the sub-decoders 60 easier (or can relax the word line pitch).

Since the sub-decoders 60 are disposed on both sides of the memory cell array 80, the sub-decoder elements can be disposed in the region corresponding to two word lines, and the layout design of the sub-decoders 60 becomes easier.

Only one each of the assist gate decoder 40 and the block decoder 50 is disposed for one block. Therefore, the area of the decoder can be reduced to minimum.

Since the assist gate decoder 40 and the block decoder 50 are adjacent to each other, the output signals BD0 and BD1 of the block decoder 50 as the input to the assist gate decoder 40 need not be extended far.

Since two assist gate signals exist in one block, the operation needs be repeated only twice to program or read all the memory cells existing on one word line, and this number of times is the minimum necessary number of times required for the virtual ground type memory cell array.

Figure 61:
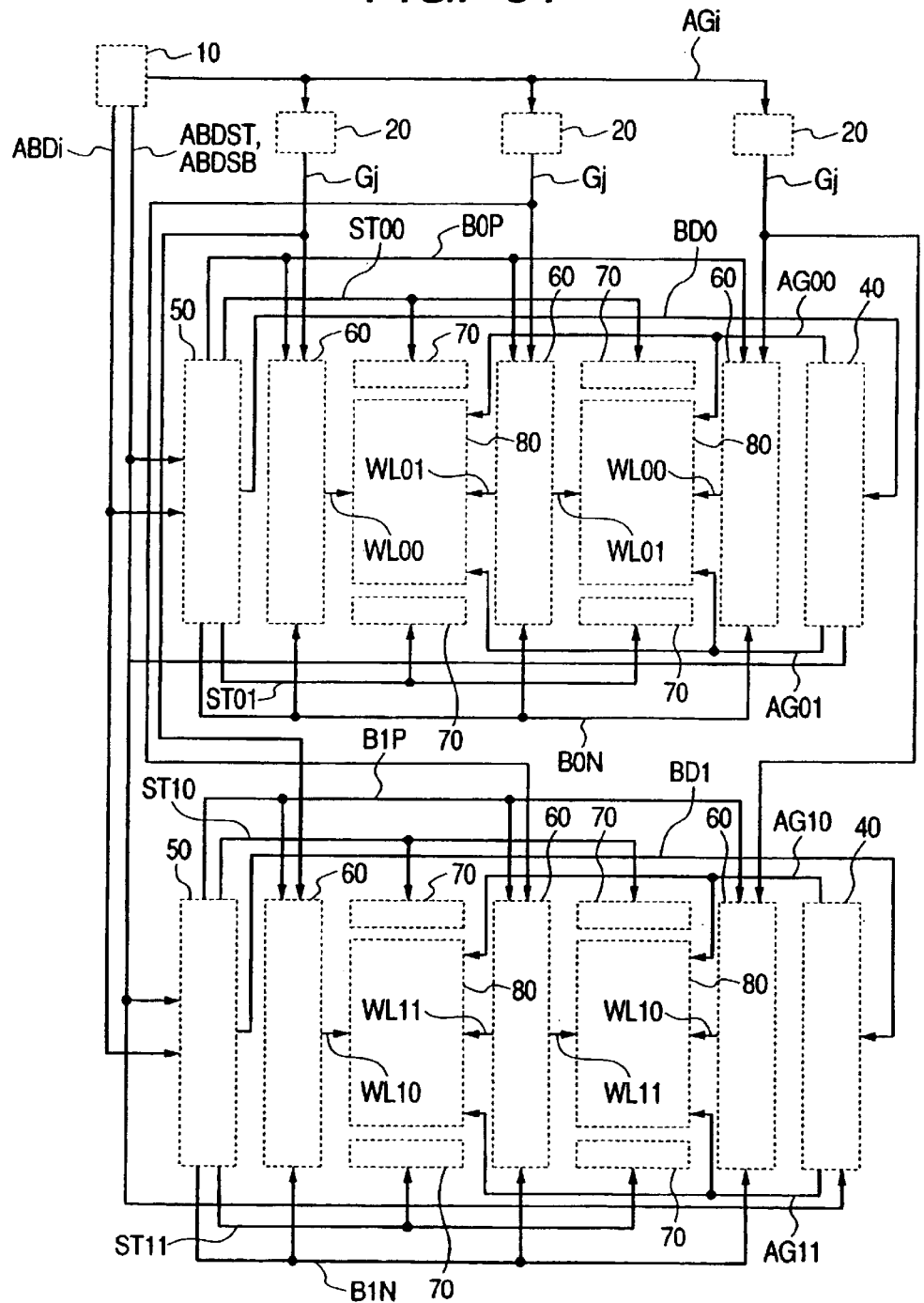
FIG. 61 is a circuit diagram showing another example of the semiconductor integrated circuit device of Embodiment 9.
Figure 62:
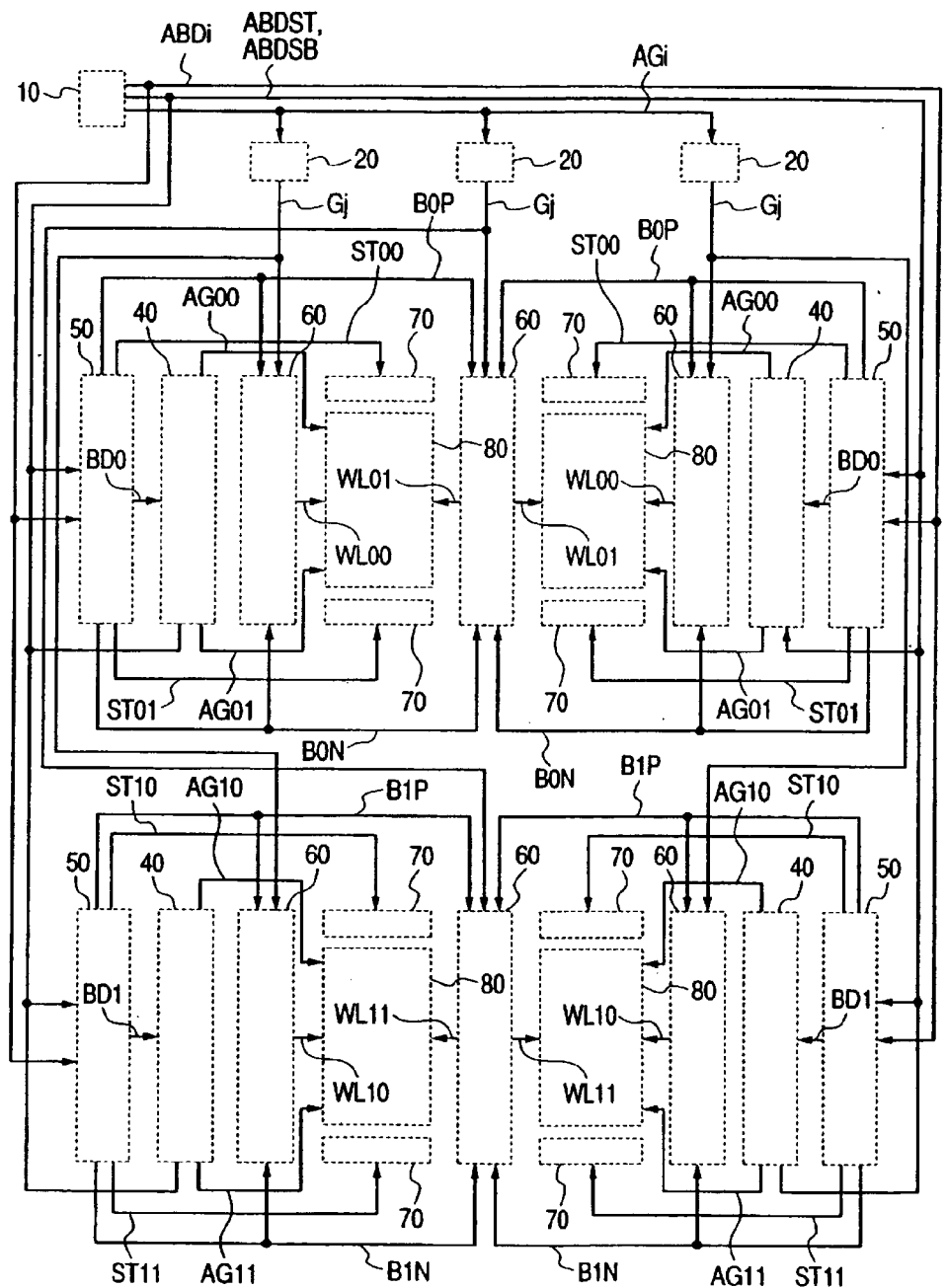
FIG. 62 is a circuit diagram showing still another example of the semiconductor integrated circuit device of Embodiment 9.

Besides the arrangement described above, the arrangement of the decoders may be the one shown in FIG. 61 or 62.

In the semiconductor integrated circuit device shown in FIG. 61, one each of the block decoder 50 and the assist gate decoder 40 is disposed on the opposite side while interposing the memory cell array 80, and the rest of the construction is the same as those shown in FIG. 60.

This semiconductor integrated circuit device provides the following effect in addition to the effects described above. The output signals (AG00 to AG11) of the assist gate decoder 40 need be wired to the memory cell array 80 and the output signals (ST00 to ST11) of the block decoder need be wired to the select transistors. However, since the assist gate decoder 40 and the block decoder 50 are disposed on the opposite side to each other while interposing the memory cell array 80 between them, the output signals (ST00 to ST11) of the block decoder 50 need not be extended onto the assist gate decoder 40 or the output signals (AG00 to AG11) of the assist gate decoder 40 need not either be extended onto the block decoder 50. Consequently, layout of the assist gate decoder 40 or the block decoder 50 becomes easy.

Incidentally, the positional relationship between the assist gate decoder 40 and the block decoder 50 may be reversed.

In the semiconductor integrated circuit device shown in FIG. 62, one each of the block decoder 50 and the assist gate decoder 40 is disposed on each side of the memory cell array 80. The rest of the construction is the same as those of the semiconductor integrated circuit device shown in FIG. 60.

In this semiconductor integrated circuit device, the assist gate decoder 40 and the block decoder 50 are disposed on both sides of the memory cell array 80. Therefore, the wiring length of the output signals (ST00 to ST 11, B0P, B1P, B0N, B1N) of the block decoder 50 and the output signals (AG00 to AG11) of the assist gate decoder 40 becomes a half and the load can be reduced. Therefore, the operation speed of the semiconductor integrated circuit device can be improved.

[Embodiment 10]

Figure 63:
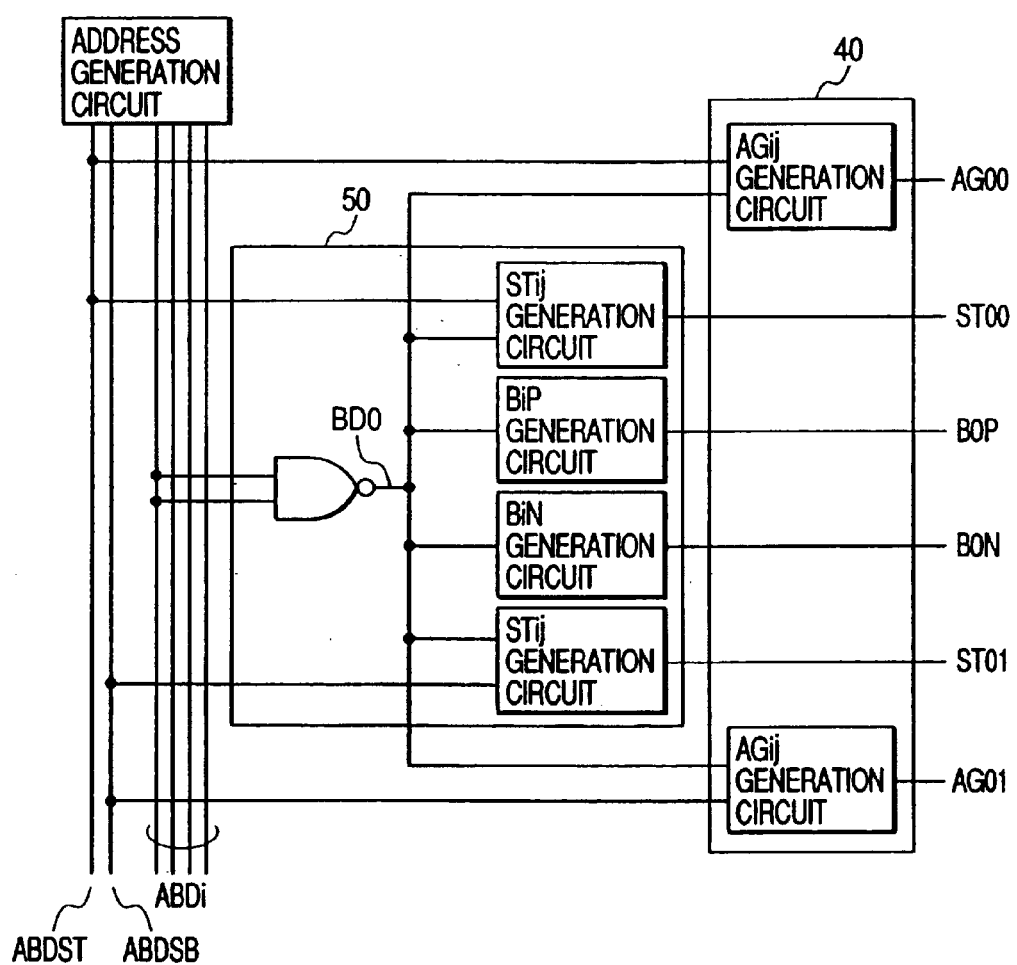
FIG. 63 is a circuit diagram showing a semiconductor integrated circuit device according to Embodiment 10 and is a block circuit diagram showing a selection system of an assist gate and a block that can be applied to the semiconductor integrated circuit device explained in Embodiment 9.
Figure 64:
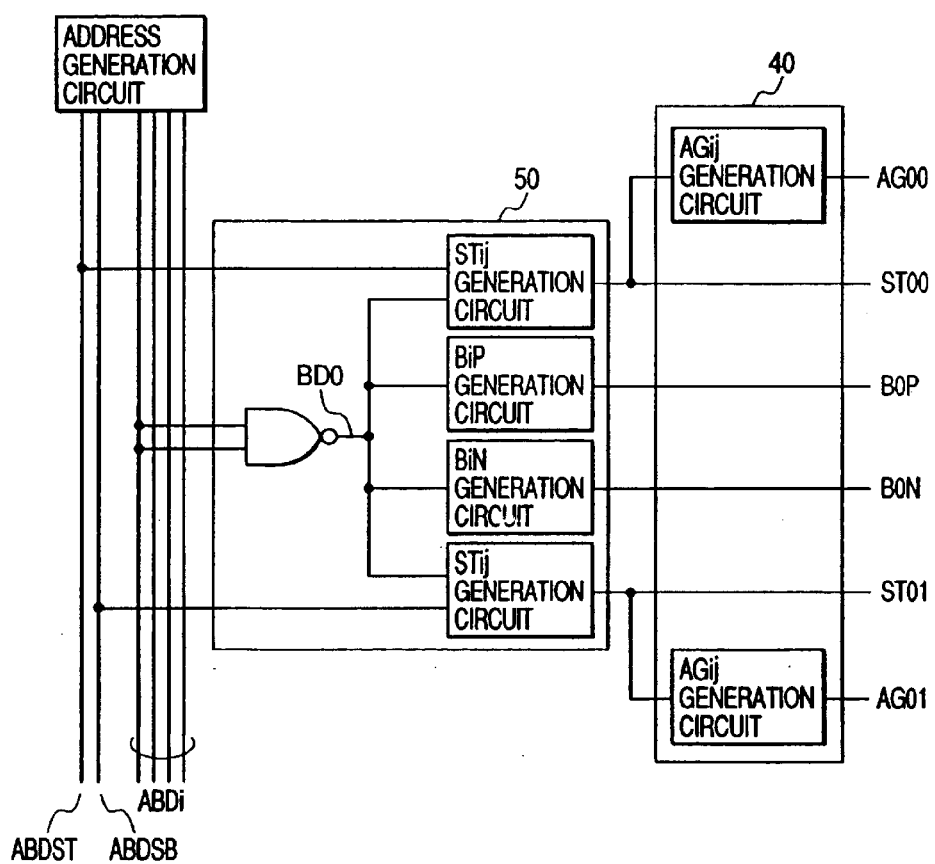
FIG. 64 is a circuit diagram showing another example of the semiconductor integrated circuit device of Embodiment 10 and is a block circuit diagram showing an assist gate and a block that can be applied to the semiconductor integrated circuit device explained in Embodiment 9.
Figure 65:
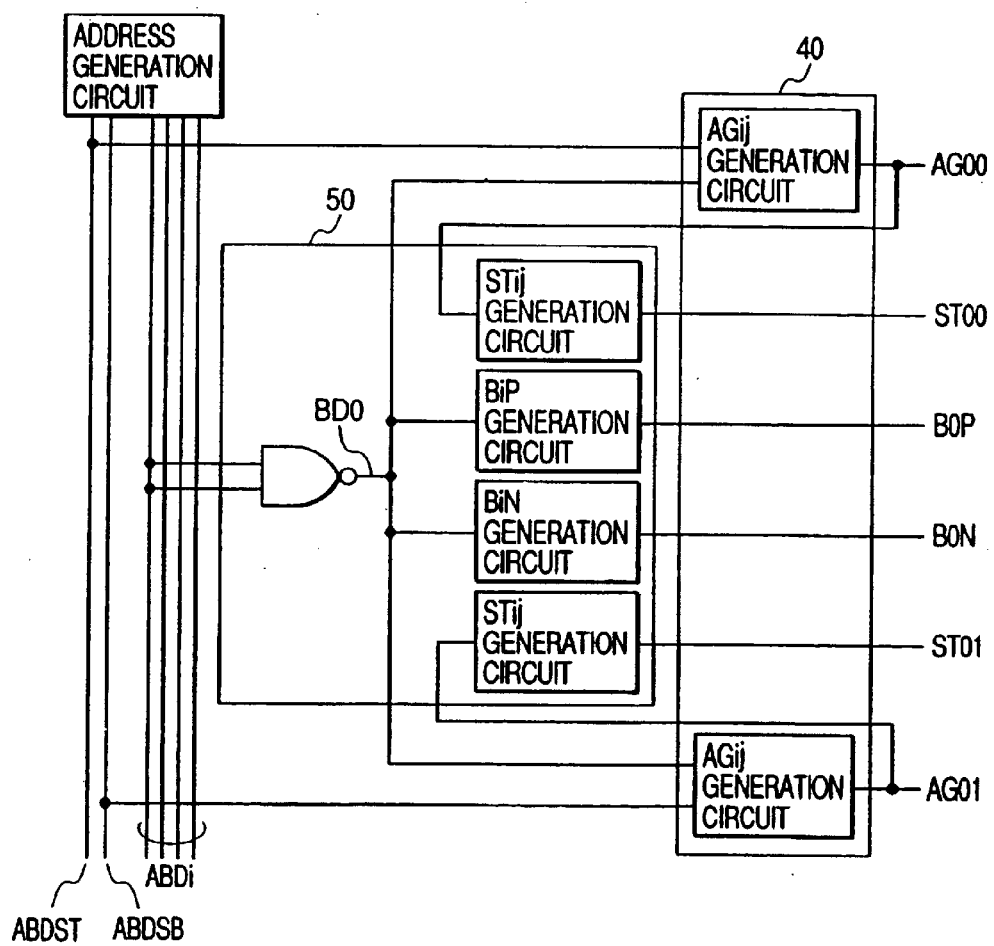
FIG. 65 is a circuit diagram showing still another example of the semiconductor integrated circuit device of Embodiment 10 and is a block circuit diagram showing a selection system of an assist gate and a block that can be applied to the semiconductor integrated circuit device explained in Embodiment 9.

FIGS. 63 to 65 are block circuit diagrams showing the selection system of the assist gate and the block that can be applied to the semiconductor integrated circuit device explained in Embodiment 9. These drawings illustrate three systems, by way of example. Incidentally, FIGS. 63 to 65 shows the signals of one block for ease of explanation.

First, the selection system shown in FIG. 63 will be explained. The assist gate signals (AG00, AG01) are generated by converting the voltages of the signal BD0 selected for the block and the signal selected by the signal ABDST/ABDSB for further halving the block, by the AGij generation circuit. Since two assist gate signals exist inside one block, the programming or reading operation of all the memory cells on one word line can be completed by the operations made twice.

In other words, the block select signal BD0 generated inside the block decoder 50 is used for the input signal of the assist gate decoder 40. The assist gate signals AG00 and AG01 are generated by converting the voltages of the signal BD0 selected for the block by ABDi and the signal selected by the signal ABDST/ABDSB for further halving the block, by the Agij generation circuit.

Since the signal BD0 and the signal ABDST/ABDSB are the signals of the power source voltage Vcc system, such a system is effective when the voltages necessary for the assist gate signals AG00 and AG01 are approximate to the power source voltage Vcc. Since two assist gate signals (AG00 and AG01) exist inside one block, the programming or reading operation of all the memory cells existing on one word line can be completed by the operations made twice, that are minimum necessary for the virtual ground type memory cell array.

Next, the selection system shown in FIG. 64 will be explained. The assist gate signals (AG00 and AG01) are generated when the AGij generation circuit converts the voltages of the gate signals (ST00 and ST01) of the select transistors. Since the assist gate signals inside one block are two, the programming or reading operation of all the memory cells existing on one word line can be completed by the operations made twice.

In other words, the assist gate signals AG00 and AG01 are generated in the following way. The STij generation circuit converts the voltages of the signal BD0 selected for the block by ABDi and the signal selected by the signal ABDST/ABDSB for further halving the block to generate the signals ST00 and ST01 (gate signals of the select transistor). The AGij generation circuit further converts the voltages of these signals ST00 and ST01 to obtain the assist gate signals AG00 and AG01.

In such a system, the reference voltages for generating the assist gate signals AG00 and AG01 are the gate signals ST00 and ST01 of the select transistors. Therefore, this system is effective when the voltages necessary for the assist gate signals AG00 and AG01 are approximate to the gate signals ST00 and ST01 of the select transistors. Since two assist gate signals exist, the programming or reading operation of all the memory cells existing on one word line can be completed by conducting the operation twice that is minimum necessary in the virtual ground type memory cell array.

Next, the selection system shown in FIG. 65 will be explained. The gate signals (ST00 and ST01) of the select transistors are generated when the STij generation circuit converts the voltages of the assist gate signals (AG00 and AG01). Since two assist gate signals exist inside one block, the programming or reading operation of all the memory cells existing on one word line can be completed by the operations made twice.

The gate signals ST00 and ST01 of the select transistors are generated in the following way contrary to the case shown in FIG. 64. The AGij generation circuit converts the voltages of the signals selected for the block by ABDi and the signal selected by the signal ABDST/ABDSB for further halving the block to generate AG00 and AG01 (assist gate signals), and the STij generation circuit converts further the voltages of these assist gate signals.

In such a case, the reference voltages for generating the gate signals ST00 and ST01 of the select transistors are the assist gate signals AG00 and AG01. Therefore, this system is effective when the voltages necessary for the gate signals ST00 and ST01 of the select transistors are approximate to the assist gate signals AG00 and AG01. Since two assist gate signals exist, the programming or reading operation of all the memory cells existing on one word line can be completed by the operations made twice that is minimum necessary for the virtual ground type memory cell array.

Incidentally, the three selection systems explained in this embodiment can be applied arbitrarily to Embodiment 9.

[Embodiment 11]

Figure 66:
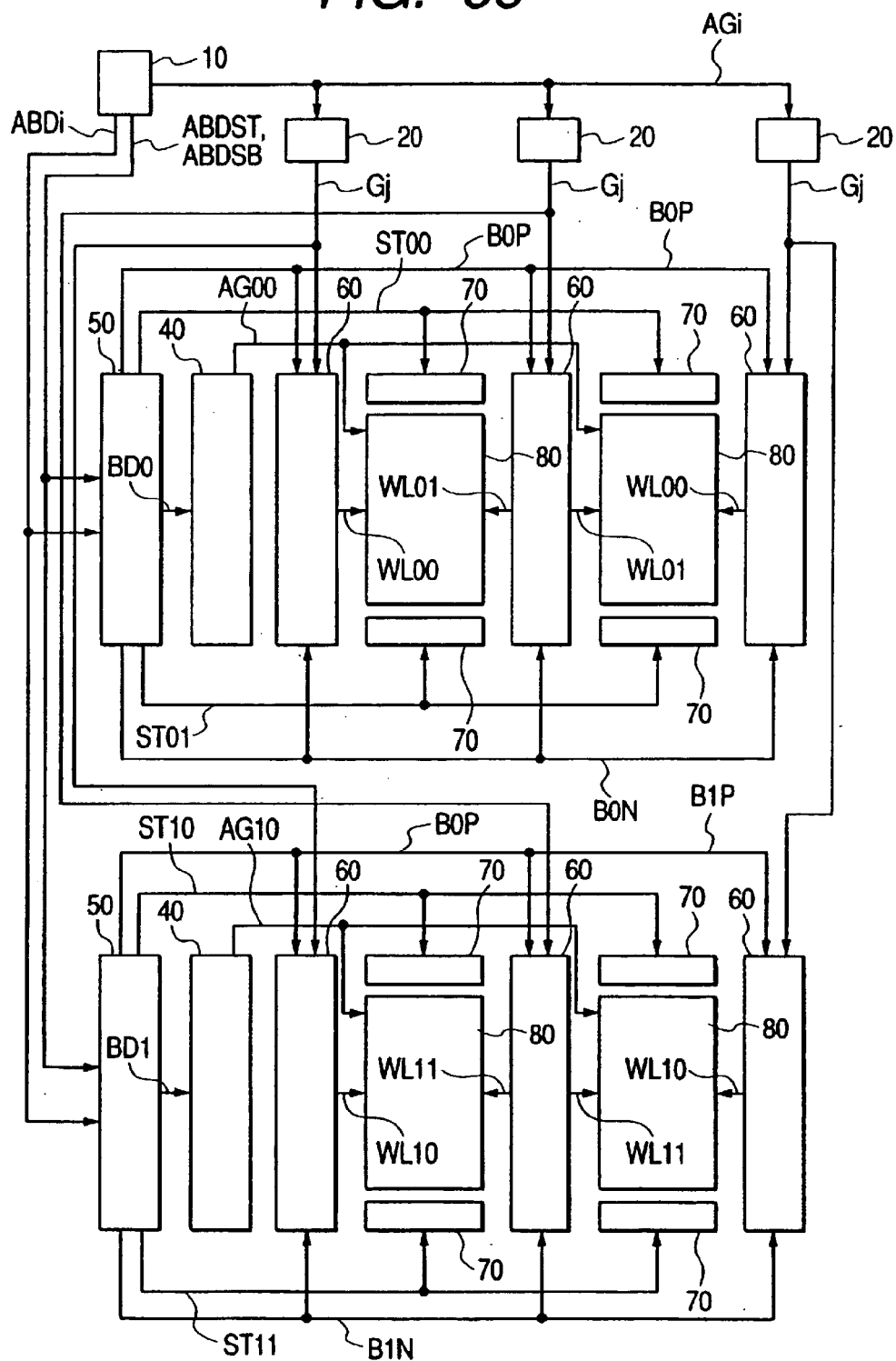
FIG. 66 is a circuit diagram showing a semiconductor integrated circuit device according to Embodiment 11 of the present invention.

FIG. 66 is a circuit diagram showing the semiconductor integrated circuit device according to Embodiment 11 of the present invention. This embodiment explains another example of the decoder arrangement. Incidentally, the memory cell array 80, the assist gate decoder 40, the block decoder 50, the sub-decoder 60, the gate decoder 20, the select transistor 70 and the sense circuit 30 are the same as those of Embodiments 7 and 8, and their explanation will be omitted.

One each of the block decoder 50 and the assist gate decoder 40 is disposed on one of the sides of the memory cell array 80. Since one assist gate signal exists inside one block, the assist gate is used as only the erase gate.

FIG. 66 shows only two blocks for ease of explanation. The memory cell array 80 inside one block is divided into two blocks, and the sub-decoders 60 are disposed in such a manner as to interpose the memory cell array 80 between them. Incidentally, the number of division of the memory cell array 80 need not be limited to two.

The sub-decoders 60 are disposed on both sides of the memory cell array 80. The assist gate decoder 40, the block decoder 50 and the sub-decoder 60 are disposed in the extending direction of the word lines.

The number of the assist gate signal inside one block is one, that is, AG00 or AG01. Therefore, the assist gate is used only as the erase gate.

The number of the gate signals of the select transistors inside one block is two, that is, ST00 and ST01 or ST10 and ST11, and they are the output signals of the block decoder 50.

The PMOS power source signal B0P or B1P of the sub-decoder 60 and the NOMS power source signal B0N or B1N generate the address selection signal ABDi for selecting the blocks as the input signals.

The gate signals ST00 and ST01 or ST10 and ST11 of the select transistors generate the address selection signal ABDi for selecting the blocks and the address selection signal ABDST or ABDSB for further halving the block as the input signals.

The assist gate signal AG00 or AG10 generates the block selection signal BD0 or BD1 as the input signal.

The block selection signal BD0 or BD1 generated inside the block decoder 50 is used as the input signal of the assist gate decoder 40, and the assist gate decoder 40 is disposed adjacent to the block decoder 50.

The assist gate decoder 40 and the block decoder 50 are disposed on one of the right and left sides (on the left side in FIG. 66) of the memory cell array 80. However, the positional relationship between the assist gate decoder 40 and the block decoder 50 may be reversed.

Since various variations are available for the selection method of the assist gate decoder 40 and the block decoder 50 as will be described later, however, the flow of each signal needs not be limited to the flow in this embodiment.

This decoder arrangement provides the following effects.

The memory cell array 80 inside one block is halved and the sub-decoders 60 are so disposed as to interpose the memory cell array 80. Since the word line can be shortened and the load can be reduced, the operation speed of the semiconductor integrated circuit device can be improved.

Since the sub-decoders 60 are disposed on both sides of the memory cell array 80, the word lines inside the memory cell array 80 to be connected to the sub-decoders 80 may be assorted to the right and left, and every other word line may be taken out. Therefore, the layout design of the junction portions between the word lines and the sub-decoders 60 becomes easy (or pitch relaxation of the word lines can be achieved).

Since the sub-decoders 60 are disposed on both sides of the memory cell array 80, the sub-decoder elements can be disposed in the region corresponding to two word lines, and the layout design of the sub-decoders 60 becomes easy.

Since only one each of the assist gate decoder 40 and the block decoder 50 is disposed for one block, the area of the decoder can be limited to the minimum area.

Since the assist gate decoder 40 and the block decoder 50 are disposed adjacent to each other, the output signals BD0 and BD1 of the block decoder 50 as the input of the assist gate decoder 40 need not be extended far.

Besides the arrangement of the decoder described above, the decoder arrangement shown in FIGS. 67 and 68 may be used, too.

Figure 67:
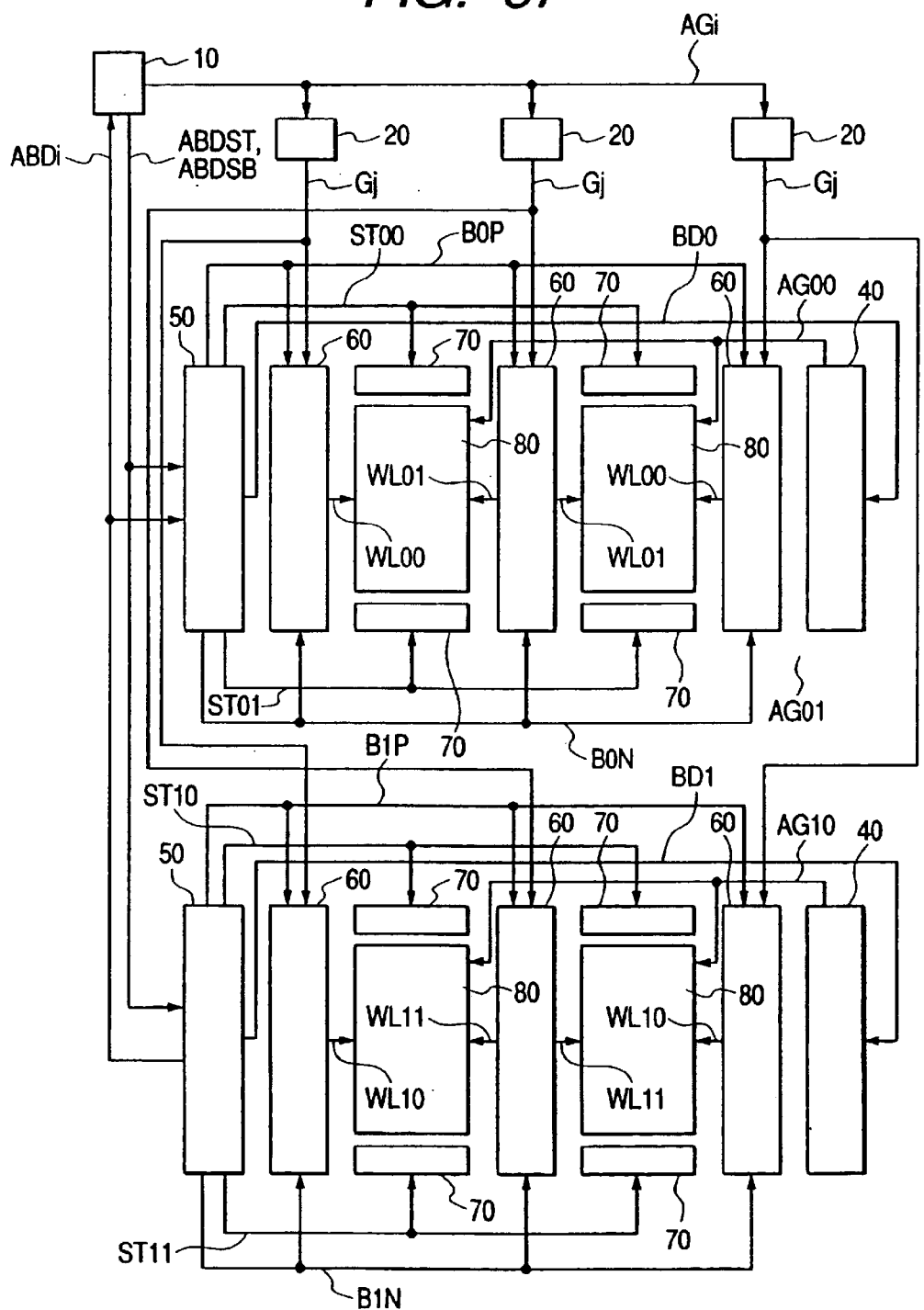
FIG. 67 is a circuit diagram showing another example of the semiconductor integrated circuit device of Embodiment 11.

In the semiconductor integrated circuit device shown in FIG. 67, one block decoder 50 and one assist gate decoder 40 are so disposed on mutually opposite sides as to interpose the memory cell array 80 between them. The rest of the construction is the same as that of the semiconductor integrated circuit device shown in FIG. 66.

This semiconductor integrated circuit device provides the following effect in addition to the effects described above. The output signals (AG00 to AG11) of the assist gate decoder 40 need be connected to the memory cell array 80 and the output signals (ST00 to ST11) of the block decoder, to the select transistor. Since the assist gate decoder 40 and the block decoder 50 are disposed on the mutually opposite sides while interposing the memory cell array 80 between them, however, it is not necessary to wire the output signals (ST00 to ST11) of the block decoder 50 onto the assist gate decoder 40 and the output signals (AG00 to AG11) of the assist gate decoder 40, onto the block decoder 50. Therefore, layout of the assist gate decoder 40 or the block decoder 50 becomes easy.

Incidentally, the positional relationship between the assist gate decoder 40 and the block decoder 50 may be reversed.

Figure 68:
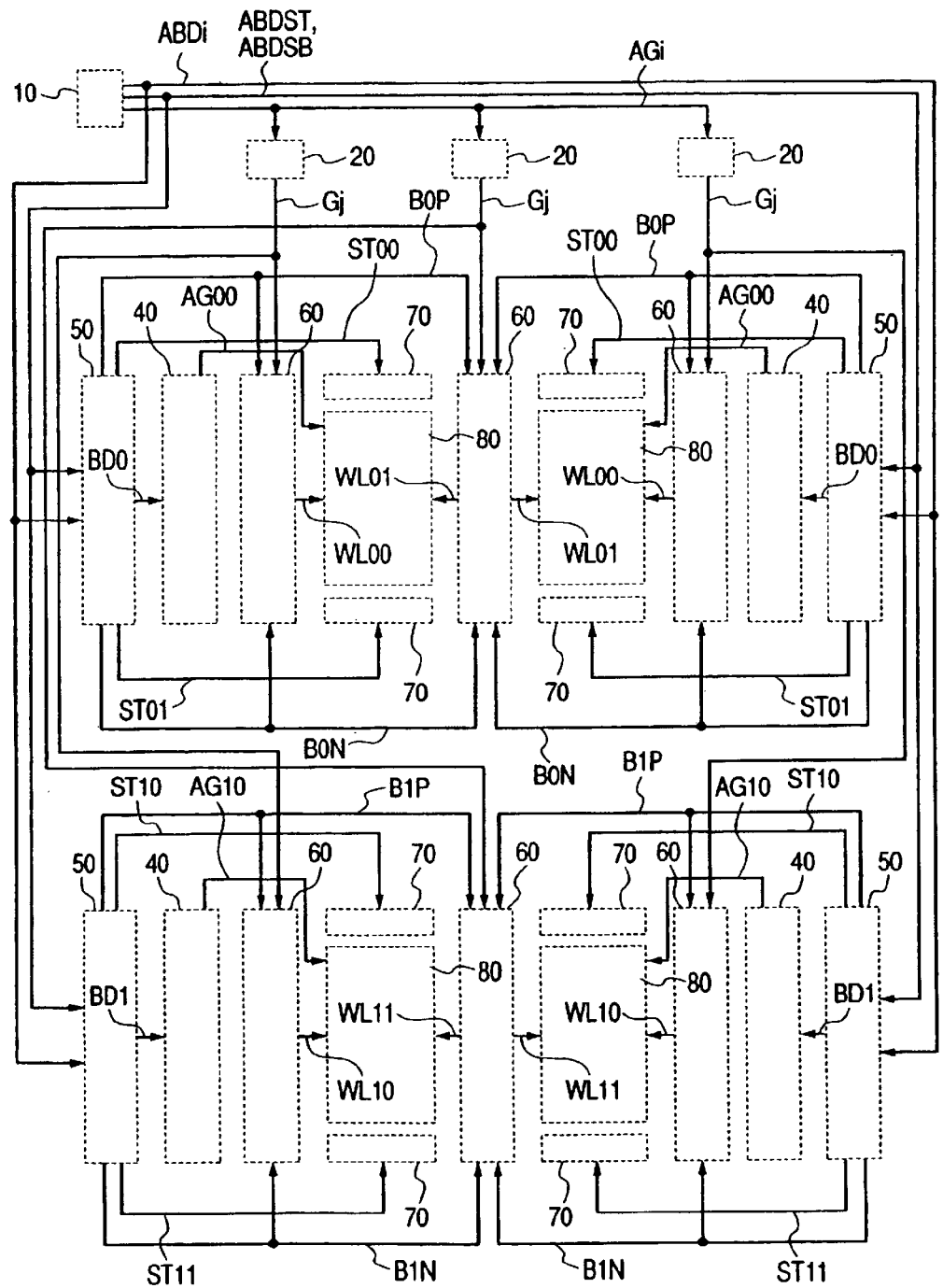
FIG. 68 is a circuit diagram showing still another example of the semiconductor integrated circuit device of Embodiment 11.

In the semiconductor device shown in FIG. 68, one each of the block decoder 50 and the assist gate decoder 40 is disposed on each side of the memory cell array 80. The rest of the construction is the same as that of the semiconductor integrated circuit device shown in FIG. 66.

Besides the effects described above, this semiconductor integrated circuit device provides the following effects. Since the assist gate decoder 40 and the block decoder 50 are disposed on each side of the memory cell array 80, the wiring length of the output signals (ST00 to ST11, B0P, B1P, B0N, B1N) of the block decoder 50 and the output signals (AG00 to AG11) of the assist gate decoder 40 becomes a half and the load is reduced. Therefore, the operation speed of the semiconductor integrated circuit device can be improved.

[Embodiment 12]

Figure 69:
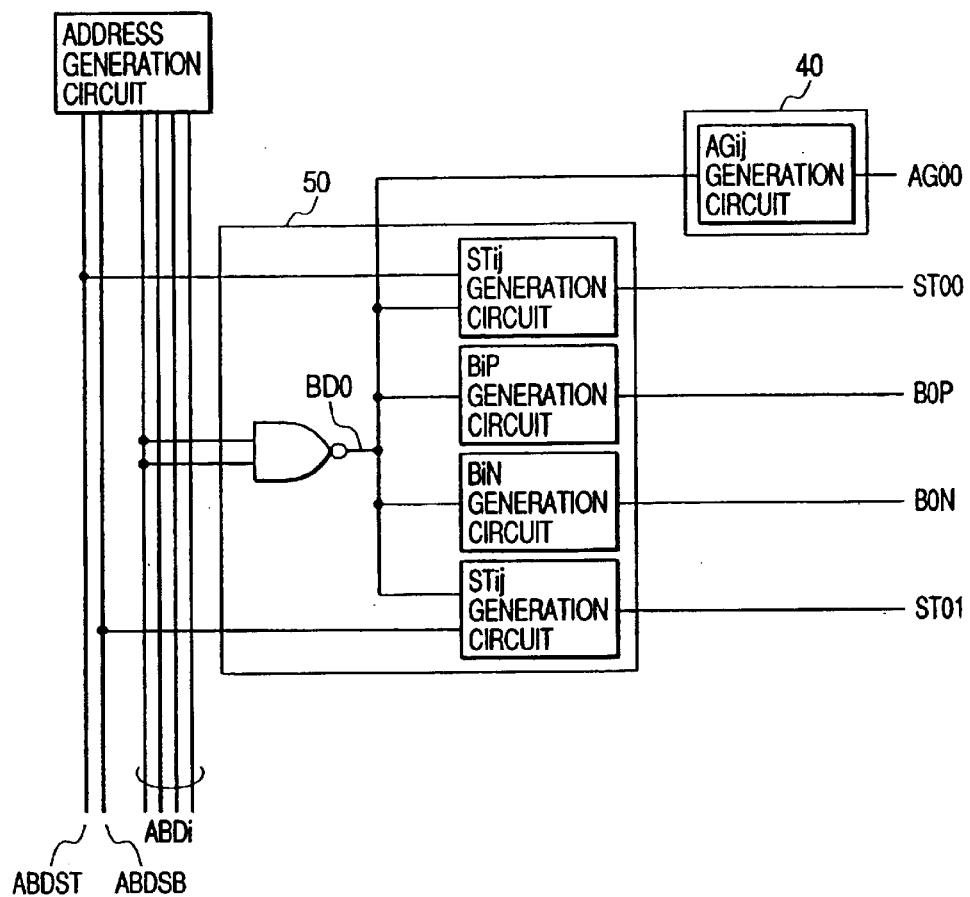
FIG. 69 is a circuit diagram showing the semiconductor integrated circuit device according to Embodiment 12 and is a block circuit diagram showing a selection system of an assist gate and a block that can be applied to the semiconductor integrated circuit explained in Embodiment 11.
Figure 70:
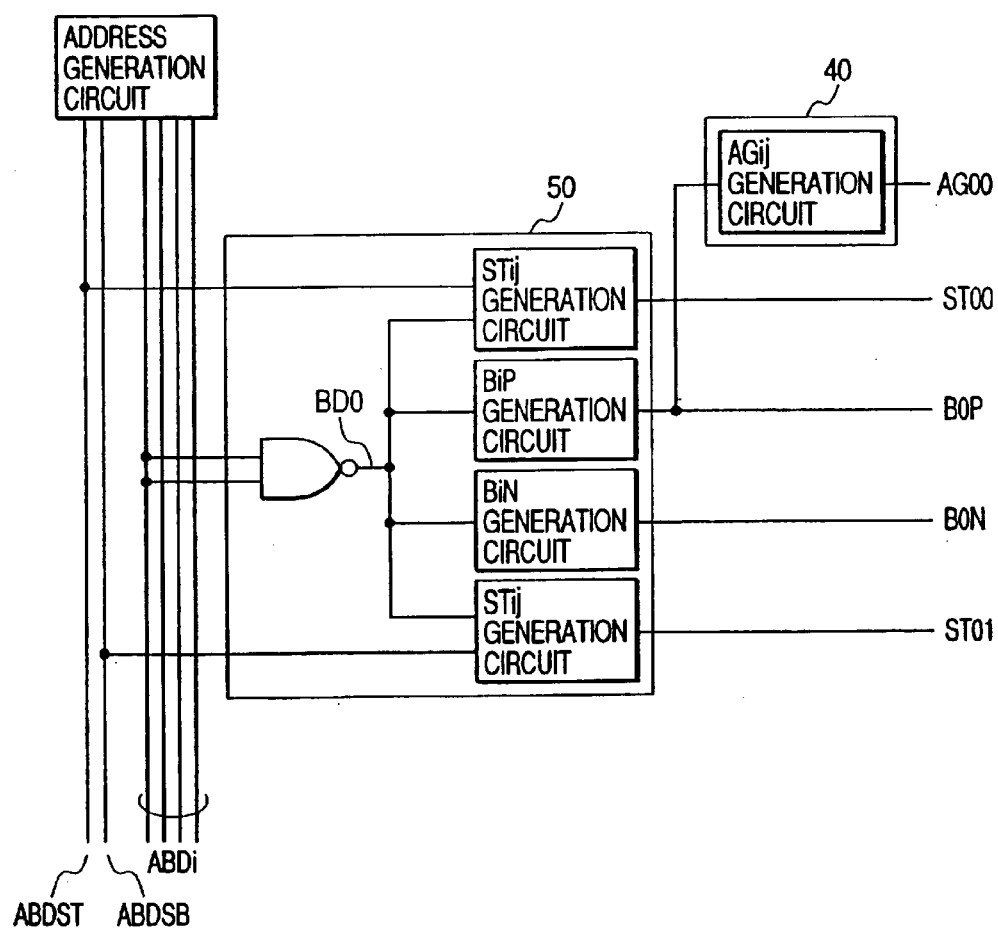
FIG. 70 is a circuit diagram showing another example of the semiconductor integrated circuit device of Embodiment 12 and is a block circuit diagram showing a selection system of an assist gate and a block that can be applied to the semiconductor integrated circuit device explained in Embodiment 11.

FIGS. 69 and 70 are block circuit diagrams showing the selection systems of the assist gate and the block that can be applied to the semiconductor integrated circuit device explained in Embodiment 11. Two systems can be illustrated as shown in FIGS. 69 and 70. Incidentally, FIGS. 69 and 70 show the signals of one block for ease of explanation.

First, the selection system shown in FIG. 69 will be explained. The AGji circuit converts the voltage of the signal BD0 for block selection and generates the assist gate signal (AG00). Since the assist gate signal inside one block is one, the assist gate is used only as the erase gate. In other words, the block selection signal BD0 generated inside the block decoder 50 is used for the input signal of the assist gate decoder 40. The AGij generation circuit converts the voltage of the signal BD0 for block selection by ABDi and generates the assist gate signal AG00.

Since the signal BD0 is the signal of the power source voltage Vcc system, this selection system of this embodiment is effective when the voltage necessary for the assist gate signal AG00 is approximate to the power source voltage Vcc.

Next, the selection system shown in FIG. 70 will be explained. The AGij generation circuit converts the voltage of the PMOS power source signal of the sub-decoder 60 and generates the assist gate signal. Since the assist gate signal inside one block is one, the assist gate is used only as the erase gate. In other words, the assist gate signal AG00 is generated in the following way. The BiP generation circuit converts the voltage of the signal, that is selected by the signal BD0 selected for block selection by ABDj, and generates B0P (the PMOS power source signal of the sub-decoder 60). The AGij generation circuit further converts the voltage of this B0P signal.

In this selection system, the voltage as the reference for generating the assist gate signal AG00 is the PMOS power source signal B0P. Therefore, this selection system is effective when the voltage necessary for the assist gate signal AG00 is approximate to the PMOS power source signal B0P of the sub-decoder 60.

Although the invention completed by the present inventor has thus been described concretely with some preferred embodiments thereof, the invention is not of course limited thereto, but can be changed or modified in various ways without departing from the scope thereof.

For example, Embodiments 1 to 6 use the laminate film comprising the polysilicon film, the tungsten nitride film and the tungsten film as the material of the word line WL. However, other barrier metal films such as a film of a transition metal element itself, e.g. tungsten, titanium or tantalum, films of their nitrides or silicides, films of aluminum nitrides, cobalt silicide and molybdenum silicides, or alloy films of tungsten and the like, in place of the tungsten nitride film. Similar effects can be obtained also when the film is a laminate film of a polysilicon film and a metal silicide film or a so-called "polycide film".

Embodiments 1 to 6 use the laminate film of the polysilicon film, the tungsten nitride film and the tungsten film as the material of the word line WL. However, similar effects can be obtained when the laminate film of a polysilicon film and a metal silicide. A typical example of the metal silicides is a tungsten silicide film.

Embodiments 1 to 6 use the N-doped silicon oxide film as the insulator film for isolating the floating gate from the third gate. When the semiconductor integrated circuit device of the present invention is applied to a product having a small number of times of programming/erasing, however, the embodiments can use the silicon oxide film that is formed by thermal oxidation or CVD according to the prior art.

Embodiments 1 to 5 use also the N-doped silicon oxide film for the insulator film for isolating the floating gate from the control gate, but a laminate film of a silicon oxide film/silicon nitride film/silicon oxide film, or a so-called "ONO film", that has gained a wide application in the past, may be used when the internal operating voltage at the time of programming/erasing or the programming/erasing speed is not much important.

Embodiments 1 to 6 are explained about the n-channel type memory cell in which the n type diffusion layer is formed in the p type well, by way of example. However, similar effects can be also obtained in the p-channel type memory cell in which the well is of the n type and the diffusion layer is of the p type. In this case, the voltages of the control gate, the third gate and the drain in Embodiments 1, 2 and 3 are relatively negative values with respect to the well voltage at the time of programming. In Embodiments 1, 5 and 6, the voltages of the control gate and the drain become the relatively negative voltages with respect to the well voltage at the time of programming. In these cases, the hot electrons generate electron injection.

In Embodiments 1, 5 and 6, the control gate voltage can take a relatively positive voltage and the drain voltage can take a relatively negative value, with respect to the well voltage, at the time of programming when the memory cells are of the p-channel type. In this case, the electrons are injected by the inter-band tunneling phenomenon.

In all of the foregoing embodiments, the electrons injected into the floating gate must have at least two kinds of status during programming. However, these embodiments may be applied to so-called "multilevel storage" that forms the levels of at least four kinds of status and stores at least two bits in one memory cell. Conventional multilevel storage involves the problem that the voltage difference between the lowest threshold value and the highest threshold value becomes greater than two-level storage even when the quantity of the electrons injected into the floating gate is controlled highly accurately and the threshold value distribution of each level is compressed. In consequence, the programming/erasing speed becomes low or the programming voltage becomes high in Fowler-Nordheim type programming/erasing. The present invention can lower both programming and erasing voltage below 13.5 V, or in other words, can improve the programming/erasing speed. Therefore, the present invention is extremely effective for multilevel storage.

When programming is made, Embodiments 2 and 4 apply the positive voltage, relative to the control gate voltage, to the third gate to generate the electron ejection from the floating gate to the third gate, and Embodiment 3 applies the negative voltage to the well of the first conductivity type with the voltage of the third gate being kept at 0 V to generate the electron ejection from the floating gate to the well. However, the electron ejection may be generated from the floating gate to the source/drain while overlap between the source or drain diffusion layer with the floating gate is secured relatively greatly.

The present invention is applied to not only the semiconductor integrated circuit device having only the so-called "flash memory" but also a one-chip microcomputer (semiconductor device) equipped with the memory cell array portion 80 having non-volatile semiconductor memory devices (flash memories).

The effects obtained by the typical invention among the inventions disclosed in this application are briefly as follows.

The present invention can reduce the memory cell area of the semiconductor integrated circuit device.

The present invention can improve the operation speed of the semiconductor integrated circuit device.

The present invention can decrease the defect density of the insulator film for isolating the gates inside the memory cell of the semiconductor integrated circuit device, and can improve the yield of the semiconductor integrated circuit device.

The present invention can lower the internal operating voltage of the semiconductor integrated circuit device.

What is claimed is:

1. A semiconductor integrated circuit device including a well of a first conductivity type formed on a main surface of a semiconductor substrate, a semiconductor region of a second conductivity type formed inside said well, a first gate formed over said semiconductor substrate through a first insulator film, a second gate formed over said first gate over a second insulator film and a third gate formed and isolated from said first gate through a third insulator film, wherein:

an upper surface of said third gate exists at a position lower than the upper surface of said first gate.

2. A semiconductor integrated circuit device according to claim 1, which has any of the following constructions:

a first construction wherein said first gate is a floating gate, said second gate is a control gate and said third gate is an erase gate;

a second construction wherein said first gate is a floating gate, said second gate is a control gate and said third gate is a gate for controlling a split channel; and a third construction wherein said first gate is a floating gate, said second gate is a control gate and said third gate is a gate having the functions of both erase gate and gate for controlling a split channel.

3. A semiconductor integrated circuit device according to claim 2, wherein a part of said third gate exists over said semiconductor region of the second conductivity type.

4. A semiconductor integrated circuit device according to claim 1, wherein said first gate is a floating gate, said second gate is a control gate and said third gate is an erase gate; and an entire surface of said third gate exists over said semiconductor region of the second conductivity type.

5. A semiconductor integrated circuit device according to claim 1, wherein said third insulator film is a silicon oxide film doped with nitrogen.

6. A semiconductor integrated circuit device including a well of a first conductivity type formed on a main surface of a semiconductor substrate, a semiconductor region of a second conductivity type formed inside said well, a first gate formed over said semiconductor substrate through a first insulator film, a second gate formed over said first gate through a second insulator film and a third gate formed and isolated from said first gate through a third insulator film, wherein;

said third gate has functions of both erase gate and gate for controlling a split channel.

7. A semiconductor integrated circuit device according to claim 6, wherein said third insulator film is a silicon oxide film doped with nitrogen.

8. A semiconductor integrated circuit device including a well of a first conductivity type formed on a main surface of a semiconductor substrate, a semiconductor region of a second conductivity type formed inside said well, a first gate formed over said semiconductor substrate through a first insulator film, a second gate formed over said first gate through a second insulator film and a third gate formed and isolated from said first gate through a third insulator film, wherein:

a film thickness of said first insulator film is greater than that of said second or third insulator film.

9. A semiconductor integrated circuit device including a well of a first conductivity type formed on a main surface of a semiconductor substrate, a semiconductor region of a second conductivity type formed inside said well, a first gate formed over said semiconductor substrate through a first insulator film, a second gate formed over said first gate through a second insulator film and third gate formed and isolated from said first gate through a third insulator film, wherein:

said second gate comprises a stacked film of a polysilicon film and a metal silicide film, and said third gate exists as it is buried into a space between said first gates.

10. A semiconductor integrated circuit device according to claim 9, wherein said metal silicide film is a tungsten film.

11. A semiconductor integrated circuit device according to claim 9, which has any of the following constructions:

a first construction wherein the space between said first gates is defined by end faces of said first gates parallel to the extending direction of said second gate among the end faces of said first gates; and a second construction wherein the space between said first gates is defined by end faces of said first gates vertical to the extending direction of said second gate among the end faces of said first gates.

12. A semiconductor integrated circuit device including a well of a first conductivity type formed on a main surface of a semiconductor substrate, a semiconductor region of a second conductivity type formed inside said well, a first gate formed over said semiconductor substrate through a first insulator film, a second gate formed over said first gate through a second insulator film and a third gate formed and isolated from said first gate through a third insulator film, wherein:

said second gate comprises a stacked film containing a metal film.

13. A semiconductor integrated circuit device according to claim 12, wherein said second gate comprises:

a stacked film of a polysilicon film, a barrier metal film and a metal film.

14. A semiconductor integrated circuit device according to claim 12, wherein said third gate exists as it is buried into the space between said first gates.

15. A semiconductor integrated circuit device according to claim 12; which as any of the following constructions:

a first construction wherein the space between said first gates is defined by end faces of said first gates parallel to the extending direction of said second gates among the end faces of said first gates; and a second construction wherein the space between said first gates is defined by end faces of said first gates vertical to the extending direction of said second gates among the end faces of said first gates.

16. A semiconductor integrated circuit device according to claim 13 wherein said barrier metal film belongs to a group of a tungsten film, a titanium film, a tantalum film, a metal film made of a transition metal itself or its nitride film or its silicide film, an aluminum nitride film, a cobalt silicide film, a molybdenum silicide film, a titanium tungsten film or their alloy films.

17. A semiconductor integrated circuit device according to claim 14, which has any of the following constructions:

a first construction wherein the space between said first gates is defined by end faces of said first gates parallel to the extending direction of said second gates among the end faces of said first gates; and a second construction wherein the space between said first gates is defined by end faces of said first gates vertical to the extending direction of said second gates among the end faces of said first gates.

18. A semiconductor integrated circuit device including a well of a first conductivity type formed in a semiconductor substrate, a semiconductor region of a second conductivity type formed inside said well, local source lines and local data lines formed by connecting said semiconductor region, select transistors for selecting said local source line and said local data lines, a first gate formed over said semiconductor integrated substrate through a first insulator film, a second gate formed and isolated from said first gate through a second insulator film, word lines formed by connecting said second gates, and a third gate formed and isolated from said first gate through a third insulator film and having different functions from said first and second gates and, wherein:

a bundling portion of said third gates exists between said word line existing at the nearest position to said select transistor inside a memory cell block comprising said select transistors and the gate of said select transistor.

19. A semiconductor integrated circuit device according to claim 18, wherein a dummy gate exists between said bundling portion of said third gates and said word line existing at the nearest position to said select transistor inside said memory cell block.

20. A semiconductor integrated circuit device according to claim 9, which has any of the following constructions:

a first construction wherein all of said third gates existing inside said memory cell are bundled at either one, or both of the ends of said memory cell block end; and a second construction wherein every other of said third gates existing inside said memory cell block are bundled at the memory cell block end.

21. A semiconductor integrated circuit device according to claim 18, wherein all of said third gates existing insida said memory cell block are bundled at either one, or both, of the ends of said memory cell block, and wherein the selection signal of said third gate is generated from a selection signal of said memory cell block.

22. A semiconductor integrated circuit device according to claim 18, wherein all of said third gates existing inside said memory cell block are bundled at either one, or both, of the ends of said memory cell block, said integrated circuit device having any of the following construction:

a first construction wherein the selection signal of said third gate is generated from a selection signal of said memory cell block and a signal for further halving said memory cell block; and a second construction wherein the selection signal of said third gate is generated from a gate selection signal of said select transistor.

23. A semiconductor integrated circuit device according to claim 19, which has any of the following constructions:

a first construction wherein contact holes are disposed at said bundling portion of said third gates; and a second construction wherein said third gate and said dummy gate are connected through a contact hole and a metal wire.

24. A semiconductor integrated circuit device according to claim 20, wherein:

said third gate is formed as it is buried into the space between said first gates extending in a direction vertical to said word line; and a decoder for driving said third gate is disposed in an extending direction of said word line.

25. A semiconductor integrated circuit device according to claim 24, which has any of the following constructions:

a first construction wherein said decoder for driving said third gate is disposed at on of the ends of said memory cell array;

a second construction wherein said decoder for driving said third gate is disposed adjacent to a block decoder for selecting said memory cell block; and a third construction wherein said decoders for driving said third gate are so disposed on both sides of said memory cell arrays as to interpose said memory cell array between them, adjacent to said block decoder for selecting said memory cell block.

* * * * *